(12) United States Patent
Mendenhall et al.

(10) Patent No.: US 7,625,216 B2
(45) Date of Patent: Dec. 1, 2009

(54) ELECTRICAL CONNECTOR

(75) Inventors: David W. Mendenhall, Naperville, IL (US); Hecham K. Elkhatib, Aurora, IL (US); Richard Miklinski, Jr., Aurora, IL (US); Alan A. Raclawski, Schaumburg, IL (US)

(73) Assignee: Cinch Connectors, Inc., Lombard, IL (US)

( * ) Notice: Subject to any disclaimer, the term of this patent is extended or adjusted under 35 U.S.C. 154(b) by 73 days.

(21) Appl. No.: 11/518,040

(22) Filed: Sep. 8, 2006

(65) Prior Publication Data

US 2007/0066091 A1 Mar. 22, 2007

Related U.S. Application Data

(60) Continuation-in-part of application No. 11/029,231, filed on Jan. 4, 2005, now Pat. No. 7,261,567, which is a division of application No. 10/458,909, filed on Jun. 11, 2003, now Pat. No. 6,921,270, application No. 11/518,040, filed on Sep. 8, 2006, and a continuation-in-part of application No. 11/028,858, filed on Jan. 4, 2005, which is a division of application No. 10/458,909, filed on Jun. 11, 2003, now Pat. No. 6,921,270, application No. 11/518,040, filed on Sep. 8, 2006, and a continuation-in-part of application No. 11/028,842, filed on Jan. 4, 2005, now Pat. No. 7,263,770, which is a division of application No. 10/458,909, filed on Jun. 11, 2003, now Pat. No. 6,921,270.

(51) Int. Cl.
*H01R 12/00* (2006.01)
(52) U.S. Cl. .................................................. 439/66
(58) Field of Classification Search .................. 439/66, 439/70, 71
See application file for complete search history.

(56) References Cited

U.S. PATENT DOCUMENTS 3,643,135 A 2/1972 Devore et al.

(Continued)

FOREIGN PATENT DOCUMENTS

DE 4407548 A1 9/1994

(Continued)

OTHER PUBLICATIONS

Plated Through-Hole Contact by H. C Schick, IBM Technical Disclosure Bulletin, vol. 6, No. 10, Mar. 1964, pp. 5-6.

*Primary Examiner*—Jean F Duverne
(74) *Attorney, Agent, or Firm*—Leydig, Voit & Mayer, Ltd.

(57) ABSTRACT

Provided is an electrical connector having first and second surfaces and configured to establish electrical communication between two or more electrical devices. The electrical connector includes an insulative housing and a resilient, conductive contact retained in an aperture disposed from the first surface to the second surface. To contact the electrical devices, the contact includes a center portion from which extends two diverging, cantilevered spring arms that project beyond either surface of the electrical connector. To shorten the path that current must travel through the contact, one spring arm terminates in a bellows leg that extends proximate to the second spring arm. When placed between the electrical devices, the spring arms are deflected together causing the bellows leg to press against the second spring arm. For retaining the contact within the aperture, the contact also includes retention members extending from the center portion that engage the insulative housing.

40 Claims, 60 Drawing Sheets

U.S. PATENT DOCUMENTS

| | | | |
|---|---|---|---|
| 3,720,907 A | 3/1973 | Asick | |
| 3,873,173 A | 3/1975 | Anhalt | |
| 4,050,755 A | 9/1977 | Hasircoglu | |
| 4,052,118 A | 10/1977 | Scheingold et al. | |
| 4,371,228 A | 2/1983 | Chalmers | |
| 4,504,887 A | 3/1985 | Bakermans et al. | |
| 4,511,197 A | 4/1985 | Grabbe et al. | |
| 4,513,353 A | 4/1985 | Bakermans et al. | |
| RE32,370 E | 3/1987 | Bright et al. | |
| 4,647,124 A | 3/1987 | Kandybowski | |
| 4,684,184 A | 8/1987 | Grabbe et al. | |
| 4,906,194 A | 3/1990 | Grabbe | |
| 4,927,369 A | 5/1990 | Grabbe et al. | |
| 4,998,886 A | 3/1991 | Werner | |
| 5,092,783 A | 3/1992 | Suarez et al. | |
| 5,139,427 A | 8/1992 | Boyd et al. | |
| 5,152,694 A | 10/1992 | Bargain | |
| 5,181,852 A | 1/1993 | Dambach et al. | |
| 5,199,889 A | 4/1993 | McDevitt, Jr. | |
| 5,230,632 A | 7/1993 | Baumberger et al. | |
| 5,242,314 A | 9/1993 | Di Giulio et al. | |
| 5,308,252 A | 5/1994 | Mroczkowski et al. | |
| 5,324,205 A | 6/1994 | Ahmad et al. | |
| 5,342,205 A | 8/1994 | Hashiguchi | |
| 5,395,252 A | 3/1995 | White | |
| 5,437,556 A | 8/1995 | Bargain et al. | |
| 5,653,598 A | 8/1997 | Grabbe | |
| 5,653,600 A | 8/1997 | Ollivier | |
| 5,713,744 A | 2/1998 | Laub | |
| 5,820,389 A | 10/1998 | Hashiguchi | |
| 5,951,303 A | 9/1999 | Sudmöller | |
| 5,957,703 A | 9/1999 | Arai et al. | |
| 5,980,268 A | 11/1999 | Michenko et al. | |
| 5,980,323 A | 11/1999 | Bricaud et al. | |
| 5,984,693 A | 11/1999 | McHugh et al. | |
| 5,997,315 A | 12/1999 | Akama et al. | |
| 6,027,345 A | 2/2000 | McHugh et al. | |
| 6,062,871 A | 5/2000 | Arai et al. | |
| 6,068,514 A | 5/2000 | Zuin | |
| 6,077,089 A | 6/2000 | Bishop et al. | |
| 6,146,152 A | 11/2000 | McHugh et al. | |
| 6,176,707 B1 | 1/2001 | Neidich et al. | |
| 6,183,267 B1 | 2/2001 | Marcus et al. | |
| 6,186,797 B1 | 2/2001 | Wang et al. | |
| 6,217,342 B1 | 4/2001 | Neidich et al. | |
| 6,227,869 B1 | 5/2001 | Lin et al. | |
| 6,231,353 B1 | 5/2001 | Rathburn | |
| 6,257,899 B1 * | 7/2001 | Walkup | 439/66 |
| 6,273,731 B1 | 8/2001 | Bishop et al. | |
| 6,280,254 B1 | 8/2001 | Wu et al. | |
| 6,290,507 B1 | 9/2001 | Neidich et al. | |
| 6,293,805 B1 | 9/2001 | Wu | |
| 6,296,495 B1 | 10/2001 | Wang et al. | |
| 6,302,702 B1 | 10/2001 | Audet et al. | |
| 6,315,576 B1 | 11/2001 | Neidich | |
| 6,328,573 B1 | 12/2001 | Sakata et al. | |
| 6,345,987 B1 | 2/2002 | Mori et al. | |
| 6,358,063 B1 | 3/2002 | Neidich | |
| 6,568,955 B2 | 5/2003 | Hotea | |
| 6,821,163 B2 | 11/2004 | McHugh et al. | |
| 6,851,986 B2 | 2/2005 | Zhao | |
| 6,866,520 B2 | 3/2005 | Chiang | |
| 2004/0253844 A1 | 12/2004 | Mendenhall et al. | |
| 2005/0239303 A1 | 10/2005 | Lee et al. | |

FOREIGN PATENT DOCUMENTS

| | | |
|---|---|---|
| EP | 0 359 223 A1 | 9/1989 |
| EP | 0 914 028 A2 | 6/1999 |
| GB | 834139 | 5/1960 |
| WO | WO 02/15342 A2 | 2/2002 |
| WO | WO 03/049517 A1 | 6/2003 |

* cited by examiner

ELECTRICAL CONNECTOR

CROSS-REFERENCE TO RELATED APPLICATIONS

This patent application is a continuation-in-part of U.S. patent application Ser. No. 11/029,231, filed Jan. 4, 2005, published as U.S. Publication No. 2005/0118890, U.S. patent application Ser. No. 11/028,858, filed Jan. 4, 2005, published as U.S. Publication No. 2005/0118889, and U.S. patent application Ser. No. 11/028,842, filed Jan. 4, 2005, published as U.S. Publication No. 2005/0153604, which are divisionals of U.S. patent application Ser. No. 10/458,909, filed Jun. 11, 2003, issued as U.S. Pat. No. 6,921,270. U.S. patent application Ser. No. 11/028,855, filed Jan. 4, 2005, which issued as U.S. Pat. No. 7,094,066, is another divisional of U.S. Pat. No. 6,921,270. These applications are incorporated herein in their entirety.

FIELD OF THE INVENTION

The present invention relates generally to electrical coupling and, more particularly to electrical connectors having conductive contacts. The invention has particular utility in the field of electrically interconnecting circuit-carrying elements.

BACKGROUND OF THE INVENTION

Numerous styles of electrical connectors are commonly used to electrically couple two or more circuit-carrying elements. For example, electrical connectors are often used to provide a conductive path between contact pads on an integrated circuit package and conductive traces on a substrate, such as a printed circuit board. A typical connector used for this situation and similar situations includes a low profile, insulative housing that retains a plurality of conductive contacts and can be placed between the integrated circuit package and the substrate. The contacts protrude beyond respective surfaces of the housing to simultaneously touch the contact pads and conductive traces when the integrated circuit package and substrate are pressed together.

Preferably, the contacts have a resilient quality and can thereby deform between and urge back against the pads and traces. As a related issue, the contacts should provide a substantial range of deflection to be compatible with various styles of housings, pads, and traces. It is also preferable that the conductive path which the electric current must travel across the housing be as direct and short as possible. Furthermore, the contact should be shaped and retained in the housing in a manner that optimizes electrical contact between the contact and the pad and conductive trace. Thus, there is a need for an improved electrical contact that provides the desired resiliency, range, shortened electrical path, and optimized contact.

SUMMARY OF THE PRESENT INVENTION

The present invention provides a resilient contact that can be retained in an aperture disposed through an insulative housing to form an assembled electrical connector. The contact has a center portion from which two cantilevered spring arms extend in a diverging manner. The ends of each spring arm define a land surface that protrudes beyond the surfaces of the housing to contact a contact pad or conductive trace. To shorten the electrical path through the contact, there is extending from the end of one spring arm in a direction towards the second spring arm an elongated bellows leg. The portion of the bellows leg in proximity to the second spring arm defines a first contact surface that opposes a similar second contact surface defined as part of the second spring arm.

When the contact pad and conductive trace are pressed toward one another, the cantilevered spring arms are likewise deflected towards each other. The two contact surfaces are thereby pressed together to produce the shortened electrical path. To prevent the contact surfaces from abrasively sliding against each other, each contact surface is preferably formed with a curved shape. When pressed together, the apexes of the curved shapes contact each other. To allow the apexes to slide smoothly over each other, the bellows leg is formed to afford a resiliency that allows the second contact surface to slide over the bellows leg thereby providing for continued deflection of the spring arms. Preferably, the direction of sliding motion between the second contact surface and the bellows leg is normal to the plane in which the spring arms deflect.

In another aspect of the invention, to retain the contact within the insulative housing, the contact can have retention members extending outwardly from the sides of the center portion. In an embodiment, the retention members can be configured to engage the insulative housing in a manner that allows the contact to float with respect to the aperture so that the contact can adjust to the locations of the contact pads and the conductive traces. In an embodiment, the retention members can be configured to rigidly join the contact to the insulative housing.

DETAILED DESCRIPTION OF THE INVENTION

Figure 1:
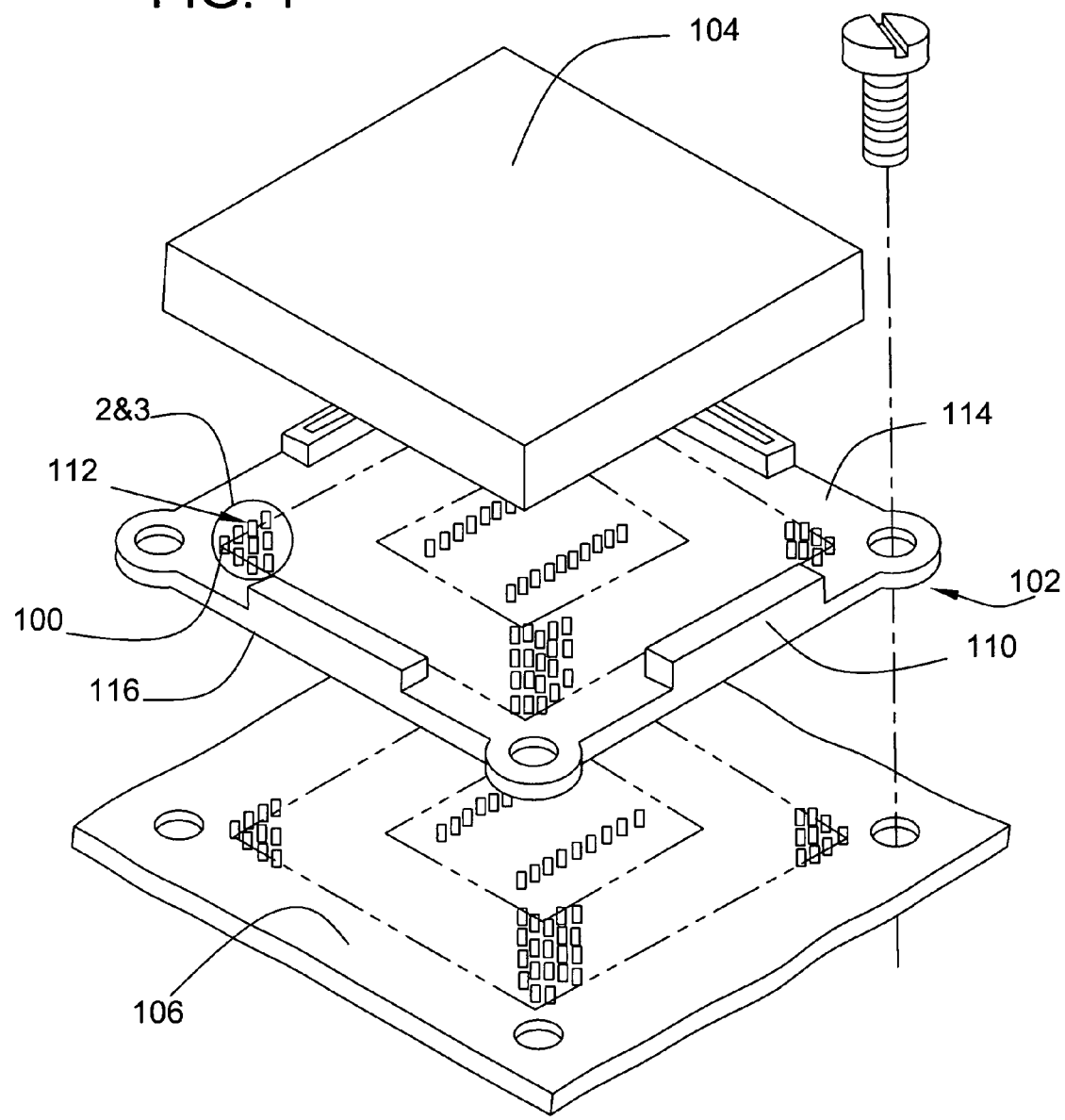
FIG. 1 is a perspective, exploded view illustrating an electrical connector having a contact according to the present invention for providing electrical communication between an integrated circuit package and a substrate.

Now referring to the drawings, wherein like reference numbers refer to like features, there is illustrated in FIG. 1 an exemplary electrical connector 102 configured for retaining an electrical contact of the present invention in an exemplary application. The electrical connector is located between an integrated circuit package 104 that includes a plurality of electrically conductive contact pads or lands and a substrate 106 that includes one or more conductive traces. To provide electrical communication between the contact pads of the integrated circuit package 104 and the electrical traces of the substrate 106, the electrical connector 102 includes a plurality of electrical contacts 100 retained in an insulative housing 110. As illustrated in FIG. 1, to retain the contacts 100, the insulative housing 110 includes a plurality of apertures 112 disposed therethrough from a first surface 114 to a second surface 116. The apertures 112 are arranged to correspond to the locations of the contact pads of the integrated circuit package 104 and the conductive traces of the substrate 106.

Figure 2:
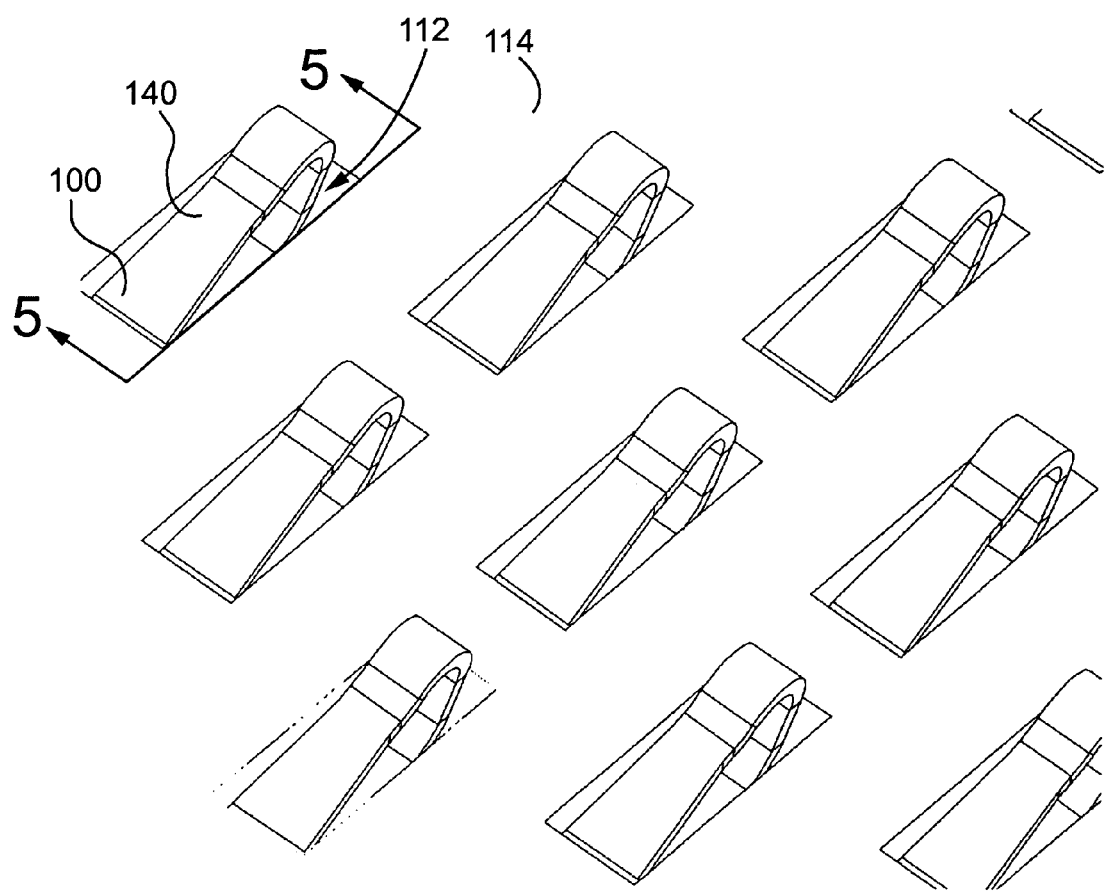
FIG. 2 is a detailed view of the indicated section of FIG. 1 illustrating the first surface of the housing including a contact inserted into an aperture.
Figure 3:
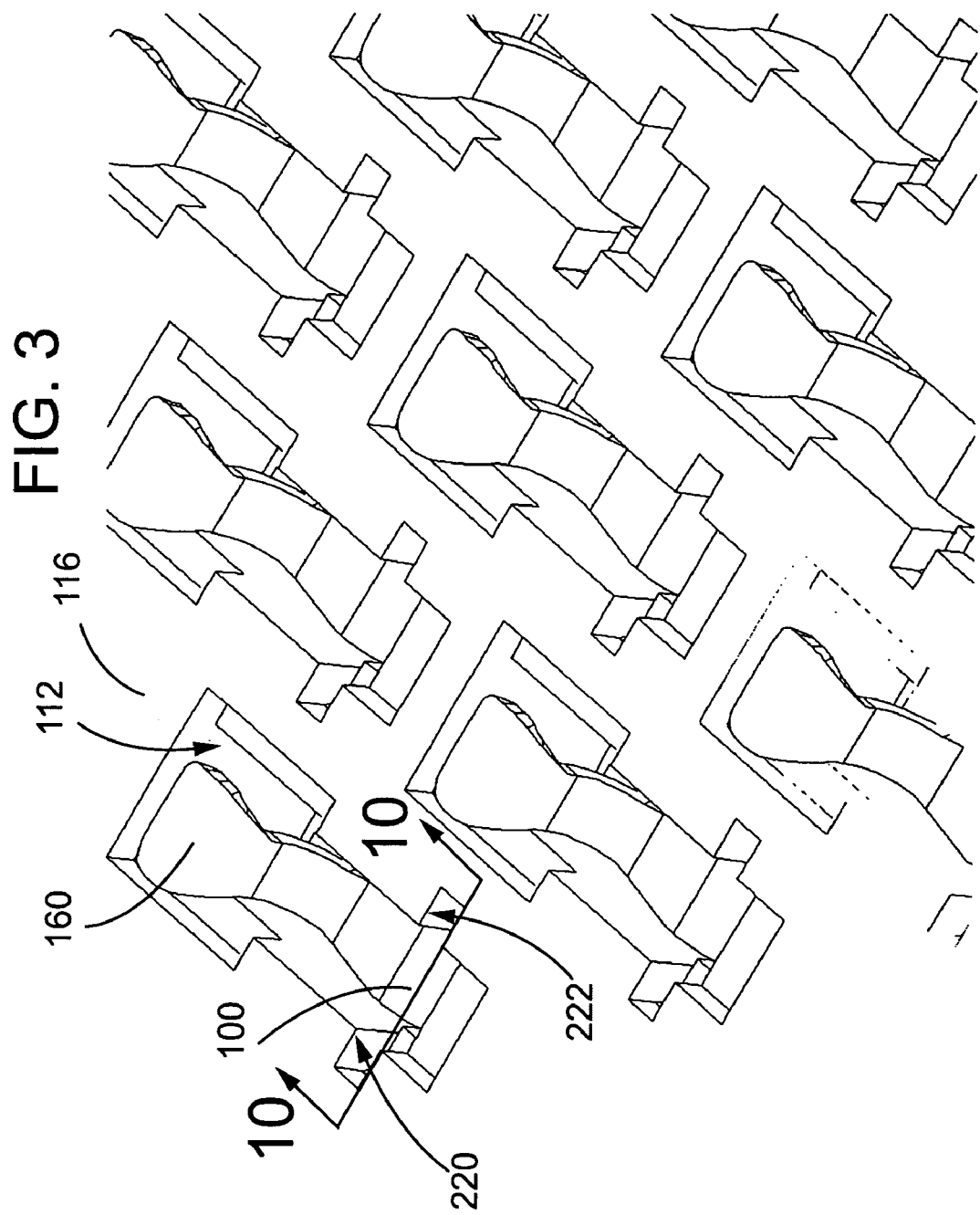
FIG. 3 is a detailed view taken opposite the view illustrated in FIG. 2 illustrating the opposing second surface of the housing.

As illustrated in FIGS. 2 and 3, when the contact 100 is appropriately inserted into the aperture 112, parts of the contact project from both the first and second surfaces and are therefore capable of making electrical contact with the contact pads and conductive traces.

While the present invention is described in the context of providing electronic coupling between an integrated circuit package and substrate, it will be readily appreciated that the invention is equally applicable to electronic coupling between other types of electrical components, such as, between two circuit-carrying substrates.

Figure 4:
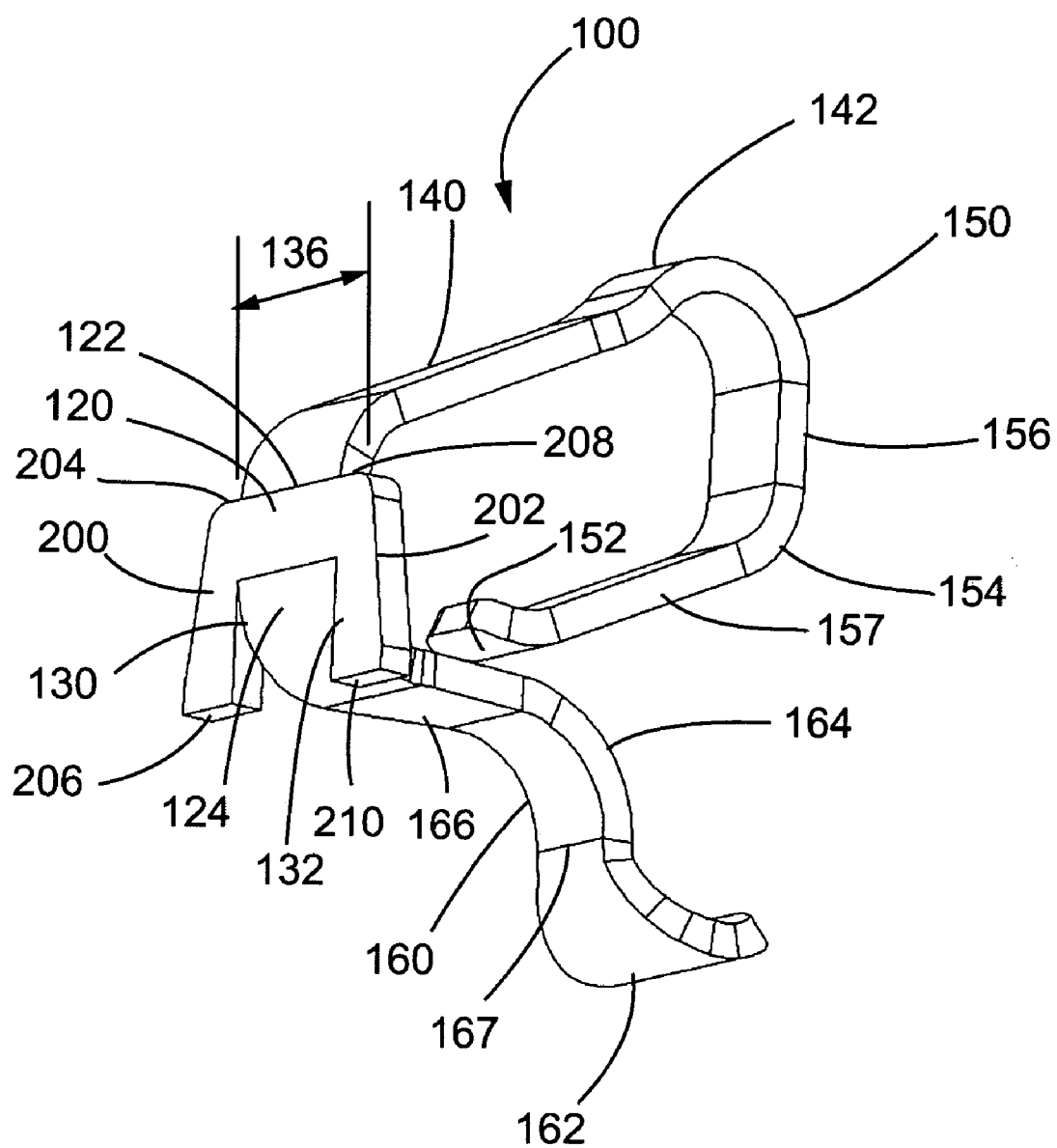
FIG. 4 is a perspective view of the electrical contact as formed.

An embodiment of the electrical contact 100 is better illustrated in FIG. 4. The electrical contact 100 has a generally planer center portion 120 defined by an upper end 122 and a lower end 124. For purposes of orientation, the upper end 122 will define an upwards direction with respect to the electrical contact and the lower end 124 will define a downwards direction with respect to the electrical contact 100. However, the terms "upwards" and "downwards" are relative and in no way should be construed as a limitation of the inventive electrical contact. The center portion 120 is further defined by a first side 130 and a second side 132 that extend between the upper and lower ends 122, 124 such that the center portion has a given width 136. In the illustrated embodiment, the width of the center portion 120 may be approximately 0.024 inches.

Figure 5:
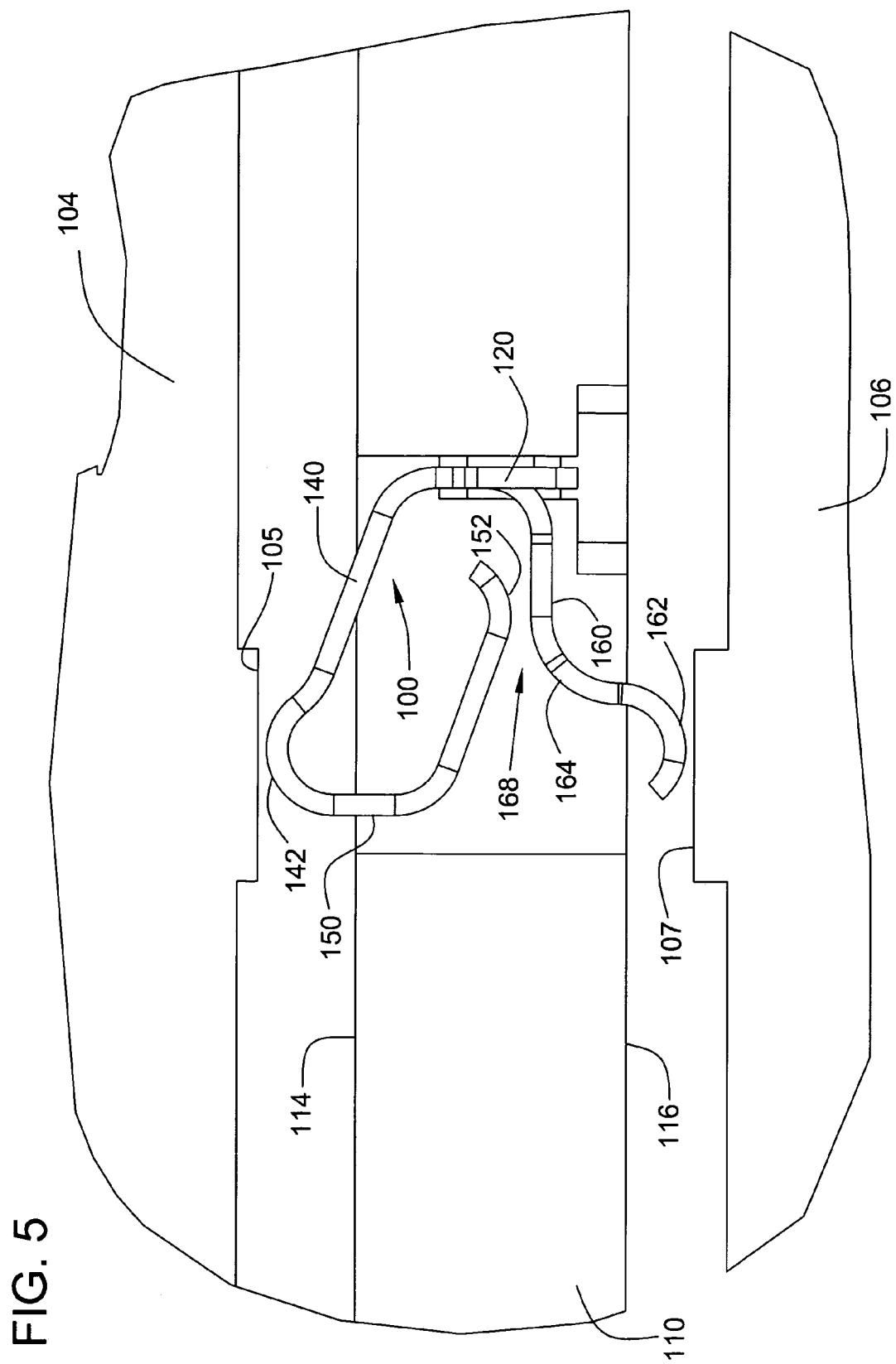
FIG. 5 is a cross-sectional view taken along lines 5-5 of FIG. 2 illustrating the un-deflected contact retained in the aperture of the insulative housing and also illustrating the integrated circuit package and the substrate.
Figure 6:
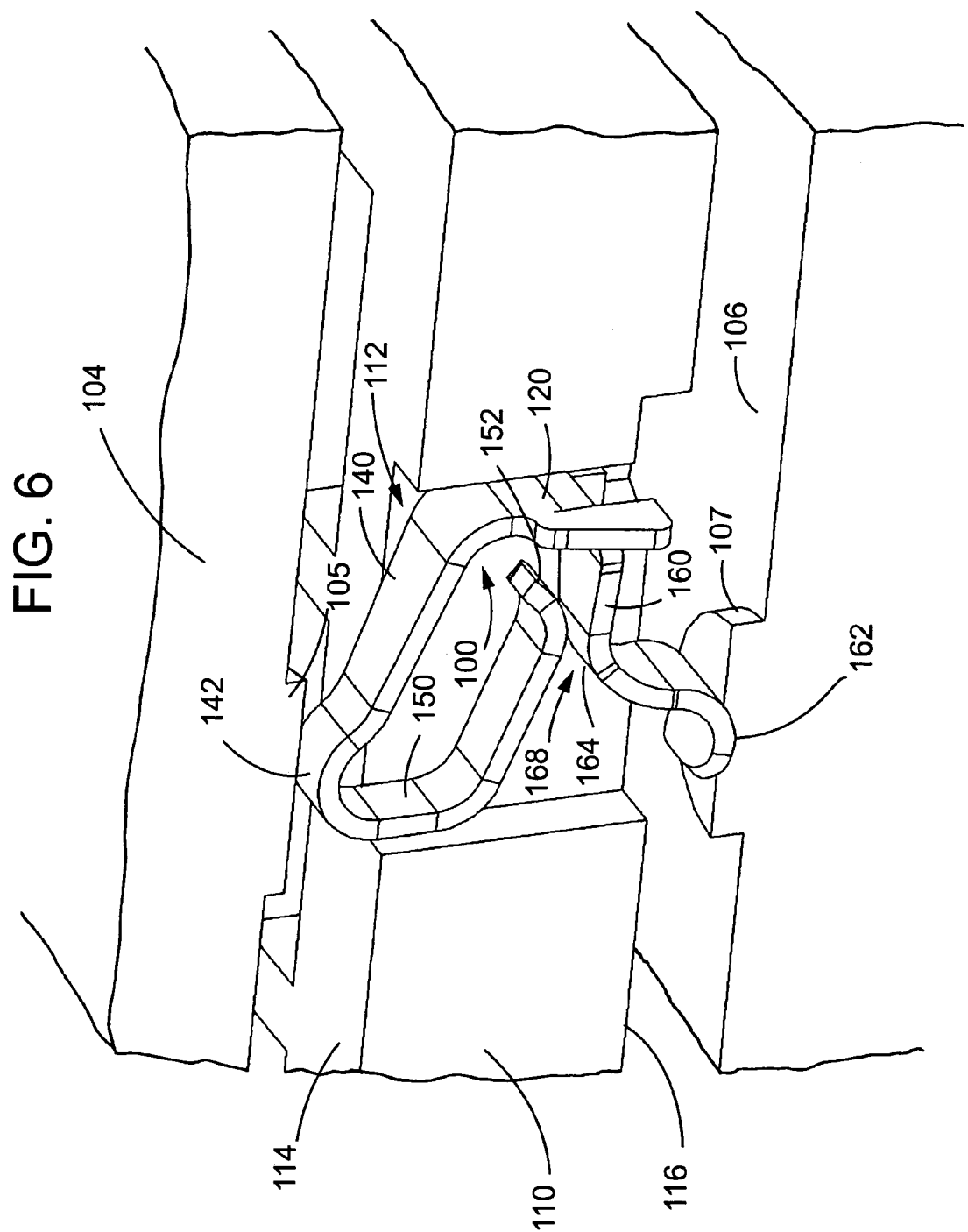
FIG. 6 is a perspective view of the cross-sectional view illustrated in FIG. 5.

Extending at an angled, upwards direction from the upper end 122 is a first spring arm 140. The first spring arm 140 is attached to the center portion 120 in a cantilevered fashion such that the first spring arm can deflect with respect to the center portion. The first spring arm 140 terminates in a curved first land surface 142 at a location above the upper end 122. Therefore, as illustrated in FIGS. 5 and 6, when the electrical contact 100 is correctly placed in the aperture 112, the first land surface 142 projects above the first surface of the housing proximate to a pad 105 on the integrated circuit package 104.

Figure 7:
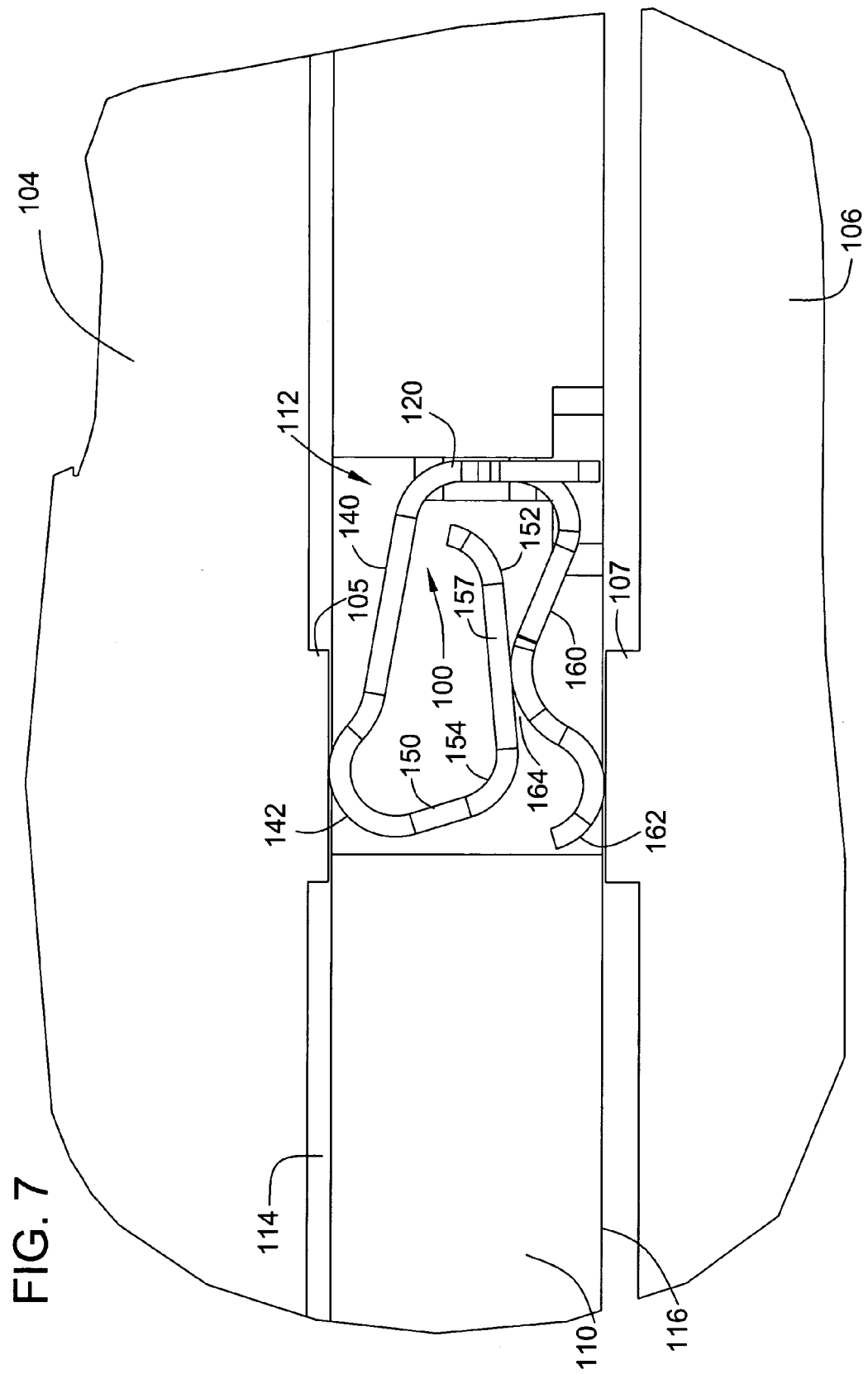
FIG. 7 is a cross-sectional view similar to FIG. 5 illustrating the contact as deflected between the integrated circuit package and the substrate.
Figure 8:
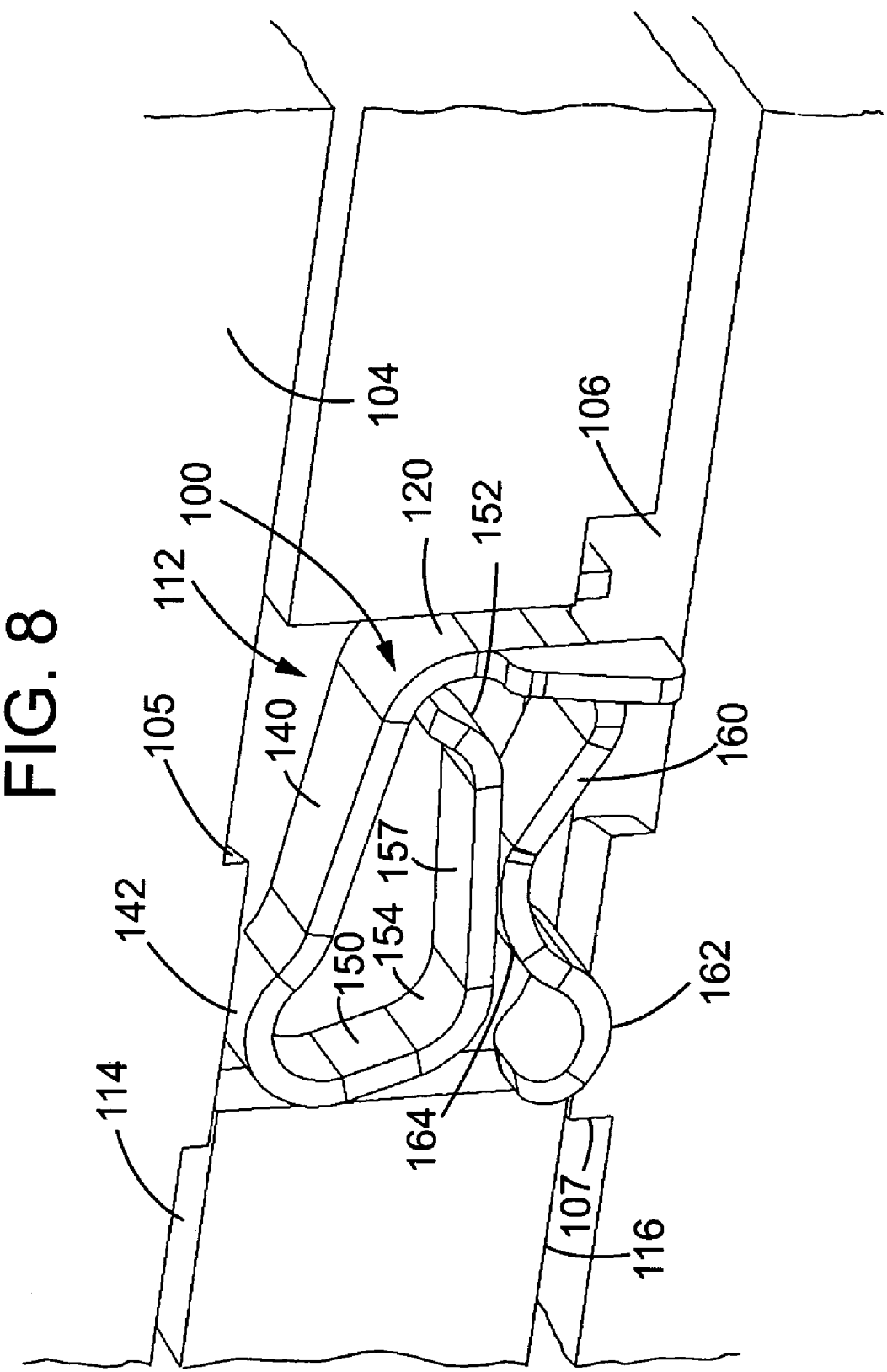
FIG. 8 is a perspective view of the cross-sectional view illustrated in FIG. 7.

Referring to FIGS. 7 and 8, as the integrated circuit package 104 is pressed or clamped to the first surface 114 of the insulative housing 110, the pad 105 causes the first spring arm 140 to deflect downward with respect to the center portion 120. In fact, the first spring arm 140 may be deflected partially or wholly into the aperture 112. Because of the cantilevered nature of the first spring arm 140 and the resiliency of the contact material, the deflected first spring arm 140 exerts an upward contact force against the pad 105 ensuring an adequate electrical connection.

As shown in FIGS. 7 and 8, the contact pad 105 tangentially contacts the curved first land surface 142 thereby concentrating the contact force produced by the cantilevered first spring arm. Additionally, because of the curved shape of the first land surface 142, there is less of a tendency for the first land surface to pierce or penetrate the contact pad 105. Furthermore, the first land surface 142 and the first spring arm 140 can be formed with substantially the same width as the center portion 120. Thus, in such embodiments, the width of the first land surface 142 provides a sufficient dimension for the contact pad 105 to contact.

Referring to FIG. 4, extending generally downwards from the first land surface 142 is a bellows leg 150. In the illustrated embodiment, the bellows leg 150 includes a first portion 156 that extends generally parallel to the center portion 120 and a second portion 157 that extends generally parallel to the first spring arm 140. The first and second portions 156, 157 are joined together at a bend 154 that approximately corresponds to the vertically position of the center portion 120. In the illustrated embodiment, the angle of the bend is less than 90 degrees so that the second portion continues to extend generally downward with respect to the center portion. The bellows leg 150 terminates in a first contact surface 152 that curves slightly upwards toward the first spring arm 140. The first contact surface 152 can be located above or below the lower end 124 of the center portion 120. As illustrated, the first contact surface 152 and the bellows leg 150 can be formed with the same width as the center portion 120 and the first spring arm 140.

Referring to FIG. 4, extending from the lower end 124 of the center portion 120 is a second spring arm 160 that terminates in a second land surface 162. The second spring arm 160 includes a first portion 166 attached to the lower end 124 in a cantilevered fashion. The first portion 166 is also attached to a second portion 167 by a curve 164 that directs the second portion generally downwards. As such, in the illustrated embodiment, the second land surface 162 is below the lower end 124. Therefore, as illustrated in FIGS. 5 and 6, when the electrical contact 100 is correctly placed in the aperture 112, the second land surface 162 projects below the second surface 116 of the insulative housing 112 proximate to an electrical trace 107 on the substrate 106. Furthermore, because of the cantilevered fashion in which the second spring arm 160 is attached to the center portion 120, the second spring arm can deflect with respect to the center portion.

Referring to FIGS. 7 and 8, as the substrate 106 is pressed or clamped to the second surface 116 of the insulative housing 110, the electrical trace 107 causes the second spring arm 160 to deflect upwards with respect to the center portion 120. In fact, the second spring arm 160 may be deflected partially or wholly into the aperture 112. Because of the cantilevered nature of the second spring arm 160 and the resiliency of the contact material, the deflected second spring arm exerts a downward contact force against the electrical trace 107 ensuring an adequate electrical connection.

To optimize contact between the electrical trace 107 and the second land surface 162, the second land surface is shaped to curve slightly upwards. As will be appreciated, the electrical trace 107 tangentially contacts the apex of the curved second land surface 162 thereby concentrating the contact force produced by the second spring arm 160. Additionally, because of the smooth, curved shape of the second land surface 162, there is less of a tendency for the second land surface to pierce or penetrate the electrical trace 107. Furthermore, the second land surface 162 can be formed with a width equal to or, as illustrated, greater than the width of the center portion 120. Thus, in such embodiments, the width of the second land surface 162 provides a sufficient dimension for the electrical trace 107 to make contact with.

Referring to FIG. 4, the curve 164 can function as a second contact surface that is located between the first portion 166 and the second portion 167. Preferably, the second contact surface 164 is located approximately below the first contact surface 152 so that the two contact surfaces appear, as illustrated in FIGS. 5 and 6, as opposing curves. In the embodiment illustrated in FIGS. 5 and 6, the first and second contact surfaces 152, 164 are separated by a gap 168. An advantage of providing the gap 168 is that the first and second contact surfaces 152, 164 can be easily plated during production of the contact.

Referring to FIGS. 7 and 8, when the first and second spring arms 140, 160 are deflected towards each other by the integrated circuit package and/or substrate, the first contact surface 152 is pressed against the second contact surface 164 thereby eliminating the gap. This results in shortening the path electric current must travel through the contact 100. Since contact between the bellows leg 150 and spring arm 160 occurs tangentially along the apex of the curved first contact surface 152 and the curved second contact surface 164, abrasion and the likelihood of damaging or fusing together of the first and second contact surfaces is reduced. When the forces causing the spring arms to deflect are removed, the resiliency of the contact material can cause the contact surfaces 152, 164 to separate re-creating the gap 168 illustrated in FIGS. 5 and 6. Furthermore, where the widths of the bellows leg 150 and second spring arm 160 are similar to or the same as the center portion 120, the contact surfaces will have an adequate dimension across which contact can occur.

Preferably, referring to FIGS. 2, 3, 5 and 6, the first and second spring arms 140, 160 do not project a substantial amount beyond the first and second surfaces 114, 116 of the insulative housing 110. This reduces the chance that the spring arms 140, 160 will be overly strained during deflection and thereby avoid becoming permanently deformed. This also reduces the chance that the projecting spring arms 140, 160 will be bent or otherwise damaged due to unintentional contact with a foreign object.

Referring to FIGS. 5 and 6, it will be noted that because the second contact surface 164 is located within the length of the second spring arm 160 and has substantially the same width as the center portion 120, there is a sufficient amount of surface area for the first contact surface 152 to press against. In other words, precise alignment between the first and second contact surface 152, 164 is not required. Additionally, it will be appreciated that the bellows leg 150 and first contact surface 152 function to press the second spring arm downwards against the electrical trace 107.

Referring to FIGS. 7 and 8, to allow the first and second spring arms 140, 160 to be further deflected toward each other after the initial contact between the first and second contact surfaces 152, 164, the second spring arm and the bellows leg 150 can be configured to allow the second contact surface 164 to slide along the bellows leg. More specifically, the resilient nature of the contact material allows the bellows leg 150 to bend upon itself at the first land surface 142 and the bend 154. Therefore, after the initial contact, the second contact surface 164 can slide along the second portion 157 of the bellows leg 150 as the bellows leg is displaced upwards toward the first spring arm 140. Accordingly, the first contact surface 152 is directed towards the center portion 120 as the bellows leg 150 bends. An advantage of enabling sliding motion of the second contact surface 164 along the first portion 157 is that it provides for a greater range of deflection between the spring arms 140, 160. Another advantage of enabling sliding motion of the second contact surface 164 with respect to the first contact surface 152 is that the contact surfaces can be wiped clean of any built-up debris that could hinder electrical communication across the contact surfaces. When the forces causing deflection of the spring arms are removed, the second contact surface 164 can slide back along the bellows leg 154 thereby causing the contact 100 to recover its initial un-deflected shape.

Figure 9:
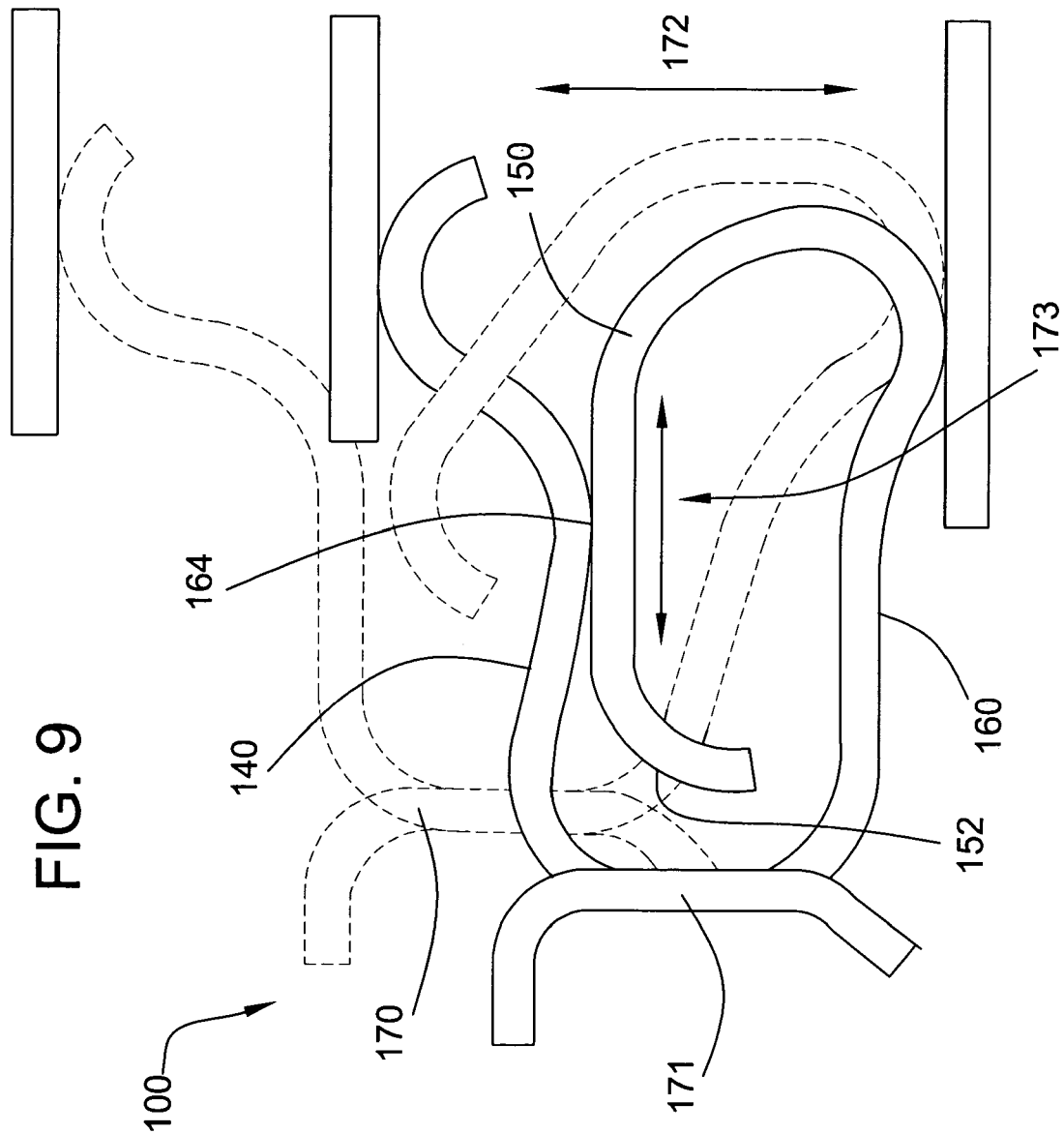
FIG. 9 is a side elevation view illustrating the forces exerted during deflection of the contact.

Another advantage of the inventive contact 100 is demonstrated by reference to FIG. 9, which illustrates the contact 100 in both its initial un-deflected shape 170 and deflected shape 171. In a preferred embodiment, the direction of the sliding motion between the second contact surface 164 and the bellows leg 150 is normal to the plane in which the first and second spring arms 140, 160 deflect. This preferred configuration enhances the contact's ability to recover its initial un-deflected shape when the forces deflecting the first and second spring arms 140, 160 are removed. During the initial deflection, the deflecting forces must exceed the upwards and downwards resiliency forces generated by the spring arms 140, 160. The vectors representing the deflecting forces and the resiliency forces are oriented in a vertical plane as indicated by the arrow 172.

As the first and second contact surfaces 152, 164 contact and slide along each other, a fictional force is generated that the deflecting forces must additionally overcome. The force vectors for the frictional forces, however, are substantially oriented in a horizontal plane as indicated by arrow 173, and are therefore normal to the deflecting forces. Accordingly, the frictional forces do not substantially oppose the vertical deflecting forces. When the deflecting forces are removed and the resiliency forces displace the first and second spring arms 140, 160 to their initial positions, the frictional forces will attempt to resist the sliding motion of the second contact surface 164 along the bellows leg 150. Again though, because the frictional resistance forces are normal to the resiliency forces, they will not substantially affect recovery of the contact.

Figure 10:
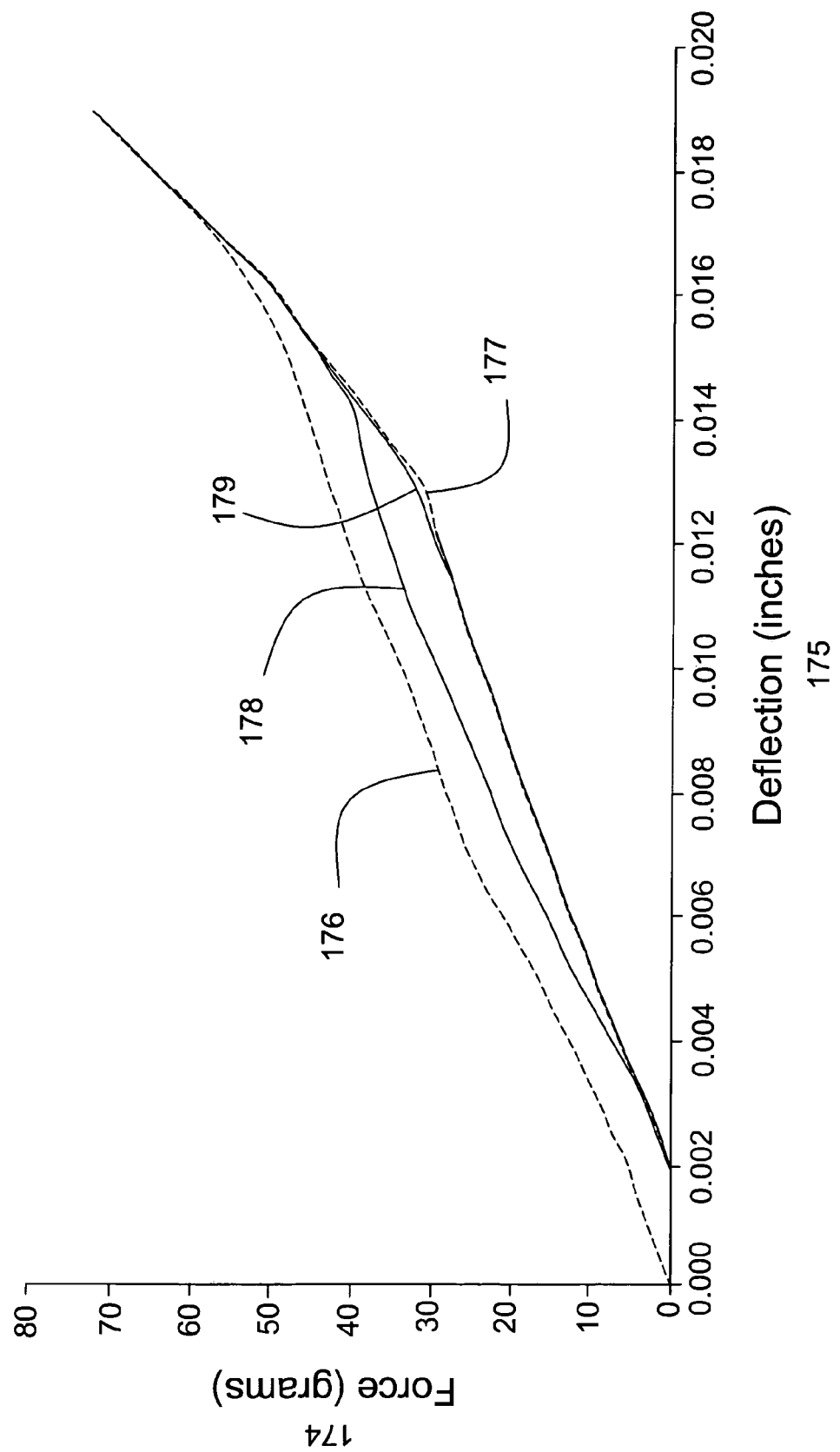
FIG. 10 is a graph depicting the forces exerted in FIG. 9.

The relationship between force and displacement for the illustrated contact can be represented by the graph shown in FIG. 10 in which force 174 is represented by the vertical axis while displacement 175 is represented by the horizontal axis. The graph of FIG. 10 is a representation of data generated by computer-aided finite element analysis simulations of the inventive contact. The curve 176 represents the force and displacement relations for the initial deflection of the spring arms together while curve 177 represents the recovery of the spring arms. As represented, curve 176 originates from the horizontal axis left of where recovery curve 177 intersects the horizontal axis. This discrepancy represents cold working of the metal contact that occurs during the initial deflection cycle after the contact is manufactured. The imparted cold working results in a permanent set preventing the contact from fully recovering its pre-deflection shape.

Curve 178 represents any subsequent deflection of the spring arms together. As will be appreciated, recovery of the spring arms from the subsequent deflections as represented by curve 178 occurs along the subsequent recovery curve 179. Accordingly, after accounting for the initial cold working of the contact, the contact will generally return to the same shape. Moreover, the curve 178 generated during the subsequent deflections is substantially similar to the curve 179 generated during recovery.

Figure 11:
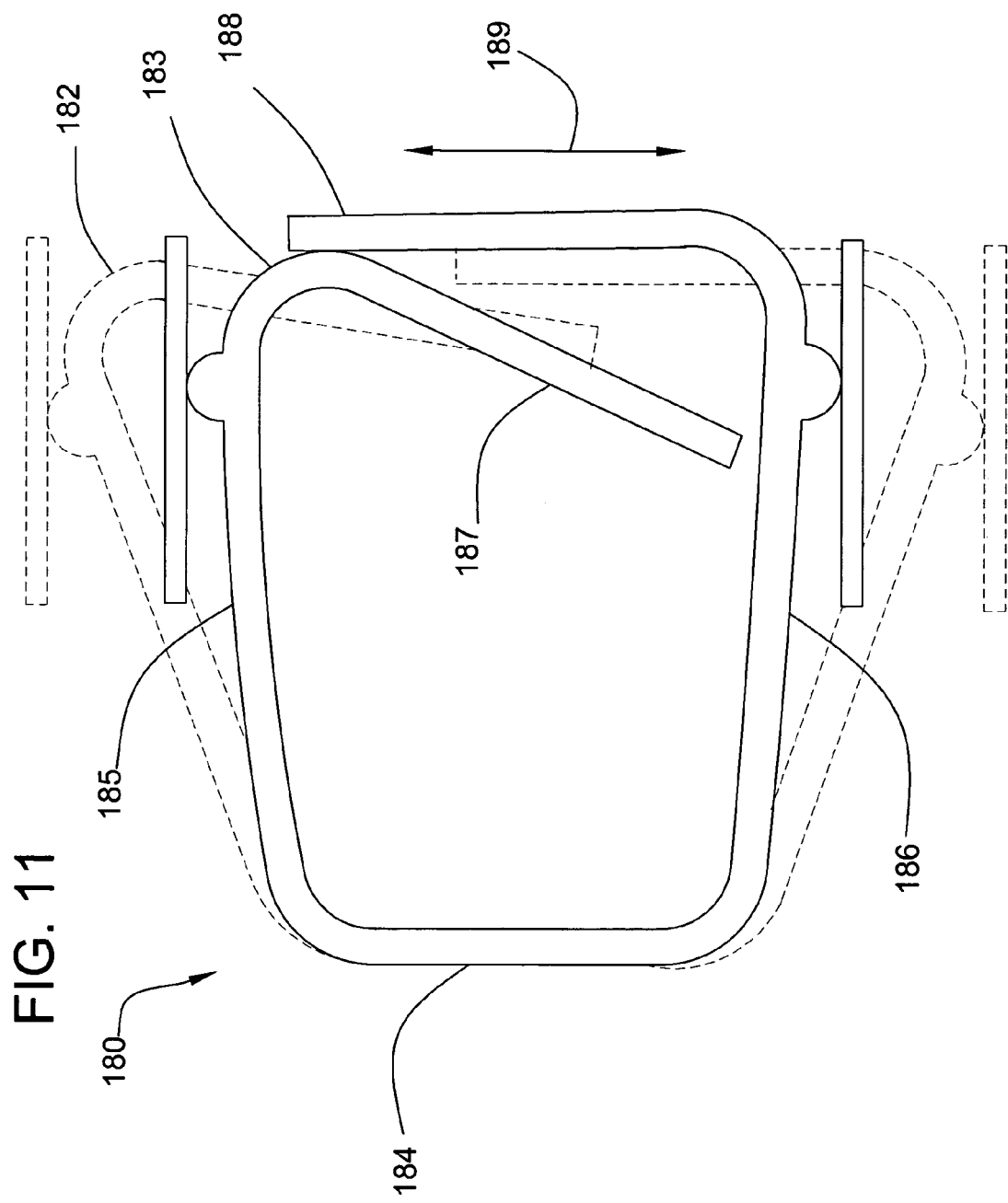
FIG. 11 is a side elevation view of a prior art contact illustrating the forces exerted during deflection of that contact.

It will be appreciated from the above that the inventive contact is a substantial improvement over prior art contacts in which the deflection, resiliency, and frictional forces are all oriented within the same plane. An example of such a prior art contact 180 is illustrated in FIG. 11 in both its initial un-deflected shape 182 and its deflected shape 183. The prior art contact 180 includes a center portion 184, opposing first and second resilient spring arms 185, 186, and inward extending fingers 187, 188 arranged at the free ends of each spring arm 185, 186. The fingers 187, 188 engage each other in an overlapping relationship. The deflection, resiliency, and frictional forces are all oriented in a vertical plane designated by the arrow 189. When the deflecting forces are removed and the first and second spring arms 185, 186 attempt to return to their initial positions, the frictional forces will resist the resiliency forces. If the resiliency forces are insufficient to overcome the frictional forces, the spring arms 185, 186 will not return to their initial positions.

Figure 12:
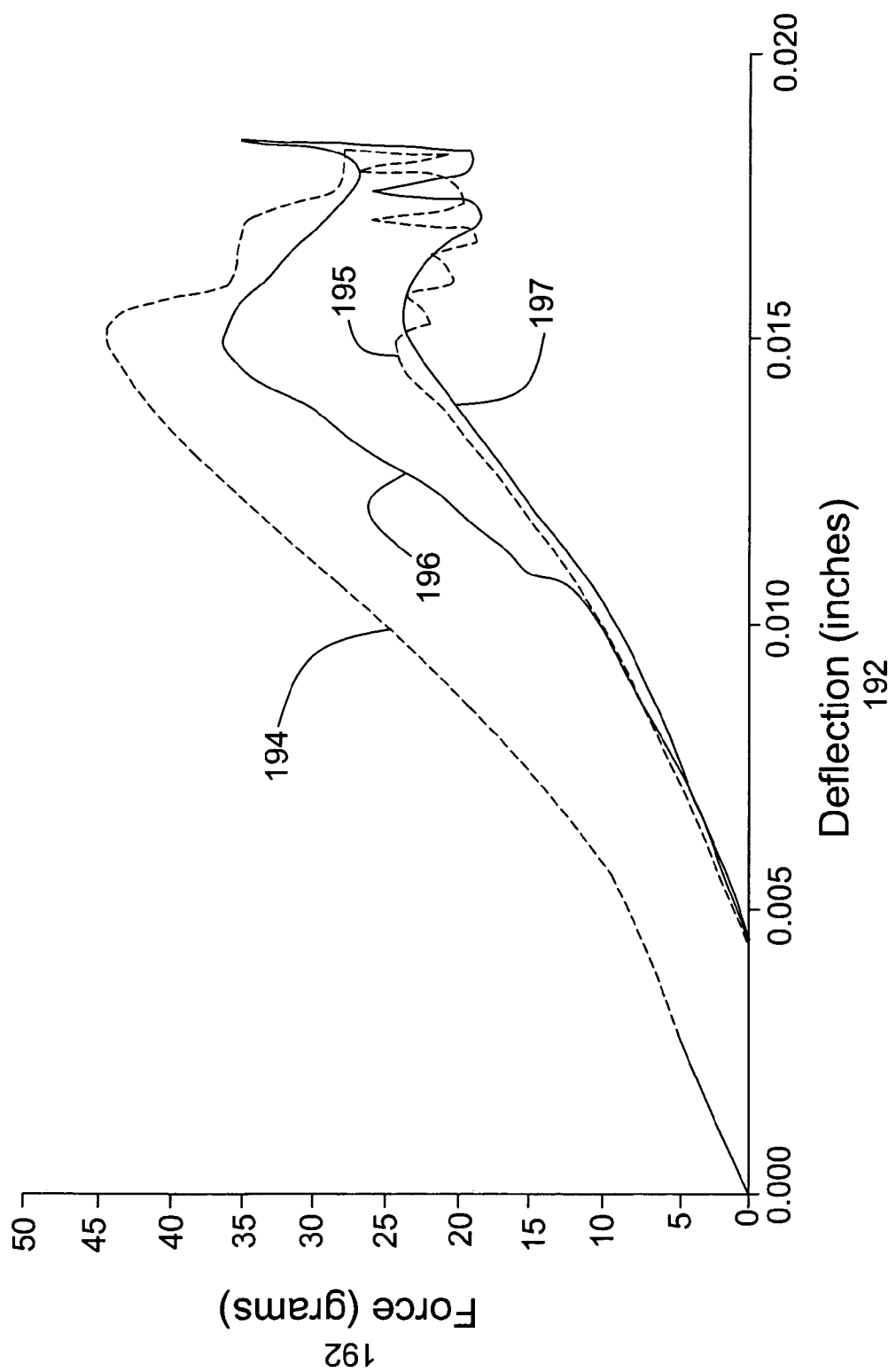
FIG. 12 is a graph depicting the forces exerted in FIG. 11.

The force vs. displacement graph for this contact is illustrated in FIG. 12, with force 190 represented by the vertical axis and displacement 192 represented by the horizontal axis. As before, a discrepancy exists between the curve 194 representing initial deflection and the curve representing recovery 195 due to the initial cold working of the contact and the permanent set induced. Subsequent deflections of the spring arms together are represented by curve 196 while subsequent recoveries are represented by curve 197. As illustrated, a substantial discrepancy exists between the curve 196 generated during subsequent deflections and the subsequent recovery curve 197, causing the two curves 196, 197 to form a hysteresis pattern. This hysteresis represents the resiliency force having to overcome the opposing frictional force. This problem is avoided by configuring the inventive contact 100 illustrated in FIG. 9 such that the friction forces are normal to the resiliency forces.

Figure 13:
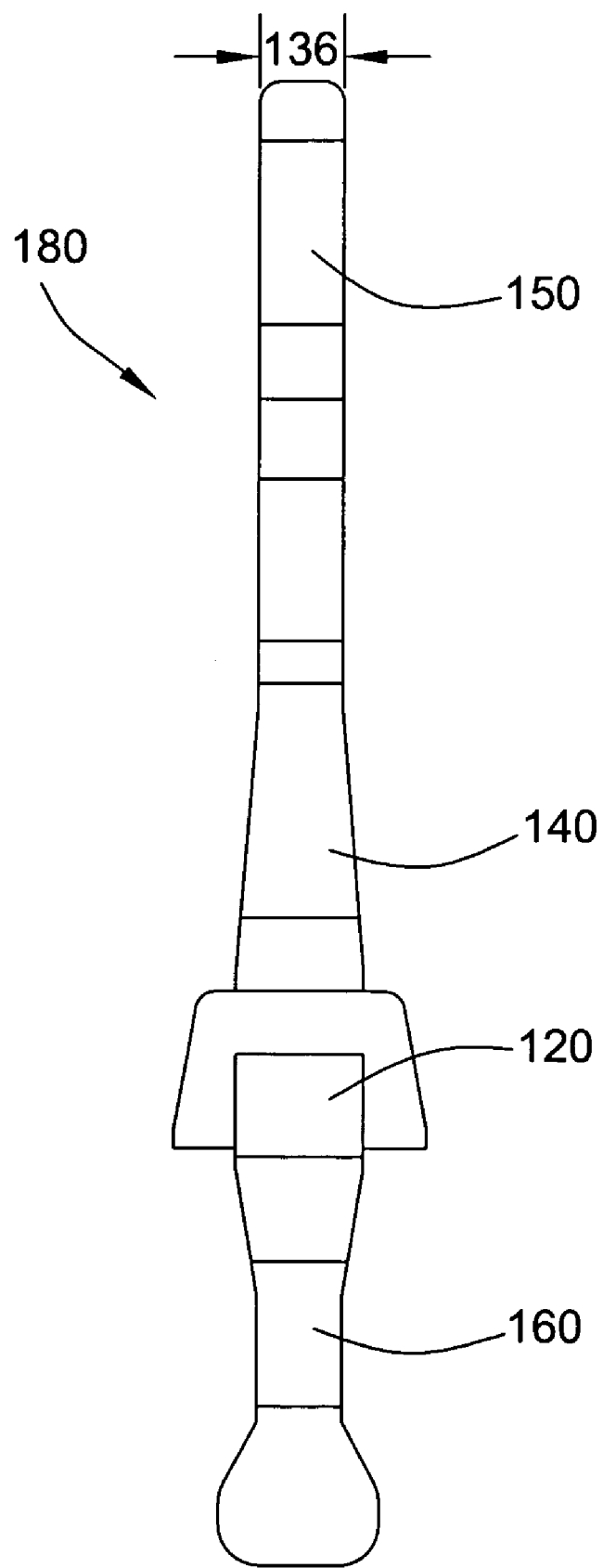
FIG. 13 is a top plan view of a blank stamped from sheet metal that is to be formed into the contact.

The electrical contact can be manufactured from any suitable conductive material that possesses the desirable resilient properties. Preferably, the contact is manufactured from metallic sheet material ranging between, for example, 0.0015-0.0030 inches in thickness. For example, as illustrated in FIG. 13, a planer blank 180 can be stamped from the sheet material that includes, in a flattened out arrangement, all the features of the contact including the center portion 120, spring arms 140, 160, and the bellows leg 150. Accordingly, stamping the blank 180 predetermines the width 136 of those features. The planer blank 180 can then be processed through a series of forming operations to form the shaped contact 100 illustrated in FIG. 4. The forming operations impart the curved shapes of the spring arms 140, 160 and bellows leg 150 by permanently cold-working the sheet material. The use of sheet material provides for some influence over the resilient properties through appropriate selection of the thickness of the chosen sheet material. Preferably, the sheet material and the formed dimensions are such as to allow the spring arms of the electrical contact to be deflected toward each other and recover over numerous cycles.

To retain the contact in the aperture, the contact can include one or more retention members that can engage the insulative housing. For example, in the embodiment illustrated in FIG. 4, the retention member can be configured as a retention wing 200. The retention wing 200 is a structure projecting from the first side 130 of the center portion 120 that extends between a upper shoulder 204 and a lower shoulder 206 and is vertically co-planer to the center portion. A second retention wing 202 can project from the second side 132 of the center portion and extend between a upper and lower shoulder 208, 210 as well. As illustrated in FIG. 13, the first and second retention wings 200, 202 are preferably formed as integral parts of the planer blank.

Figure 14:
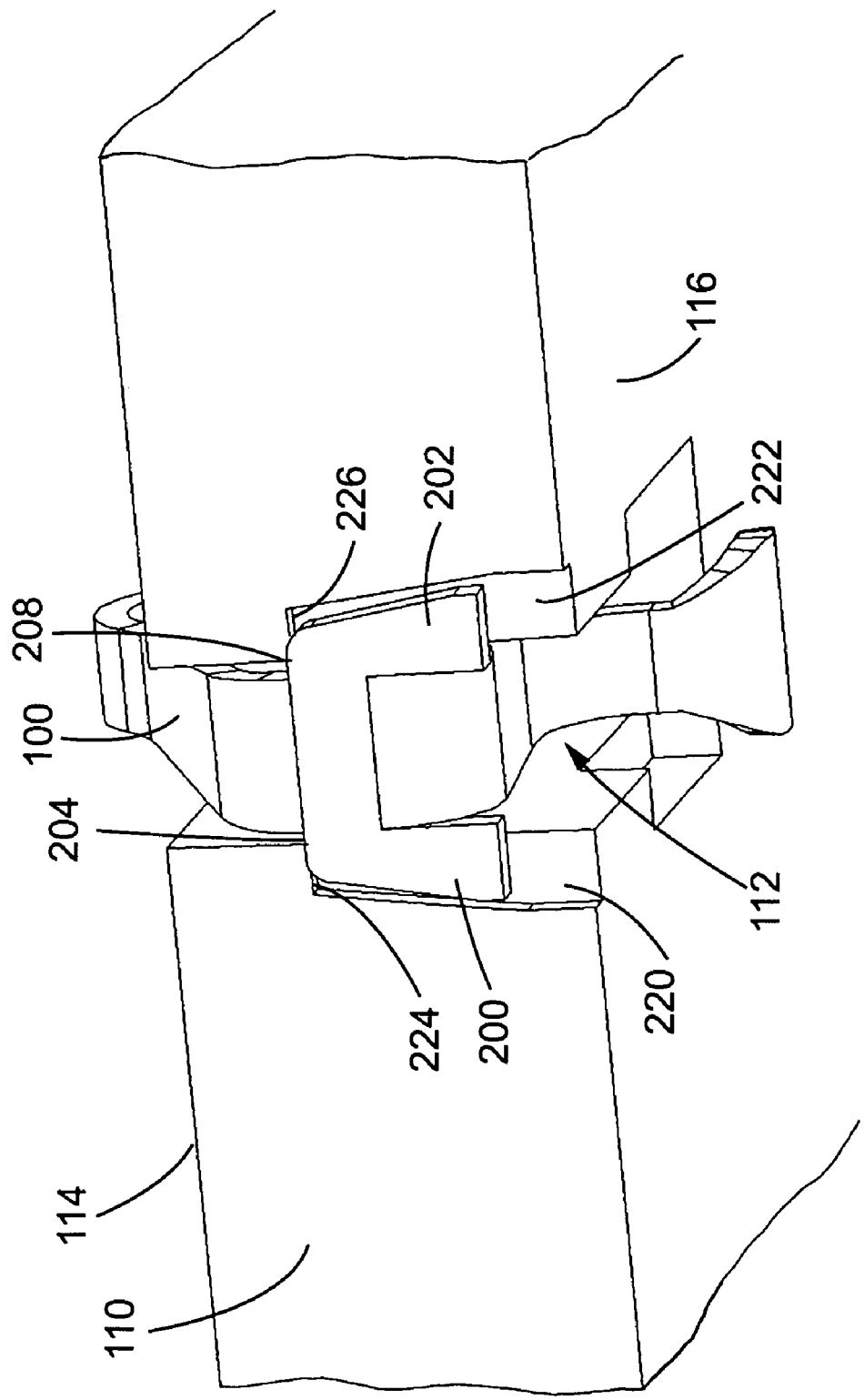
FIG. 14 is a cross-sectional perspective view taken along line 14-14 of FIG. 3 illustrating the contact being retained in the insulative housing.

As illustrated in FIGS. 3 and 14, the retention wings 200, 202, can be received by vertical slots 220, 222 formed on either side of the aperture 112 that considerably widen the aperture at one end. The slots 220, 222 are disposed from the second surface 116 part way towards the first surface 114 and terminate at two respective ledges 224, 226. When the contact 100 is inserted into the aperture, the upper shoulders 204, 206 of the retention wings abut against the ledges 224, 226. The dimension of the slots 220, 222 from the second surface 116 to the ledges 224, 226 functions to vertically position the contact within the insulative housing 110.

Figure 15:
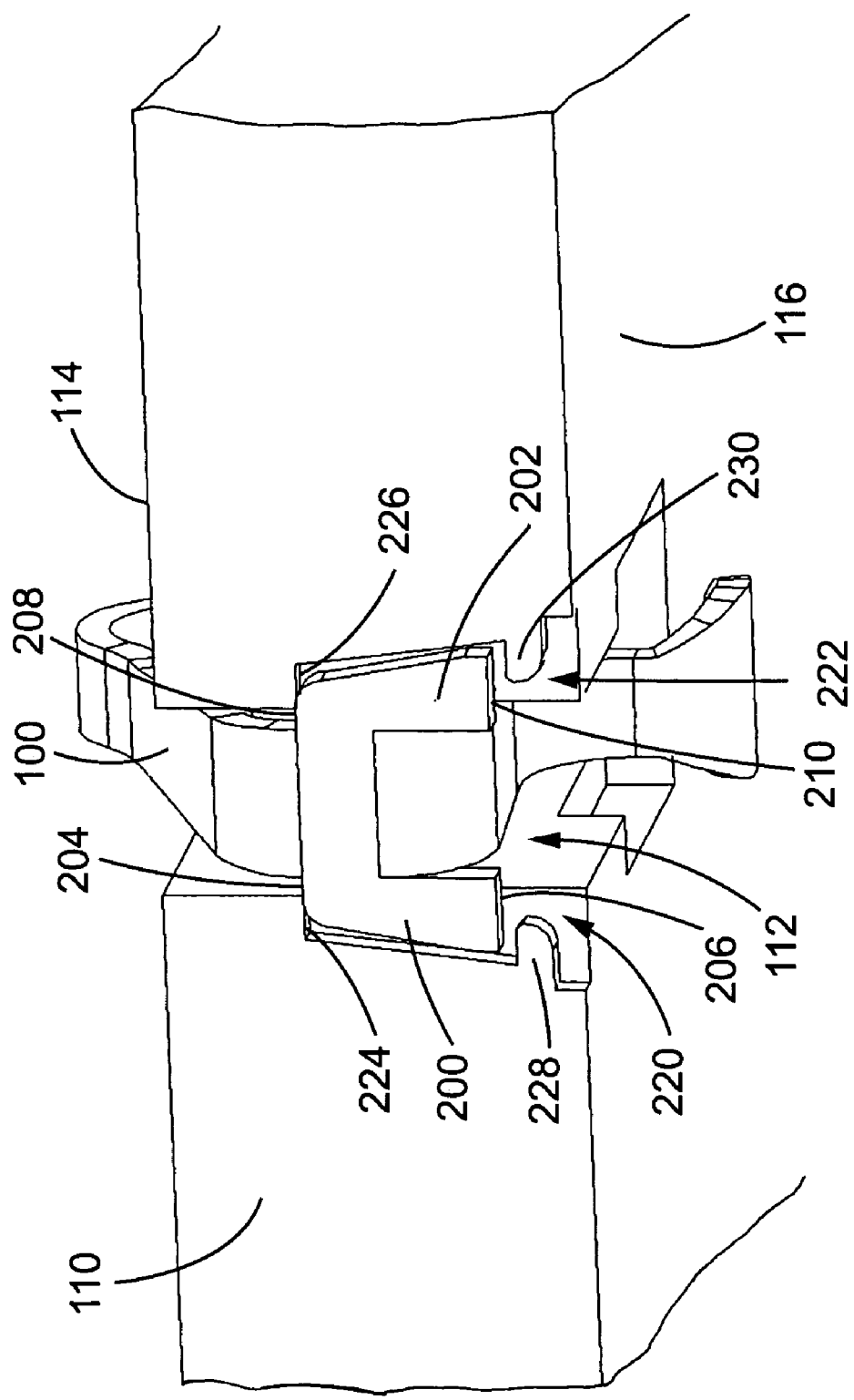
FIG. 15 is a cross-sectional perspective view taken along line 14-14 of FIG. 3 illustrating protuberances being formed into retention slots.

Referring to FIG. 15, to prevent the contact 100 from backing out of the aperture after insertion, two protuberances 228, 230 are formed into the slots proximate to the lower shoulders of the retention wings 200, 202. The protuberances 228, 230 can be formed by deforming the slots 220, 222 after insertion of the contact 100. For this reason, the insulative housing 110 is preferably made from a malleable material that can soften upon localized heating. Accordingly, the retention members 200, 202 are trapped between the ledges 224, 226 and protuberances 228, 230 and the contact is thereby retained in the insulative housing 110.

In a preferred embodiment, the length of the slots 220, 222 between the ledges 224, 226 and the protuberances 228, 230 is slightly larger than the length of the retention wings 200, 202 between the upper shoulders 204, 208 and the respective lower shoulders 206, 210. Also preferably, the size of the slots 220, 222 is larger than the thickness of the sheet metal forming the retention wings 200, 202. Accordingly, the contact is capable of slight vertical and/or horizontal movement with respect to the insulative housing 110 and can therefore float within the aperture 112.

As will be appreciated from FIGS. 7 and 8, an advantage of floating the contact 100 is that the contact can reposition itself within the aperture when the first and second spring arms 140, 160 are deflected together. Accordingly, when the pad 105 presses against the first land surface 142, the floating contact can shift within the aperture 112 so that the width of the first land surface lies substantially across the pad. A similar alignment can occur when the electrical trace 107 is pressed against the second land surface 162. As such, misalignment occurring during insertion of the contact is reduced. A related advantage of allowing the contact to reposition itself is the resulting equalization of the incurred forces and strains between the first and second spring arms.

Figure 16:
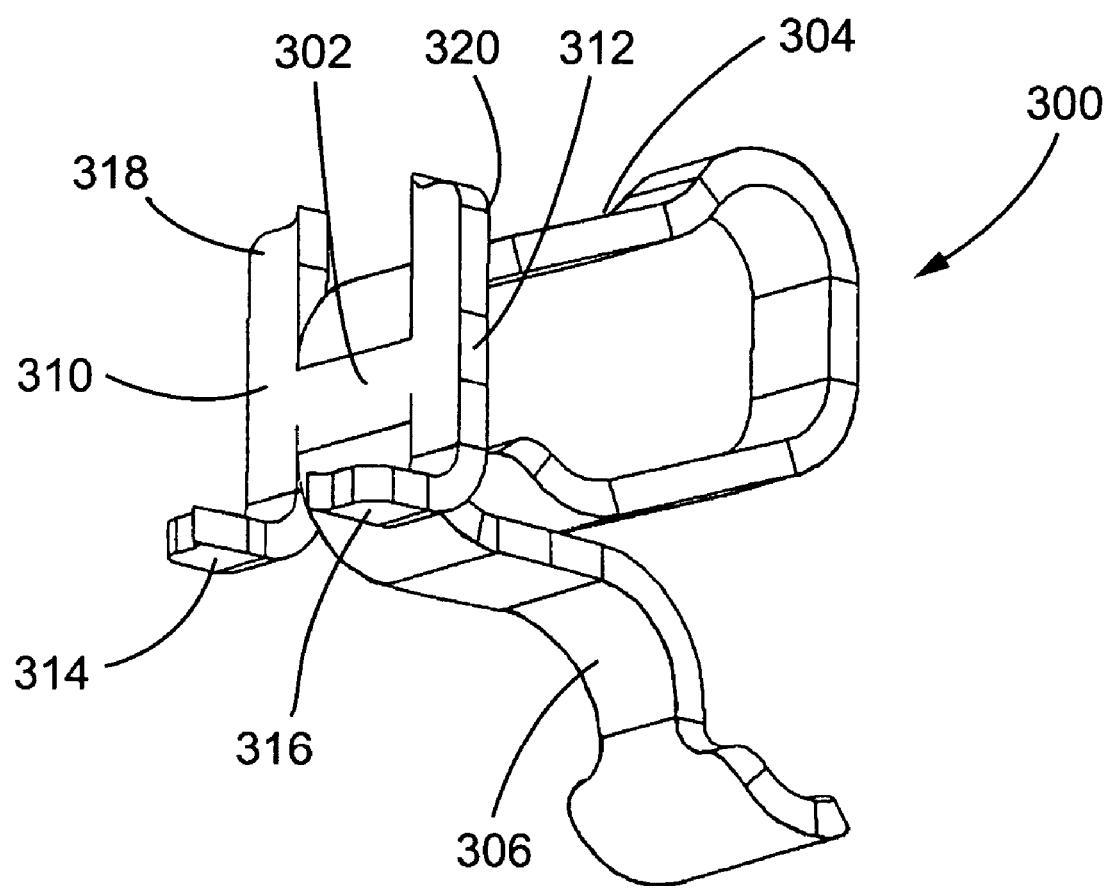
FIG. 16 is a rear perspective view of an embodiment of the contact configured with bendable retention wings.

As illustrated in FIG. 16, in another embodiment of the contact 300, the retention members 310, 312 can be bendable retention posts. Prior to insertion, the retention posts 310, 312 are vertical structures that can extend from both sides of the center portion 302. The retention posts 310, 312 each includes a lower segment 314, 316 that is bent at approximately a right angle with respect to the retention posts. Accordingly, the lower segments 314, 316 are normal to the center portion 302 and project therefrom in a direction generally opposite the direction that the first and second spring arms 304, 306 extend. The retention posts 310, 312 each also includes an upper segment 318, 320 that, prior to insertion into the insulative housing, is generally parallel with respect to the plane of the center portion 302. As will be appreciated from FIG. 17, the retention posts 310, 312 can be formed as an integral portion of the stamped blank 324 used to produce the formed contact 300 and accordingly will have the same thickness as the spring arms 304, 306 and center portion 302.

Figure 18:
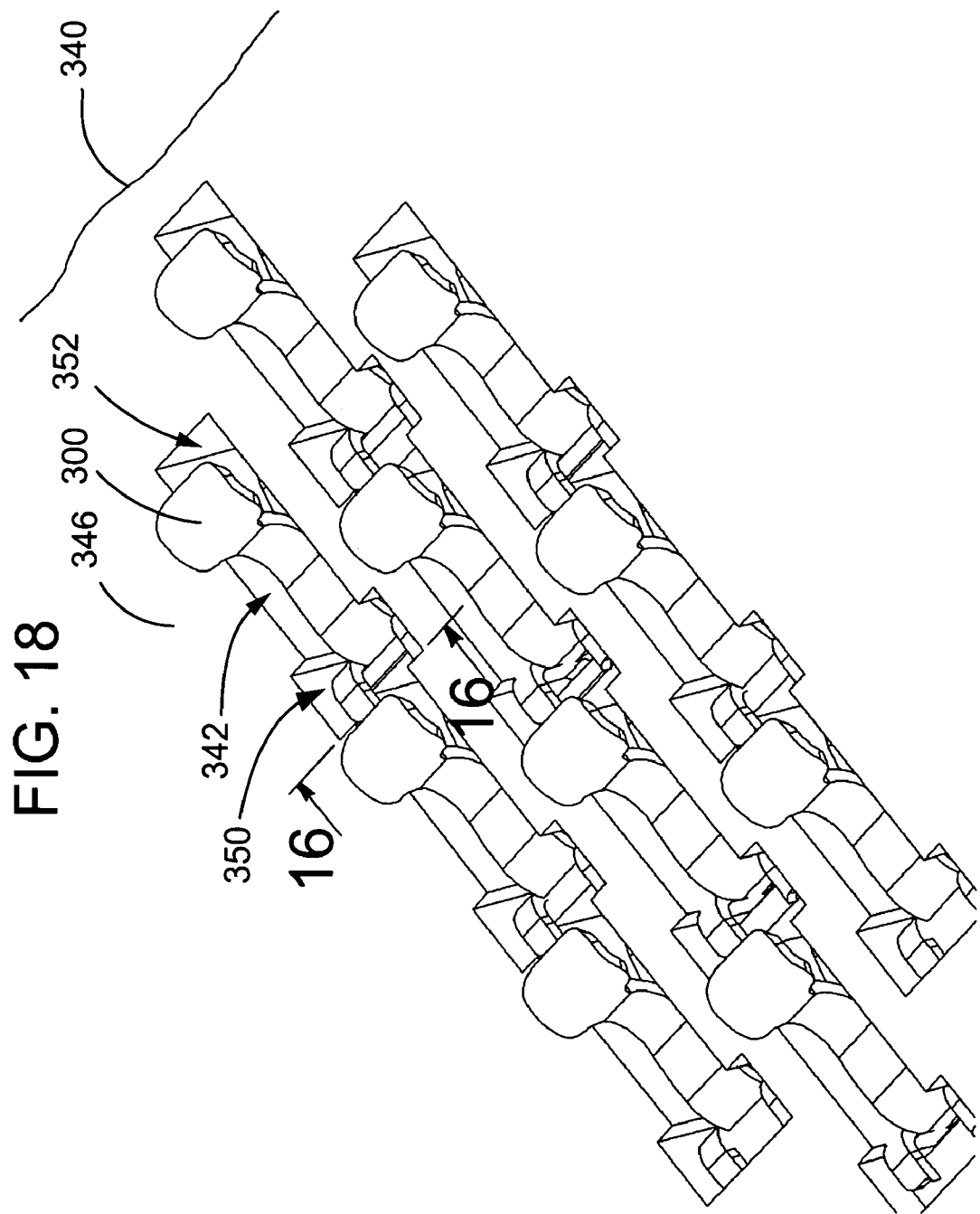
FIG. 18 is a detailed perspective view of the second surface of the insulative housing illustrating the contacts of FIG. 16 retained in the apertures.
Figure 19:
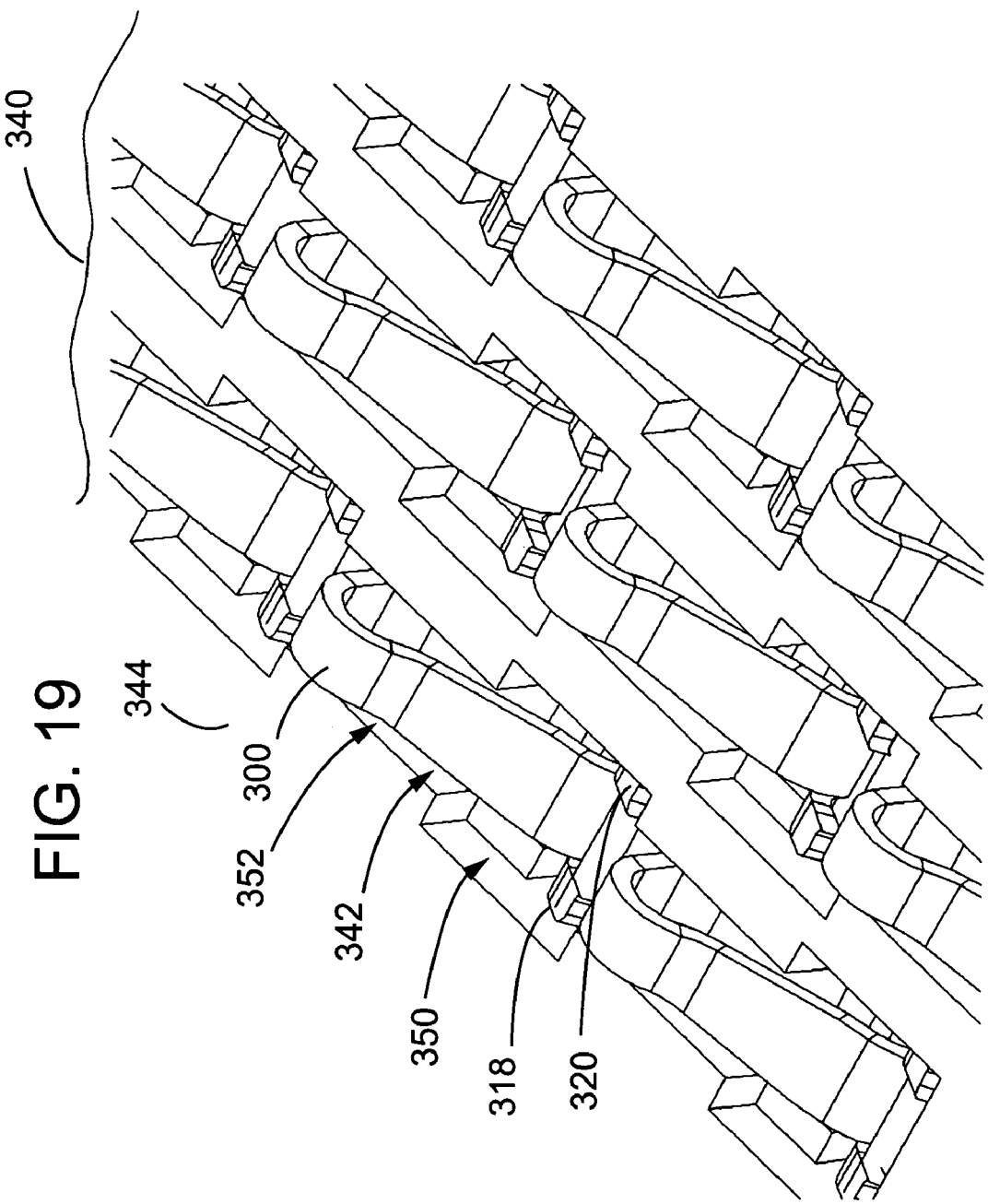
FIG. 19 is a detailed perspective view taken opposite the view illustrated in FIG. 18 illustrating the first surface of the insulative housing.
Figure 20:
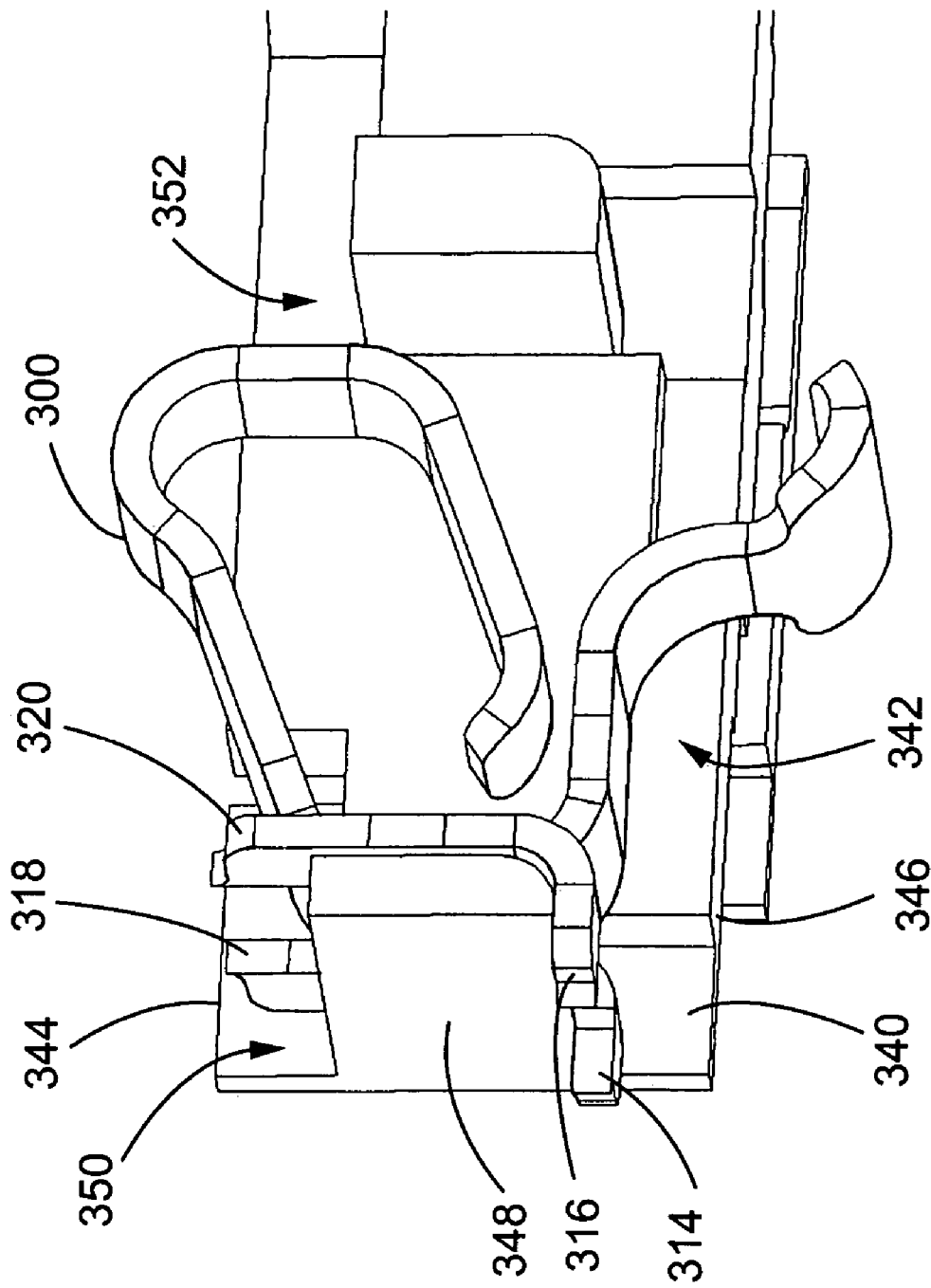
FIG. 20 is a cross-sectional perspective view taken along line 20-20 of FIG. 18 illustrating the bendable retention wings abutting against a sidewall.

To engage the retention posts, as illustrated in FIG. 18, the aperture 342 disposed into the housing 340 is substantially wider at a second end 350 than at the first end 352. Furthermore, as will be appreciated from FIGS. 18 and 19, the wider second end 350 extends further along the overall length of the aperture 342 at the first surface 344 than at the second surface 346. Referring to FIG. 20, the insulative housing 340 includes a sidewall 348 extending across the rear of the second end 350 that is inset from the first and second surfaces 344, 346. When the contact 300 is inserted into the aperture from the second surface 346, the bent lower segments 314, 316 abut against the sidewall 348. Accordingly, the dimension that the sidewall 348 is inset from the second surface 344 functions to vertically position the contact 300 within the insulative housing 340.

Figure 17:
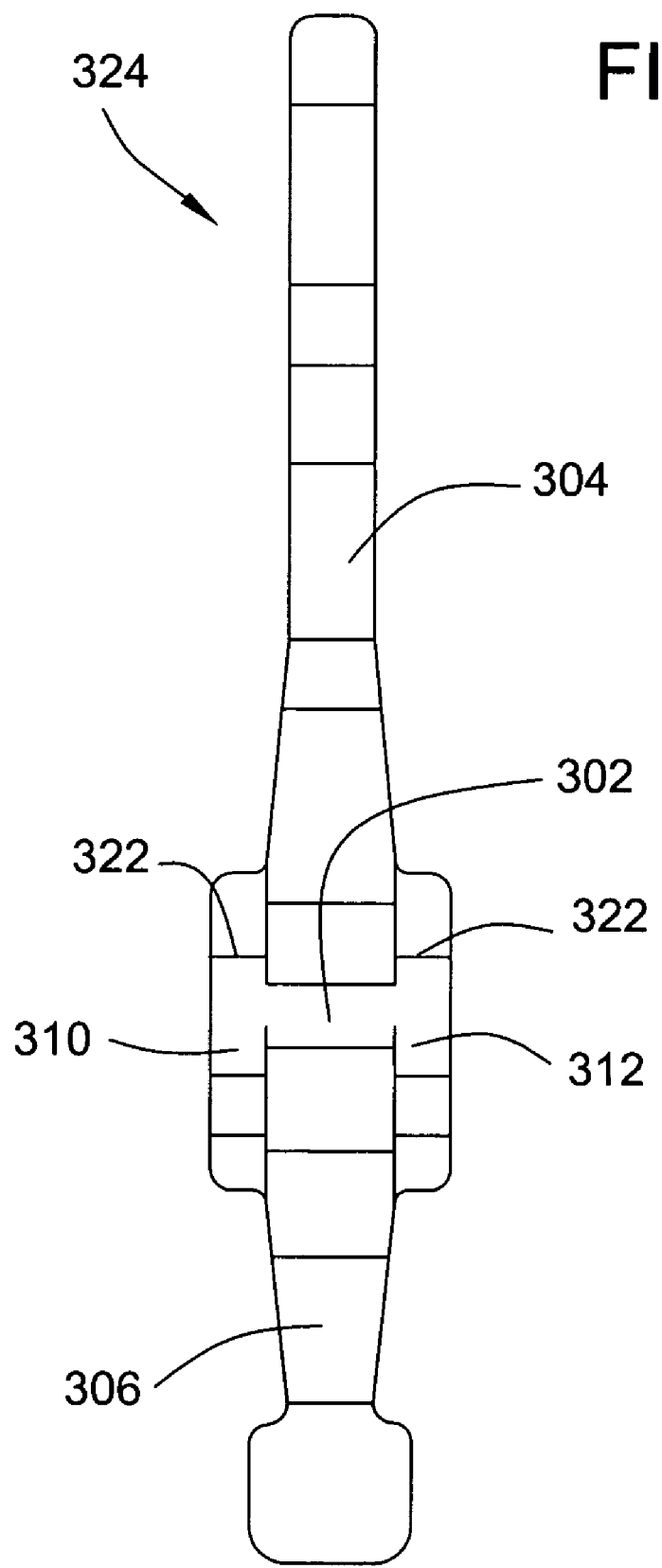
FIG. 17 is a top plan view of a blank stamped from sheet metal that is to be formed into the contact of FIG. 16.
Figure 21:
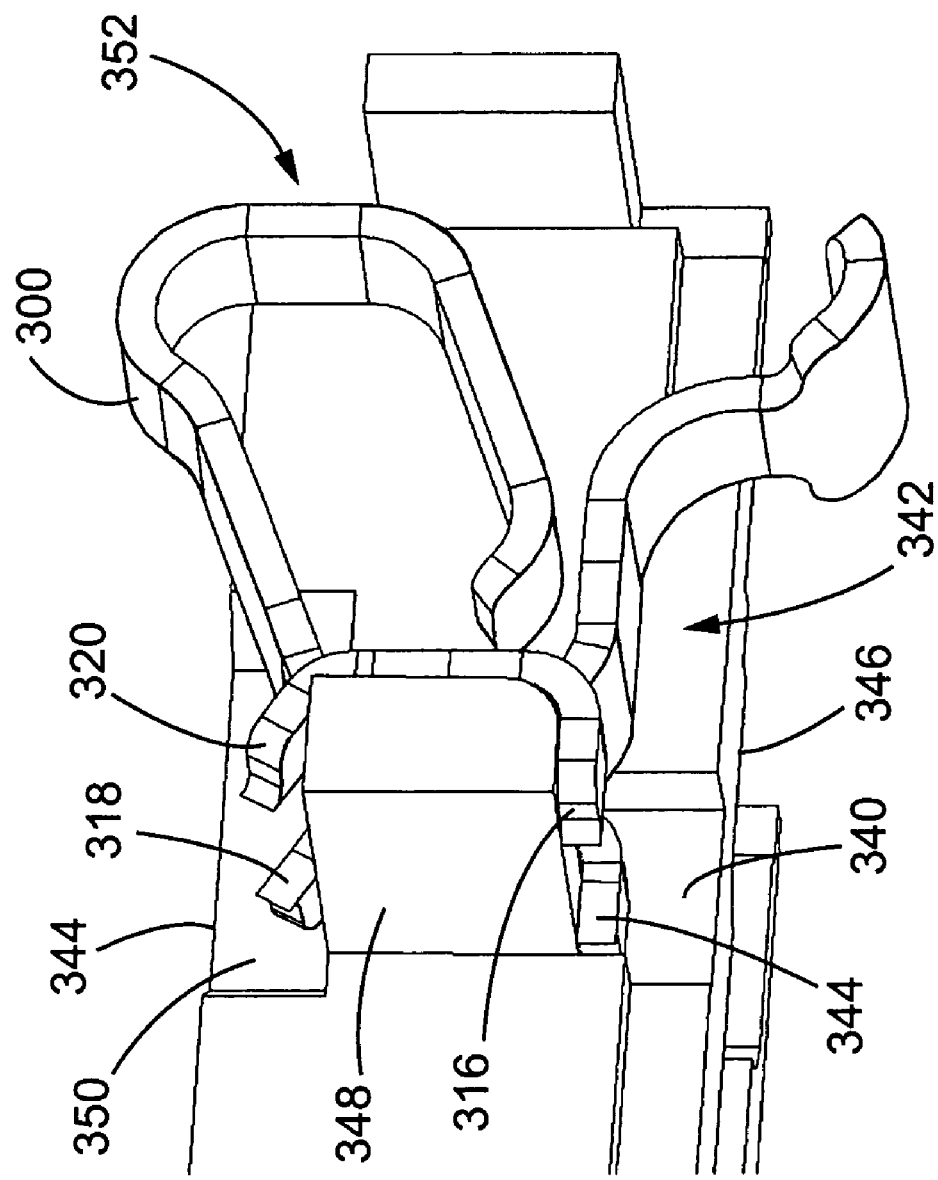
FIG. 21 is a cross-sectional perspective view taken along line 20-20 of FIG. 18 illustrating the retention wings trapping the sidewall.

To prevent the contact 340 from backing out of the aperture 342, as illustrated in FIG. 21, the upper segments 318, 320 of the retention posts can be bent over the sidewall 348. The sidewall 348 is thereby trapped between the upper segments 318, 320 and lower segments 314, 316. Furthermore, as will be appreciated from FIG. 21, by locating the upper segments 318, 320 and lower segments 314, 316 within the wider second end 350 of the aperture 342, the segments do not protrude beyond the first and second surfaces 344, 346 of the insulative housing. To bend the upper segments 318, 320, referring to FIG. 19, a tool can be inserted through the wider second end 350 of the aperture 342 to impinge upon the upper segments 318, 320. For this reason, the wider second end 350 makes up a greater portion of the overall length of the aperture 342 along the first surface 344. Additionally, as illustrated in FIG. 17, to facilitate bending of the upper segments 318, 320 the retention posts can be formed with a score or crease 322 at the appropriate locations.

An advantage of using bendable retention posts 310, 312 to retain the contact 300 within the aperture 342 is that the contact can re-position itself with respect to the aperture. Specifically, as illustrated in FIG. 21, because the upper segments 318, 320 and lower segments 314, 316 trap the sidewall 348 without permanently joining to the sidewall, the contact can float to a certain degree with respect to the aperture 342. Floating the contact, as described above, optimizes contact with the pad on the integrated circuit package and conductive trace on the substrate by enabling the contact to align itself with a pad or conductive trace.

Figure 22:
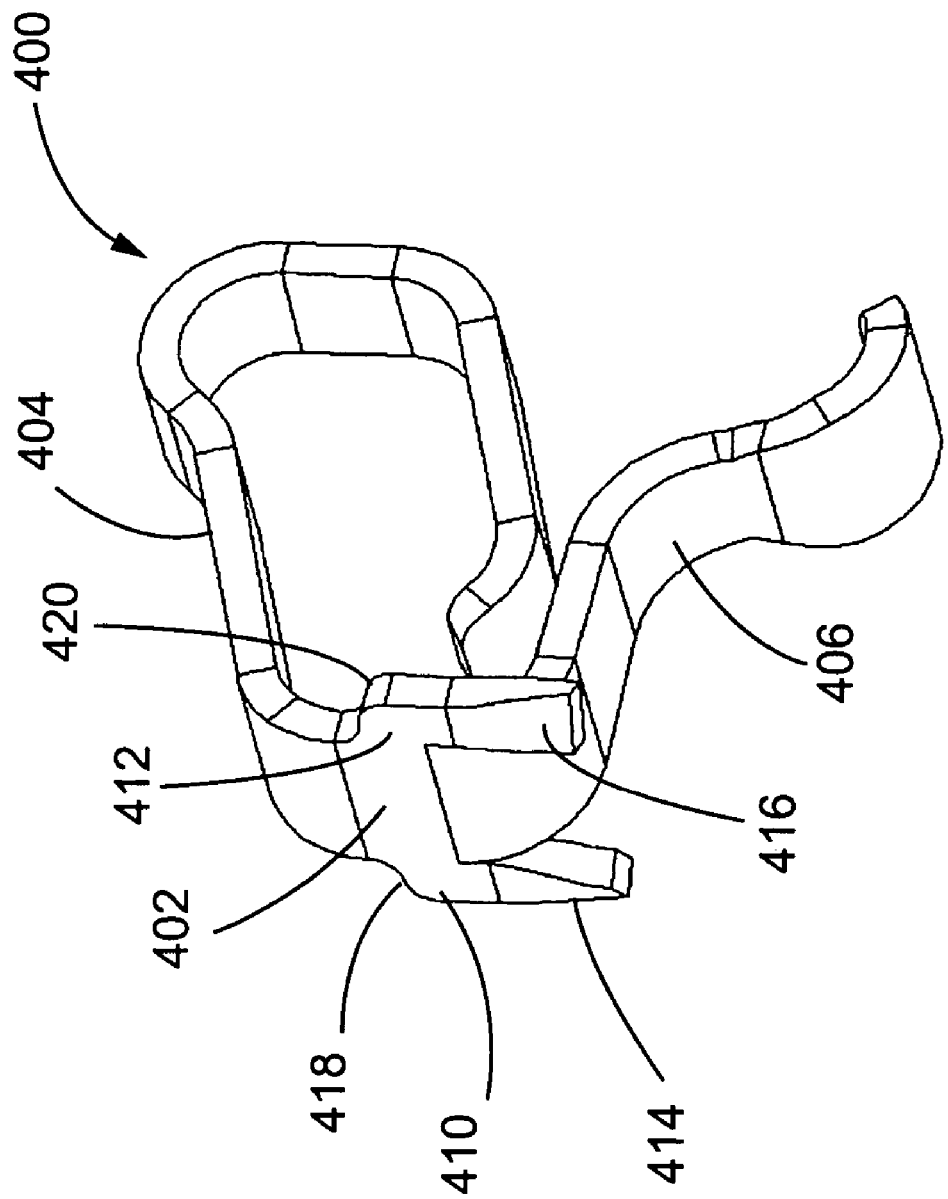
FIG. 22 is a rear perspective view of an embodiment of the contact configured with twist wings.
Figure 23:
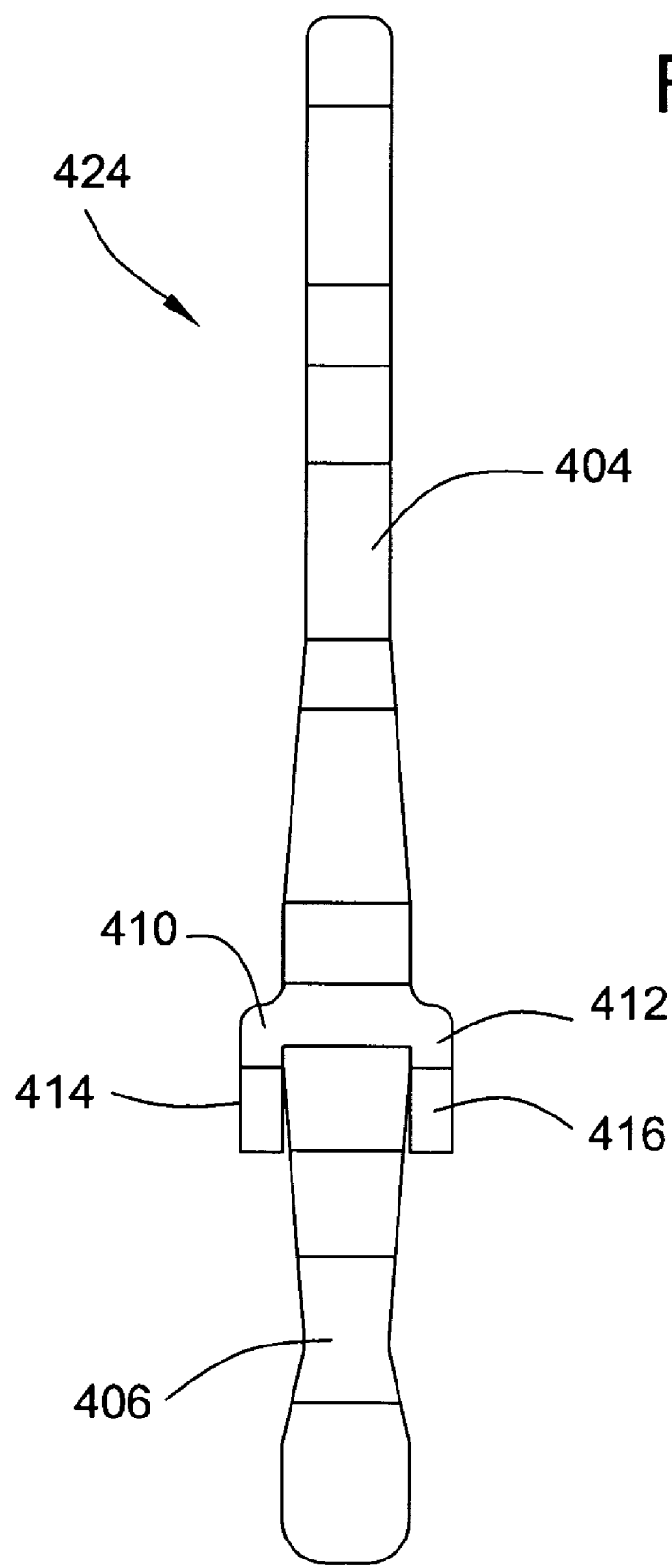
FIG. 23 is a top plan view of a blank stamped from sheet metal that is to be formed into the contact of FIG. 22.

In another embodiment, illustrated in FIG. 22, the contact 400 can include a first and second twist wings 410, 412 projecting from either side of the center portion 402. The twist wings 410, 412 each includes a lower segment 414, 416 that is twisted or turned into the plane of the center portion 402. The twist wings each also includes an upper shoulder 418, 420 that is substantially co-planer with respect to the plane of the center portion 402. Referring to FIG. 23, the twist wings 410, 412 are initially formed as integral portions of the stamped blank 424. During the forming operation that shapes the first and second spring arms 404, 406, a mechanical force is imparted to the lower segments 414, 416 to produce the twisted shaped of the formed twist wings 410, 412.

Figure 24:
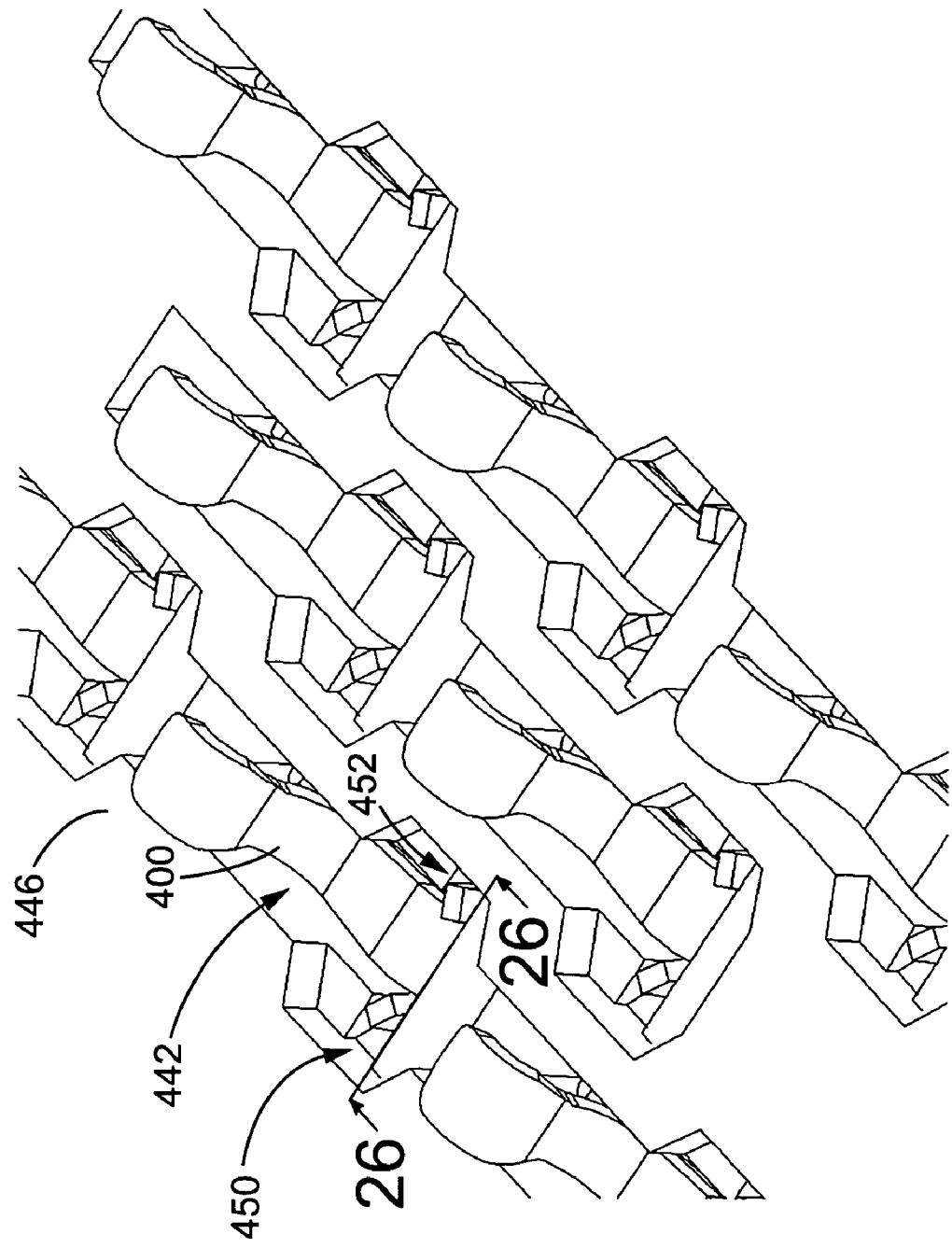
FIG. 24 is a detailed perspective view of the second surface of the insulative housing illustrating the contacts of FIG. 22 retained in the apertures.
Figure 25:
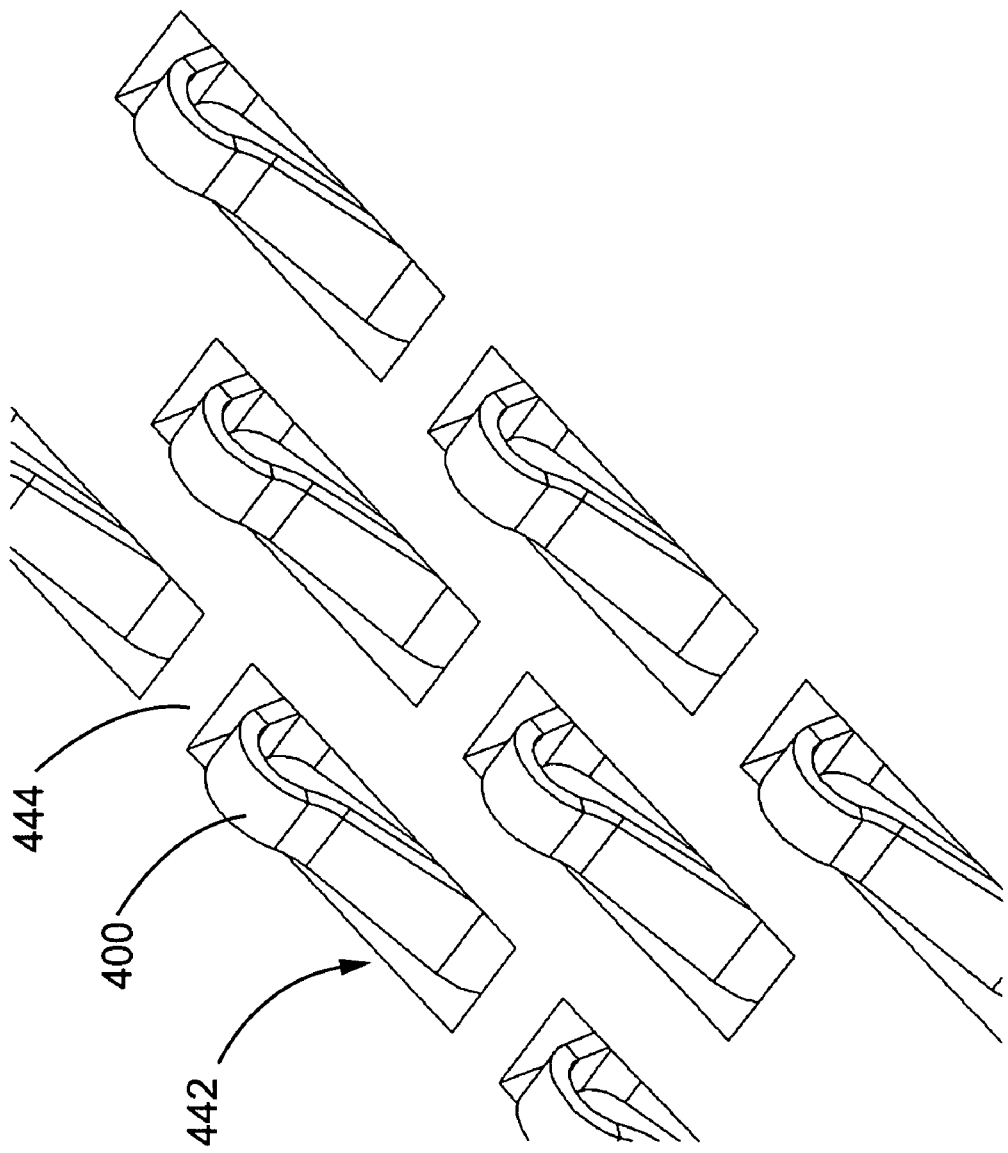
FIG. 25 is a detailed perspective view taken opposite the view illustrated in FIG. 24 illustrating the first surface of the insulative housing.
Figure 26:
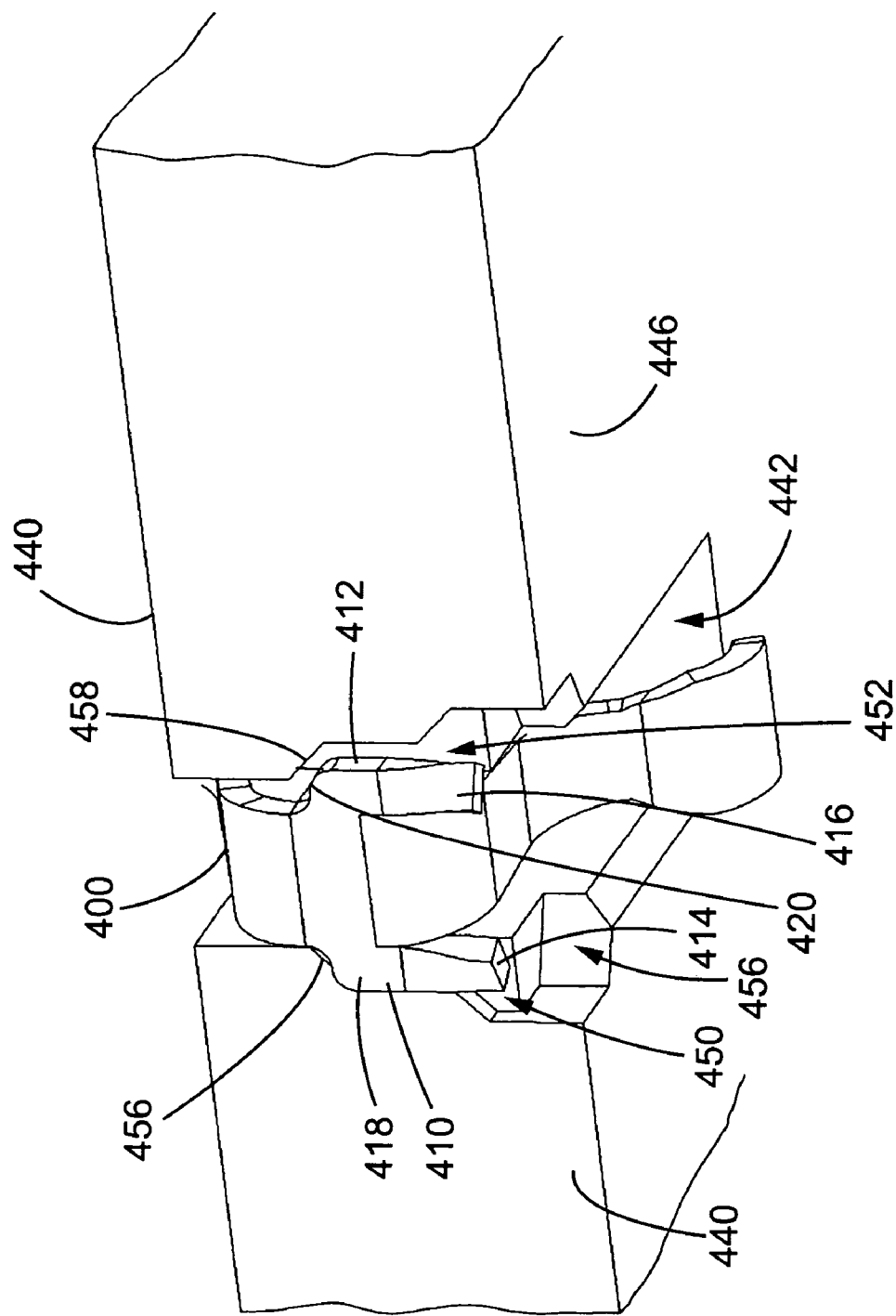
FIG. 26 is a cross-sectional perspective view taken along line 26-26 of FIG. 24 illustrating the contact being retained in the aperture.

To engage the twist wings, as illustrate in FIG. 24, the aperture 442 disposed through the housing 440 includes two slots 450, 452 formed on either side of the aperture. As will be appreciated from FIGS. 24 and 25, the slots are located at a second end 454 of the aperture 442 and extend from the second surface 446 part way towards the first surface 444. Accordingly, as illustrated in FIG. 26, the slots 450, 452 terminate at two respective ledges 456, 458. When the contact 400 is inserted into the aperture 442, the upper shoulders 418, 420 abut against the ledges 456, 458 which thereby establishes the vertical position of the contact with respect to the housing 440.

To prevent the contact 450 from backing out of the aperture 442, the size of the two slots 450, 452 is preferably such that insertion of the twisted lower segments 414, 416 produces an interference fit. Accordingly, the contact 400 is joined to the insulative housing 440 and cannot float with respect to the aperture 442. An advantage of joining the contact to the insulative housing is that the chances of the contact becoming separated are substantially reduced. Additionally, it will be appreciated that no portion of the twist wings 410, 412 protrudes beyond either the first or second surfaces 444, 446 to interfere in establishing electrical contact with a microchip or substrate. To facilitate insertion of the contact, the second end of the aperture 442 can include a depression 456 disposed into the second surface 446 that permits use of an insertion tool.

Figure 27:
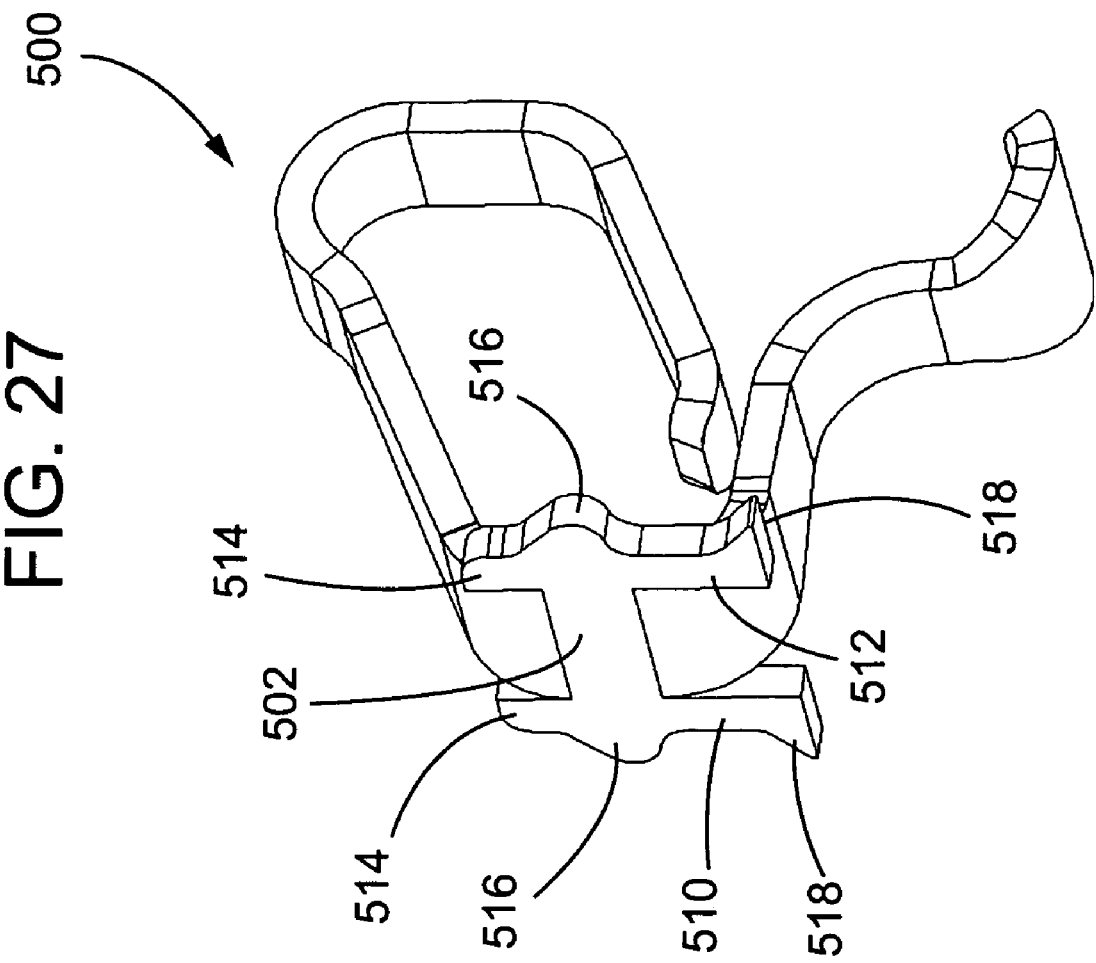
FIG. 27 is a rear perspective view of an embodiment of the contact configured with barbed wings.

In another embodiment, illustrated in FIG. 27, the contact 500 can include first and second barbed wings 510, 512 projecting from either side of the center portion 502. The first and second barbed wings 510, 512 are generally co-planer with the center portion 502 and include generally vertical post structures 514 that are attached to the center portion. Projecting from the post structure 514 opposite the side attached to the center portion are an upper barb 516 and a lower barb 518.

Figure 28:
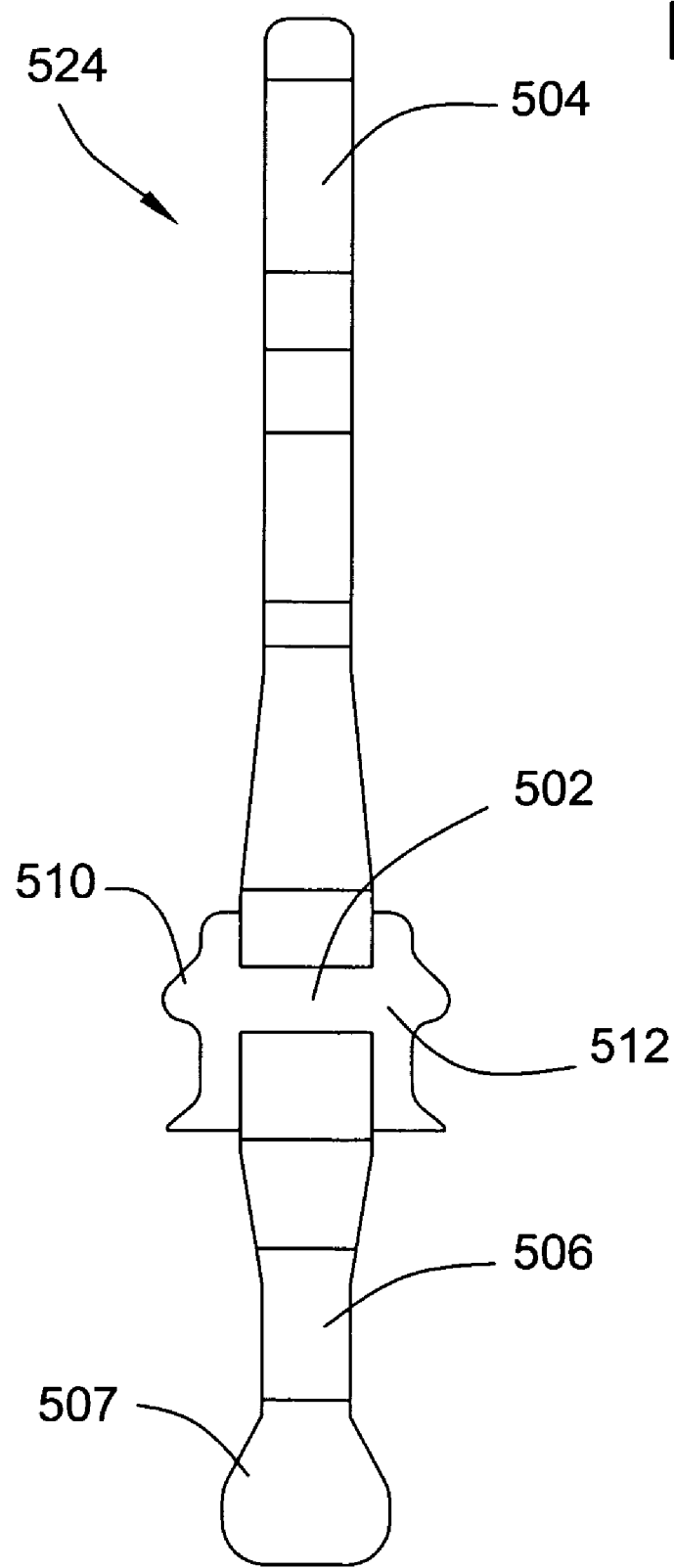
FIG. 28 is a top plan view of a blank stamped from sheet metal that is to be formed into the contact of FIG. 27.

Referring to FIG. 28, the barbed wings 510, 512 can be initially formed as integral portions of the stamped blank 524 along with the upper and lower spring arms 504, 506 and the center portion 502.

Figure 29:
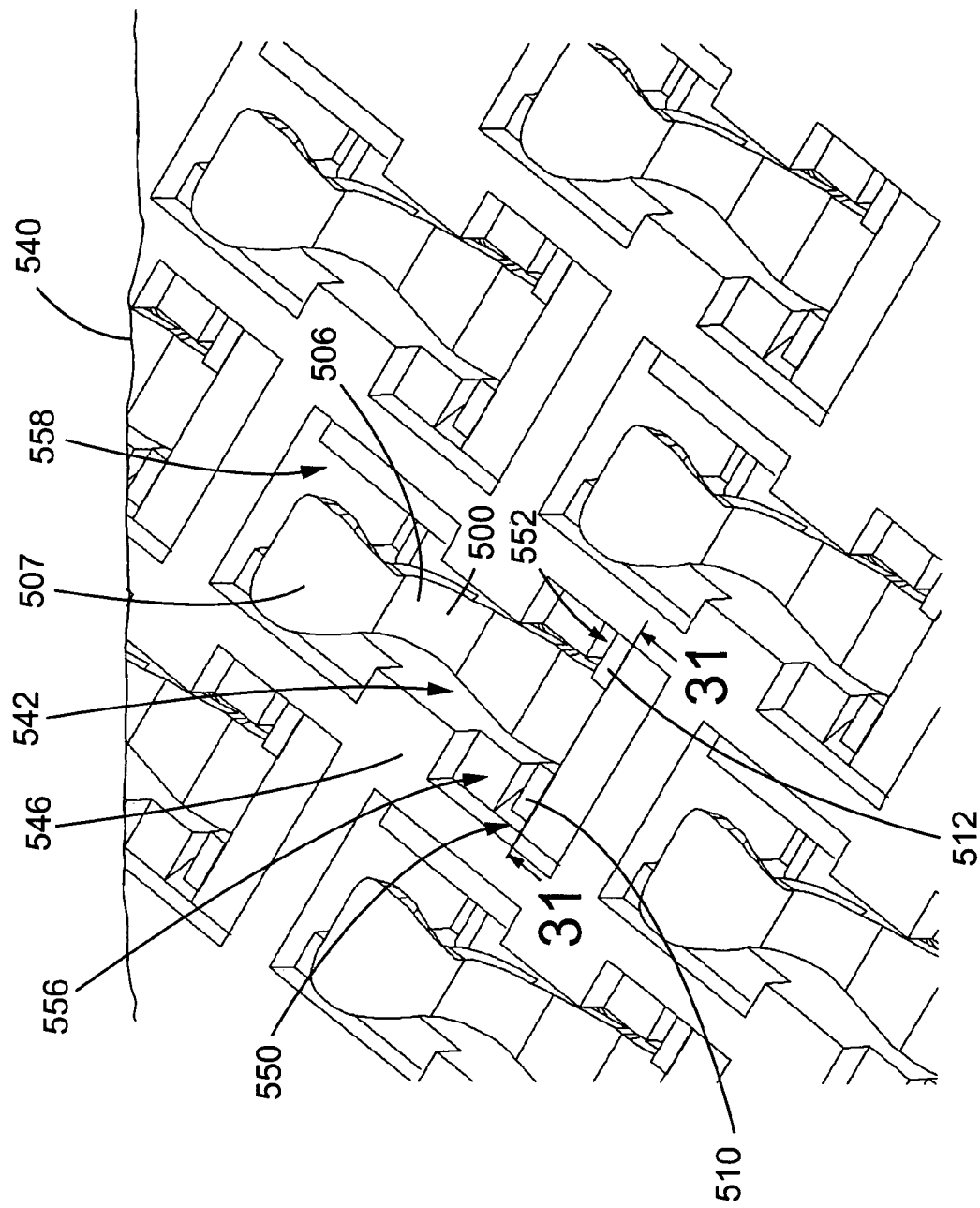
FIG. 29 is a detailed perspective view of the second surface of the insulative housing illustrating the contacts of FIG. 27 retained in the apertures.
Figure 30:
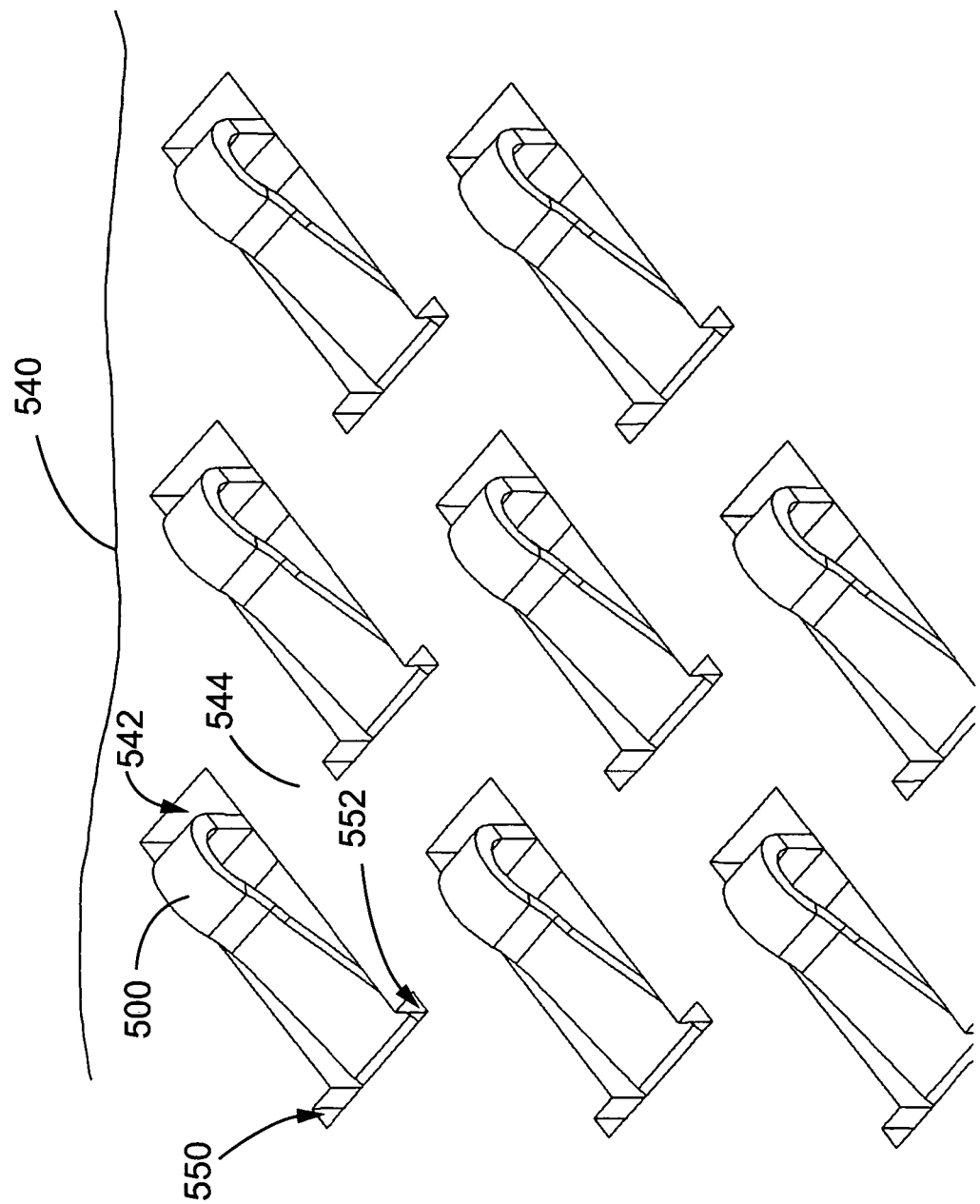
FIG. 30 is a detailed perspective view taken opposite the view illustrated in FIG. 29 illustrating the first surface of the insulative housing.
Figure 31:
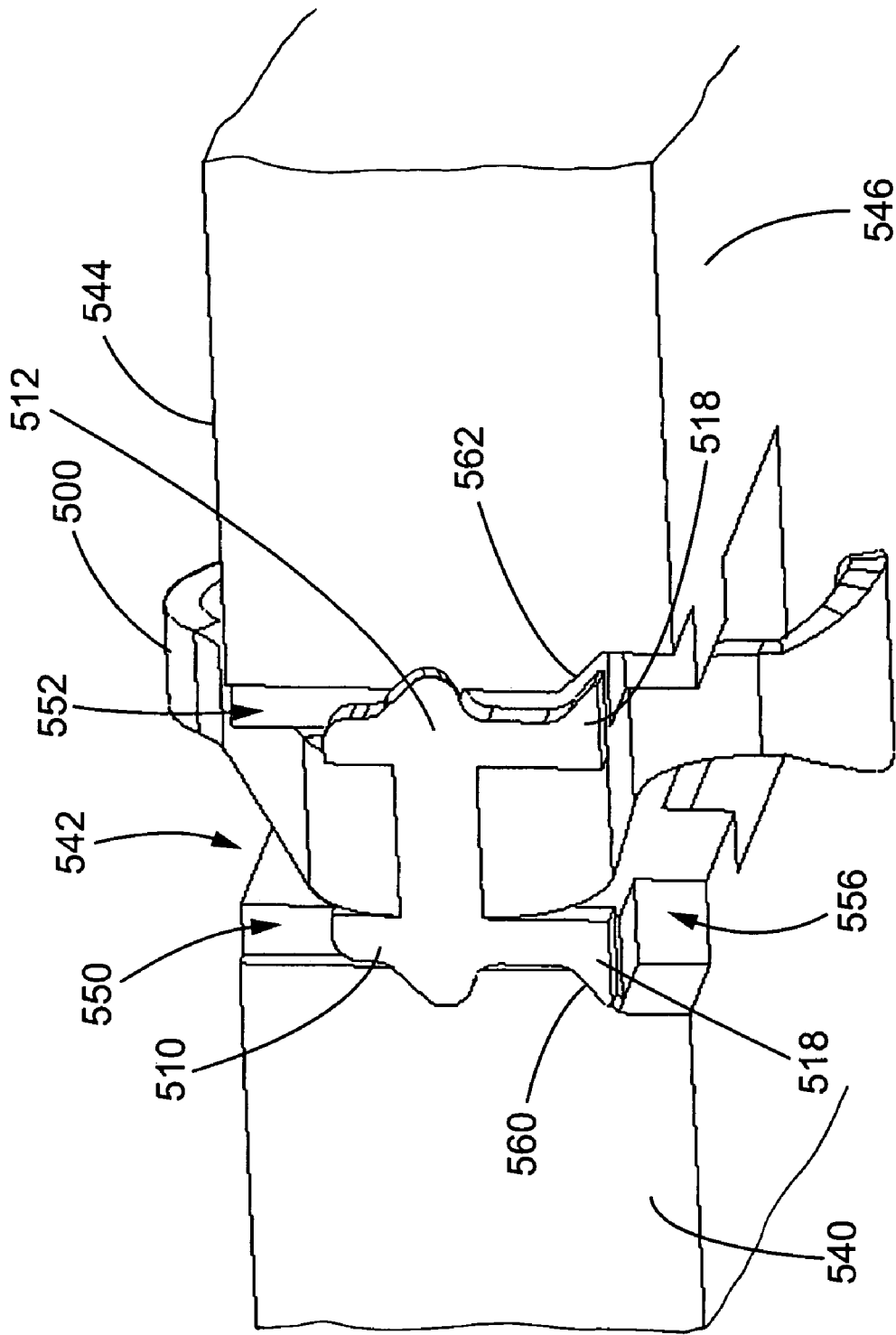
FIG. 31 is a cross-sectional perspective view taken along line 31-31 of FIG. 29 illustrating the contact being retained in the aperture.

To engage the barbed wings 510, 512, as illustrated in FIGS. 29 and 30, the aperture 542 disposed through the insulative housing 540 between the first and second surfaces 544, 546 includes two slots 550, 552 at one end. As illustrated in FIG. 31, when the contact 500 is properly inserted into the aperture 542, the barbed wings 510, 512 are received into the slots 550, 552. Preferably, the size of the slots 550, 552 is such as to create an interference fit with the projecting upper barbs 516. Accordingly, the contact is joined to the insulative housing 540 and cannot float in the aperture 552.

As illustrated in FIG. 29, a first depression 556 is formed into the second surface 546 proximate to the end of the aperture 542 in which the slots 550, 552 are formed. As illustrated in FIG. 31, the depression 556 is considerably wider than the distance between the slots 550, 552 thereby creating a pair of ledges 560, 562 where the depression and slots intersect. Accordingly, when the contact 500 is inserted into the aperture, the lower barbs 518 can abut against the ledges and thereby vertically position the contact with respect to the insulative housing 540. Additionally, it will be appreciated that, in part, because of the depression 556, no portion of the barbed wings 510, 512 protrudes beyond either the first or second surfaces 544, 546 to interfere in establishing electrical contact with a microchip or substrate.

As illustrated in FIG. 29, there is also disposed into the second surface 546 proximate to the aperture a second depression 558. The second depression 558 is located opposite the first depression 556 and provides the aperture 542 with a bar-bell shape at the second surface 546. The second depression 558 considerably widens the aperture 542 to accommodate a second land surface 507 at the end of the lower spring arm 506. Accordingly, as illustrated in FIGS. 28 and 29, the second land surface 507 can be wider than the second spring arm 506 and the center portion 502 and thereby provide more surface area over which electrical contact can be made.

Figure 32:
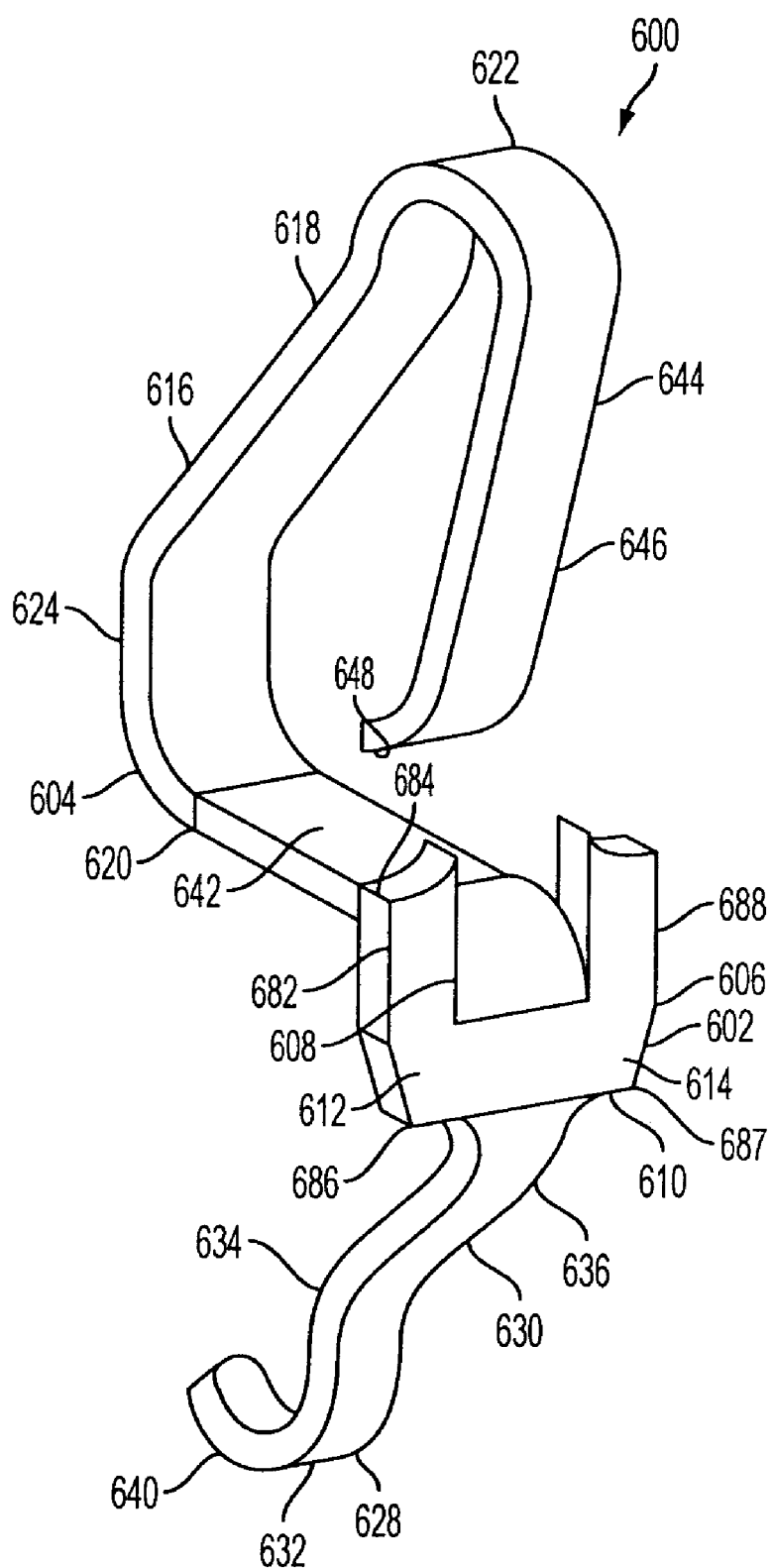
FIG. 32 is a perspective view of another embodiment with the center portion disposed in the front of the contact and the second spring arm extending to the rear.

In another embodiment, illustrated in FIG. 32, the contact 600 includes a center portion 606, a first spring arm 616, a second spring arm 628, and a bellows leg 644 similar to those of the above described embodiments, but the contact 600 is configured differently. The center portion 606 is disposed towards the front 602 of the contact 600, but the first spring arm 616 and the second spring arm 628 still extend from the upper end 608 and lower end 610, respectively, of the center portion 606. Notably different in this embodiment is that the second spring arm 628 is disposed towards the rear 604 of the contact 600, instead of towards the front 602 as in earlier described embodiments.

As shown in FIG. 32, the first spring arm 616 of the contact 600 includes a first portion 618 and terminates in a curved first land surface 622 as in earlier described embodiments. However, the contact 600 also includes a second portion 620 joined to the first portion 618 by a collapsible bend 624. The second portion 620 of the contact 600 is attached to the center portion 606 in a cantilevered fashion such that the first spring arm 616 can deflect with respect to the center portion 606. The spring arm 616 extends in a slightly upward direction from the upper end 608 of the center portion 606, but the first portion 618 of the spring arm 616 extends more dramatically upward from the collapsible bend 624.

Figure 33:
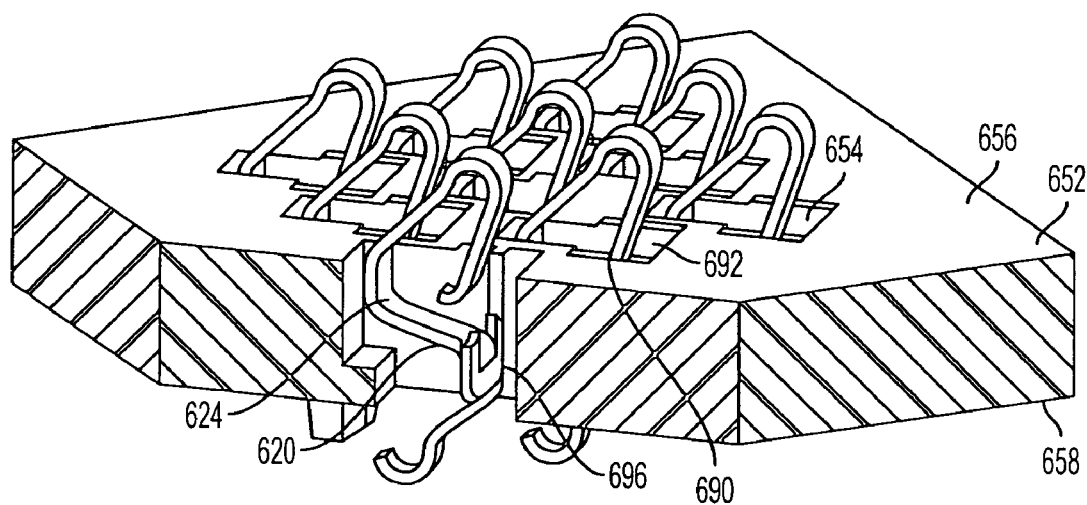
FIG. 33 is a cross sectional view of an insulative housing with the contact from FIG. 32 disposed within the insulative housing.
Figure 34:
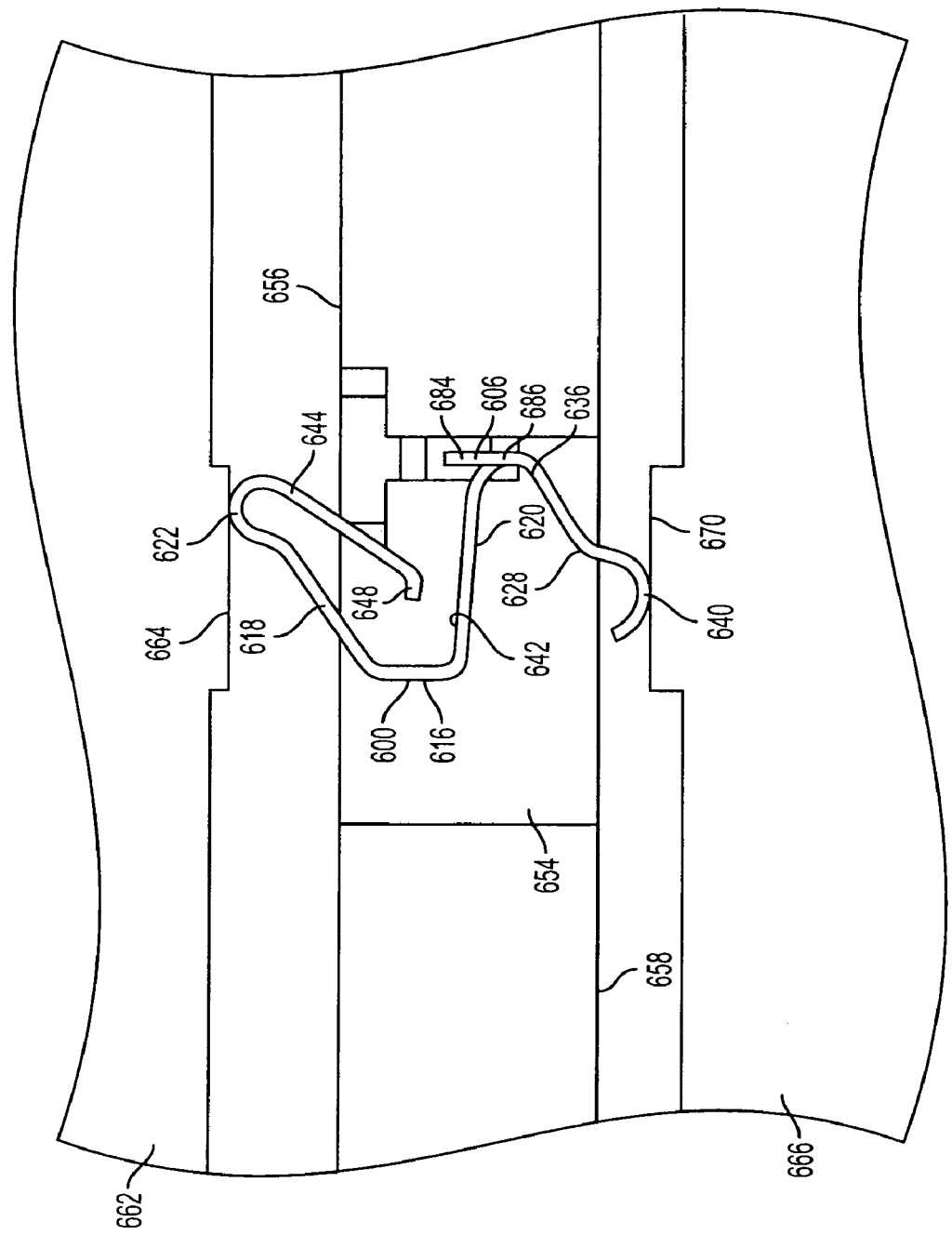
FIG. 34 is a cross sectional view of the contact shown in FIG. 33 illustrating the contact retained in the aperture of the insulative housing.

As a result of the substantial angle between the collapsible bend 624 and the first portion 618 and the addition of the second portion 620 upwardly angled from the center portion 606, the first land surface 622 is more vertically displaced above the center portion 606 when the contact 606 is undeflected, as shown in FIG. 34, than in the embodiment illustrated in FIG. 4. As shown in FIGS. 33 and 34, when the contact 600 is correctly placed in the aperture 654, the first land surface 622 projects further above the first surface 656 of the housing 652 than in the embodiment depicted in FIG. 5.

Figure 35:
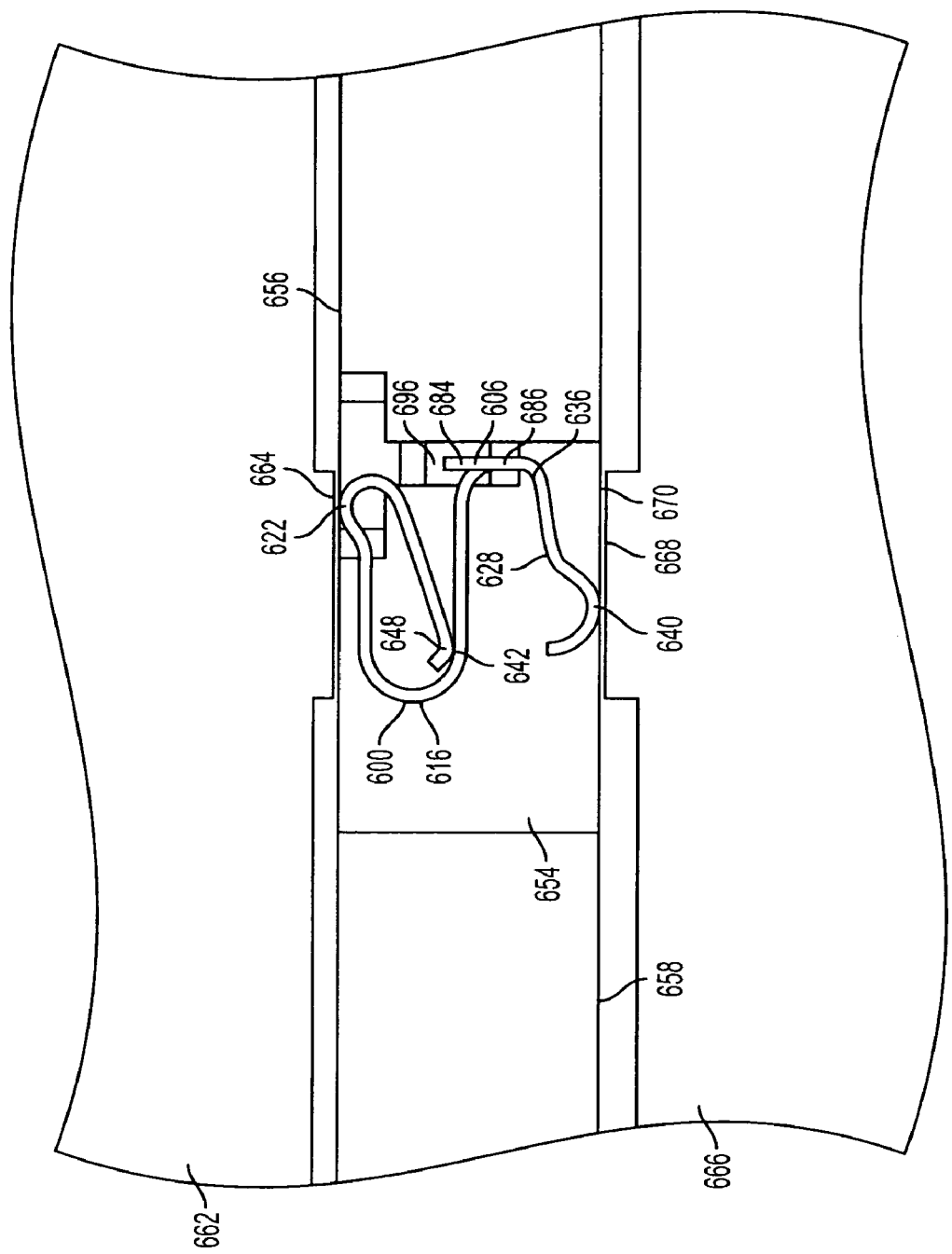
FIG. 35 is a cross sectional view of the contact shown in FIG. 33 illustrating the contact retained in the aperture of the insulative housing and deflected between an integrated circuit package and a substrate.

Referring to FIG. 35, as the integrated circuit packaged 662 is pressed or secured to the first surface 656 of the insulative housing 652, the contact pad 664 causes the first spring arm 616 to deflect downward with respect to the center portion 606. Thus, the first spring arm 616 may be deflected partially or wholly into the aperture 654. Because of the cantilevered nature of the second portion 620 of the first spring arm 616, the spring-like quality of the collapsible bend 624, and the resiliency of the material composing the contact 600, the deflected first spring arm 616 exerts an upward contact force against the pad 664 ensuring an adequate electrical connection.

As shown in FIG. 35, the contact pad 664 tangentially contacts the curved first land surface 622, thereby concentrating the contact force produced by the cantilevered first spring arm 616. Additionally, because of the curved shape of the first land surface 622, there is less of a tendency for the first land surface 622 to pierce or penetrate the contact pad 664. Furthermore, the first land surface 622 and the first spring arm 616 can be formed with substantially the same width as the center portion 616. Thus, in such embodiments, the width of the first land surface 622 provides a sufficient dimension for the contact pad 664 to contact.

Returning to FIG. 32, extending generally downwards from the first land surface 622 is a bellows leg 644. In the illustrated embodiment, the bellows leg 644 includes a linear portion 646 that extends generally perpendicular to the second portion 620 of the first spring arm 616, as shown in FIG. 34. In the illustrated embodiment, the angle between the bellows leg 644 and the first portion 618 of the spring arm 616 is generally less than 45 degrees so that the bellows leg 644 extends downward away from the first land surface 622 generally towards the collapsible bend 624. The bellows leg 644 terminates in a first contact surface 648 that curves slightly upwards toward the first portion 618 of the first spring arm 616. The first contact surface 648 is disposed above the center portion 606 but can be disposed above or below the collapsible bend 624. As illustrated in FIG. 32, the first contact surface 648 and the bellows leg 644 can be formed with the same width as the center portion 606 and the first spring arm 616.

Referring to FIG. 32 extending from the lower end 610 of the center portion 606 is the second spring arm 628, which terminates in a second land surface 640. The second spring arm 628 extends downward from the center portion 606 in a direction from the front 602 to the rear 604. The second spring arm 628 includes a first portion 630 attached to the lower end 610 of the center portion 606 in a cantilevered fashion via a collapsible zone 636. The first portion 630 is also attached to a second portion 632 by a curve 634 that directs the second portion 632 generally downwards. As such, in the illustrated embodiment, both the curve 634 and the second land surface 640 are below the lower end 610. Because the angle between the second spring arm 628 and the center portion 606 is more severe than in the embodiment depicted in FIG. 4, the second land surface 640 is more vertically displaced below the center portion 606, as shown in FIG. 34. Therefore, when the electrical contact 600 is correctly placed in the aperture 654, the second land surface 640 projects further beyond the second surface 658 of the insulative housing 652. Furthermore, because of the cantilevered fashion in which the second spring arm 628 is attached to the center portion 606, the second spring arm 628 can deflect with respect to the center portion 606.

Referring to FIG. 35, as the substrate 666 is pressed or clamped to the second surface 658 of the insulative housing 652, the electrical trace 668 causes the second spring arm 628 to deflect upwards with respect to the center portion 606. In fact, the second spring arm 628 may be deflected partially or wholly into the aperture 654. Because of the cantilevered mounting of the second spring arm 628 and the resiliency of the material composing the contact 600, the deflected second spring arm 628 exerts a downward contact force against the electrical trace 668 ensuring an adequate electrical connection.

To optimize contact between the electrical trace 668 and the second land surface 640, the second land surface 640 is shaped to curve slightly upwards. As will be appreciated, the electrical trace 668 tangentially contacts the apex of the curved second land surface 640, thereby concentrating the contact force produced by the second spring arm 628. Additionally, because of the smooth, curved shape of the second land surface 640, there is less of a tendency for the second land surface 640 to pierce or penetrate the electrical trace 668. Furthermore, the second land surface 640 can be formed with a width similar to the width of the first spring arm 616 and second spring arm 628, as shown in FIG. 32. The width of the second land surface 640 provides a sufficient dimension with which the electrical trace 668 may make contact, as shown in FIG. 34. It will be appreciated that the second land surface 640 can be formed with a variety of widths, including widths greater than the width of the center portion 606.

Referring to FIG. 32, the second portion 620 of the first spring arm 616 can function as a second contact surface 642 that is located between the center portion 606 and the collapsible bend 624. Preferably, the second contact surface 642 is located approximately below the first contact surface 648 so that the two contact surfaces 648, 642 appear, as illustrated in FIGS. 32 and 34, as apposing surfaces. In the embodiment illustrated in FIGS. 32 and 34, the first and second contact surfaces 648, 642 are separated by a gap. An advantage of providing the gap is that the first and second contact surfaces 648, 642 can be easily plated during production of the contact 600.

Figure 36:
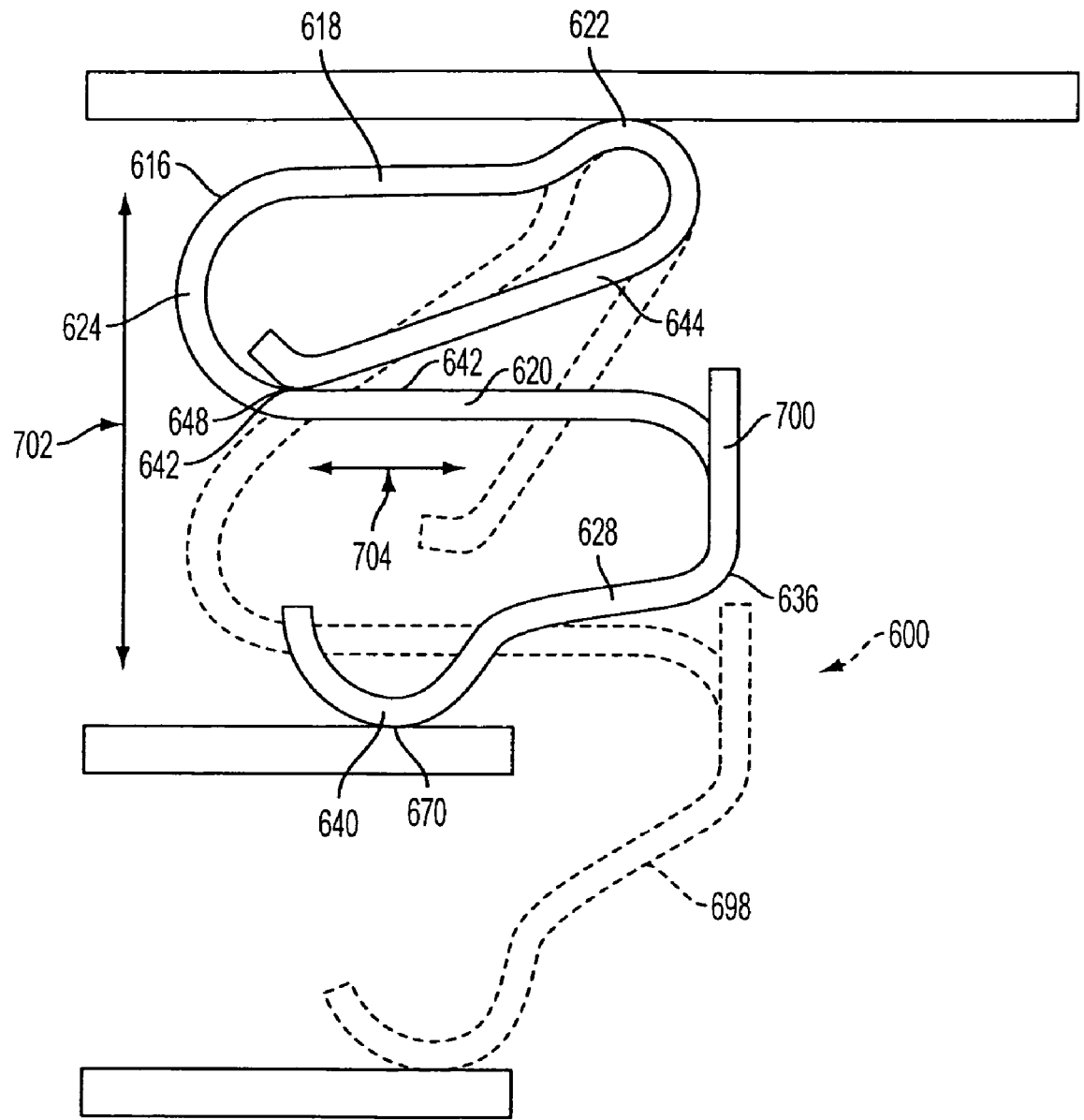
FIG. 36 is a side view illustrating the forces exerted during deflection of the embodiment of FIG. 32.

Referring to FIGS. 35 and 36, when the first spring arm 616 is deflected towards the aperture 654 by the integrated circuit package 662, the first spring arm 616 collapses upon itself such that the first contact surface 648 is pressed against the second contact surface 642, thereby eliminating the gap. This results in shortening the path electric current must travel through the contact 600. Since the contact between the bellows leg 644 and the spring arm 616 occurs tangentially along the apex of the curved first contact surface 648 and the second contact surface 642, abrasion and the likelihood of damaging or fusing together of the first and second contact surfaces 648, 642 is reduced. When the forces causing the spring arms 616, 628 to deflect are removed, the resiliency of the contact material can cause the contact surfaces 648, 642 to separate recreating the gap illustrated in FIGS. 32 and 33. Furthermore, where the widths of the bellows leg 644 and the first spring arm 616 are similar to or the same as the center portion 606, the contact surfaces 648, 642 will have an adequate dimension across which contact can occur.

Referring to FIGS. 35 and 36, when the second spring arm 628 is deflected towards the first spring arm 616, there may remain at all times a gap between the first spring arm 616 and the second spring arm 628. The collapsible zone 636 of the second spring arm 628 comprises a neck which is narrower in width than the center portion 606 and the remainder of the second spring arm 628, as shown in FIG. 32. Accordingly, the majority of strain is concentrated in the collapsible zone 636 when the second spring arm 628 is deflected, as shown in FIGS. 35 and 36. Because the strain in the second spring arm 628 is concentrated in the collapsible zone 636 during deflection, less stress/strain is concentrated at the solder joints 670 between the land surfaces 622, 640 and the traces 668 and the pads 664, thereby making the contact 600 more resistant to fatigue induced by cyclical loading.

Referring to FIGS. 35 and 36, to allow the first and second portions 618, 620 of the first spring arm 616 to be further deflected toward each other after the initial contact between the first and second contact surfaces 648, 642, the first spring arm 616 and the bellows leg 644 can be configured to allow the first contact surface 648 to slide along the second portion 620 of the spring arm 616. More specifically, the resilient nature of the contact material allows the bellows leg 644 to bend towards the first spring arm 616 at the first land surface 622. Therefore, after the initial contact, the first contact surface 648 can slide along the second portion 620 of the spring arm 616 as the bellows leg 644 is displaced toward the first spring arm 616. Accordingly, the first contact surface 648 is directed towards the collapsible bend 624 as the bellows leg 644 slides. An advantage of enabling sliding motion of the first contact surface 648 along the second portion 632 of the spring arm 616 is that it provides for a greater range of deflection between the first spring arm 616 and bellows leg 648. Another advantage of enabling sliding motion of the second contact surface 642 with respect to the first contact surface 648 is that the contact surfaces 648, 642 can be wiped clean of any built-up debris that could hinder electrical communication across the contact surfaces 648, 642. When the forces causing deflection of the spring arm 616 and bellows leg 644 are removed, the first contact surface 648 can slide back along the second contact surface 642 thereby causing the first spring arm 616 and bellows leg 644 to recover their initial un-deflected shape.

Another advantage of the inventive contact 600 is demonstrated by reference to FIG. 36, which illustrates the contact 600 in both its initial un-deflected shape 698 and deflected shape 700. In one embodiment, the direction of the sliding motion between the second contact surface 642 and the bellows leg 644 is substantially normal to the plane in which the first spring arm 616 and the bellows leg 644 deflect. This preferred configuration enhances the contact's ability to recover its initial un-deflected shape 698 when the forces deflecting the first and second spring arms 616, 628 are removed. During the initial deflection, the deflecting forces must exceed the upwards and downwards resiliency forces generated by the spring arm 616 and bellows leg 644. The vectors representing the deflecting forces and the resiliency forces are oriented in a vertical plane as indicated by the arrow 702.

As the first and second contact surfaces 648, 642 contact and slide along each other, a frictional force is generated that the deflecting forces must additionally overcome. The force vectors for the frictional forces, however, are substantially oriented in a horizontal plane as indicated by arrow 704, and are therefore normal to the deflecting forces. Accordingly, the frictional forces do not substantially oppose the vertical deflecting forces. When the deflecting forces are removed and the resiliency forces displace the first spring arm 616 and bellows leg 644 to their initial positions, the frictional forces will attempt to resist the sliding motion of the first contact surface 648 along the second portion 620 of the spring arm 616. Again though, because the frictional resistance forces are normal to the resiliency forces, they will not substantially affect recovery of the contact.

Figure 37:
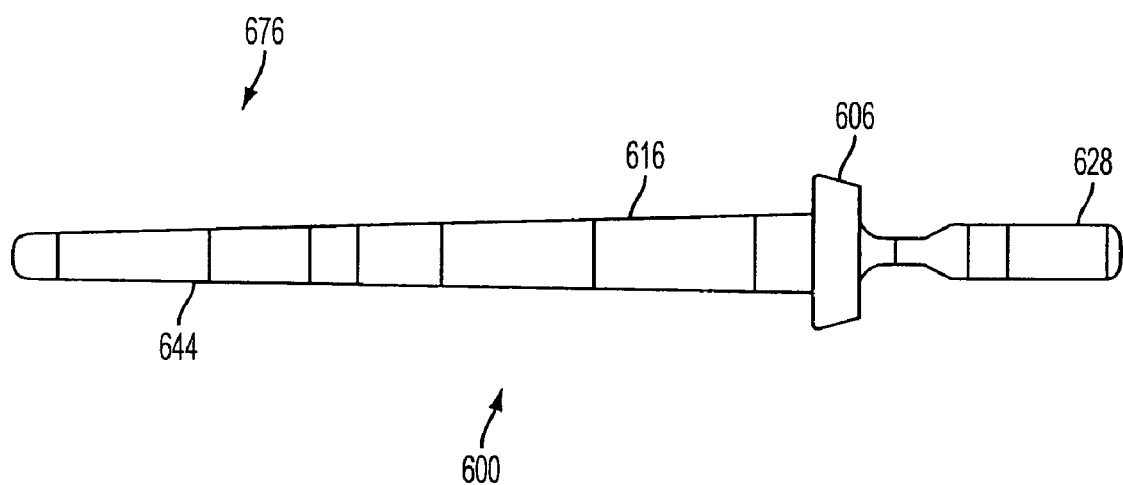
FIG. 37 is a top plan view of a blank stamped from sheet metal that is to be formed into the contact of FIG. 32.

The electrical contact 600 can also be manufactured from any suitable conductive material that possesses the desirable resilient properties. The contact 600 may be manufactured from metallic sheet material ranging between, for example, 0.0015-0.0030 inches in thickness. For example, as illustrated in FIG. 37, a planer blank 676 can be stamped from the sheet material that includes, in a flattened out arrangement, all the features of the contact 600 including the center portion 606, spring arms 616, 628, and the bellows leg 644. Accordingly, stamping the blank 676 predetermines the width of those features. The planar blank 676 can then be processed through a series of forming operations to form the shaped contact 600 illustrated in FIG. 32. The forming operations impart the curved shapes of the spring arms 616, 628 and bellows leg 644 by permanently cold-working the sheet material. The use of sheet material provides for some influence over the resilient properties through appropriate selection of the thickness of the chosen sheet material. The sheet material and the formed dimensions may be such as to allow the spring arms 616, 628 of the electrical contact 600 to be deflected toward each other and recover over numerous cycles.

The embodiment depicted in FIG. 32 also includes retention members or wings, 682, 688 that engage the insulative housing 652 to retain the contact in the aperture 654. For example, a first retention member 682 can be configured as a retention wing 682 projecting from the first side 612 of the center portion 606 that extends between an upper shoulder 684 and a lower shoulder 686 and that is vertically coplanar to the center portion 606. A second retention wing 688 can project from the second side 614 of the center portion 606, as shown in FIG. 32.

As illustrated in FIGS. 33 and 34, the retention wings 682, 688 can be received by vertical slots 690, 692 formed on either side of the aperture 654 that considerably widen the aperture 654 at one end. The slots 690, 692 are disposed from the first surface 656 part way towards the second surface 658 and terminate at two respective ledges 694, 696. When the contact 600 is inserted into the aperture 654, the lower shoulders 686, 687 of the retention wings 682, 688 abut against the ledges 694, 696. The dimension of the slots 690, 692 from the first surface 656 to the ledges 694, 696 functions to vertically position the contact 600 within the insulative housing 652. Referring to FIG. 33, the contact 600 is inserted into the aperture 654 via the opening defined by the first surface 656.

Referring to FIGS. 33 and 34, the length of slots 690, 692 between the ledges 694, 696 and the member used to retain the contact 600 in the aperture 654 may be slightly larger than the length of the retention wings 682, 688 between the upper shoulders 684, 685 and the respective lower shoulders 686, 687. Also, the size of the slots 690, 692 may be larger than the thickness of the sheet metal forming the retention wings 682, 688. This further ensures the contact 600 is floatingly retained within the aperture 654, thereby possessing all the advantages that flow therefrom as described above.

Another advantage in the embodiment depicted in FIG. 34 is engendered by nature of the fact that the first and second spring arms 616, 628 of the contact 600 project further beyond the respective first and second surfaces 656, 658 than the earlier described embodiments. Because the spring arms 616, 628 extend further vertically from the center portion 606 than is necessary to make contact with the circuit package 662 and substrate 666, the contact 600 is better able to compensate for non-planar characteristics of the circuit package 662 and/or substrate 666. The substrate 666 is not a perfectly flat surface and will always include peaks and valleys, which preferably should be compensated for. The taller spring arms 616, 628 of the contact 600 ensure that the land surfaces 622, 640 of the spring arms 616, 628 will contact the circuit package 104 and the substrate 666 in the valleys, as well as the peaks. The deflectable nature of the spring arms 616, 628 further ensures that when the land surfaces 622, 640 contact the peaks on a circuit package or substrate, the spring arms 616, 628 will simply deflect further inside the aperture 654 instead of preventing a closer fit between the connector 650 and the circuit package 662 or substrate 666. Accordingly, overcompensation in the length of the spring arms 616, 628 ensures that essentially all of the spring arms 616, 628 will be deflected to some extent, but it also ensures that the land surfaces 622, 640 of each spring arm 616, 628 will make contact with a respective pad or trace 664, 668.

Figure 38:
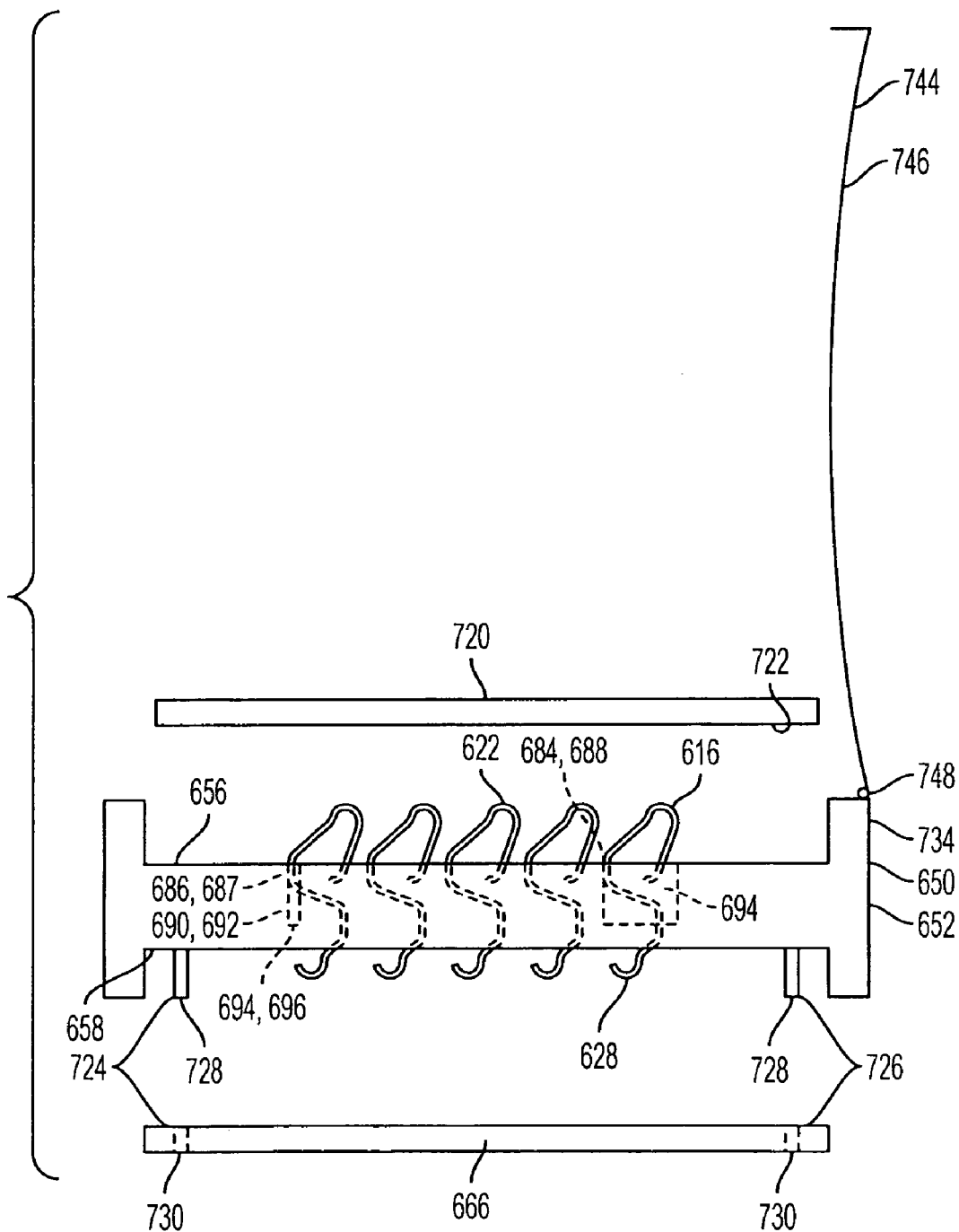
FIG. 38 is a side view of an electrical connector, a substrate, and a biasing plate before being assembled.
Figure 39:
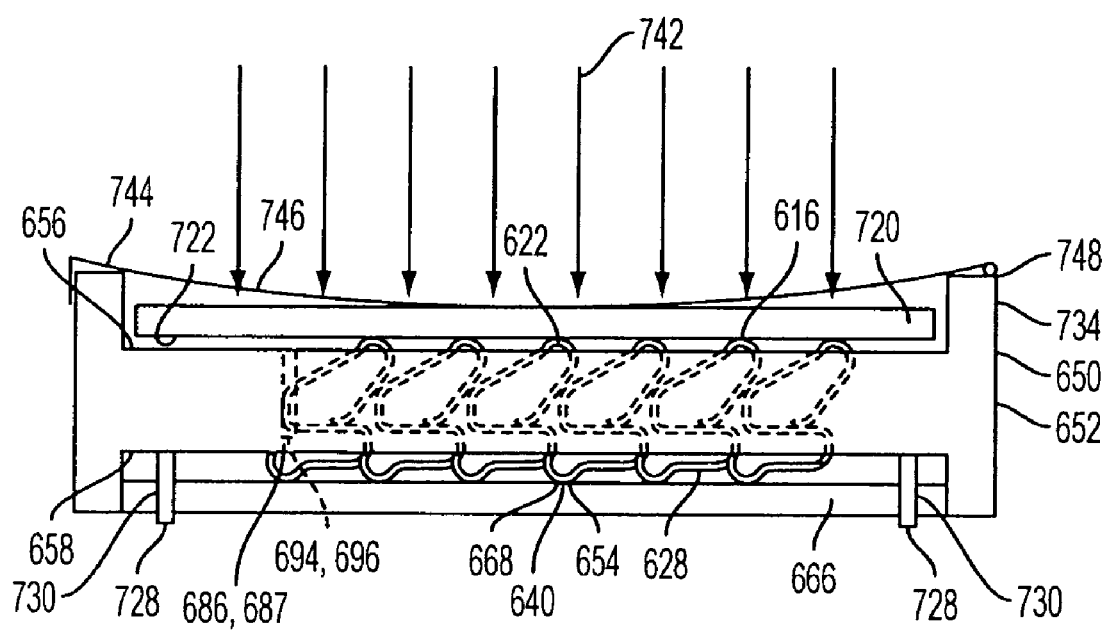
FIG. 39 is a side view of the electrical contact being pressed down as the biasing plate is applied upon the connector.
Figure 40:
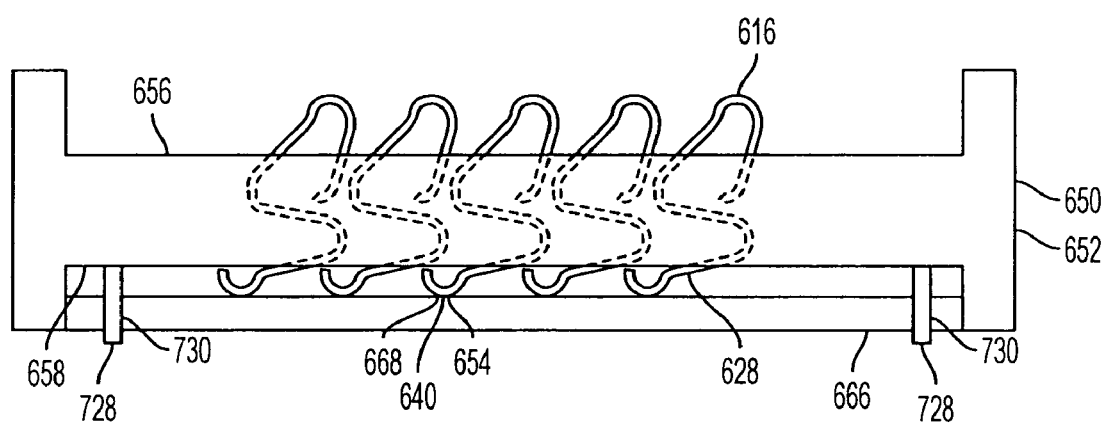
FIG. 40 is a side view similar to FIG. 38, after the electrical contacts are soldered to the circuit board and the biasing plate has been removed.

In order to further ensure that the non-planar nature of the circuit packages 662 and substrates 666 are compensated for, the electrical connector 650 may be joined to a substrate 666 or circuit package 662 in the manner depicted by the sequence of FIGS. 38-40. Referring to FIGS. 33 and 34, because the contact 600 is floatingly retained in the aperture 654, the contact 600 may shift up or down within the vertical slots 690, 692 of the aperture 654. Accordingly, the distance the second spring 628 arm extends beyond the second surface 658 of the insulative housing 652 can vary depending upon where each individual contact 600 is positioned within its respective vertical slot 690, 692. In order that the full advantage of the taller spring arms 628 in regards to compensating for the non-planar nature of the substrate 666 be realized, it is preferable that the spring arms 628 extend as far as possible beyond the second surface 658 and that the spring arms 628 extend a substantially uniform distance. By orienting the contacts 600 within the lowest position of their respective vertical slots 690, 692, wherein the lower shoulders 686, 687 of the retention wings 682, 686 abut the ledges 694, 696 of the slots 690, 692, such a condition can be achieved.

Referring to FIGS. 38 and 39, when fitting the second surface 658 of the electrical connector 650 to a substrate 666, a biasing plate 720 may be used to bias the electrical contacts 600 into the lowest position within their vertical slots 690, 692. As shown in FIG. 39, the biasing plate 720 may be pressed down upon the first surface 656 of the insulative housing 652 such that it deflects the first spring arms 616 down into their respective apertures 654 while also forcing the contacts 600 down into the vertical slots 690, 692 until substantially all of the lower shoulders 686, 687 of the retention wings 684, 688 abut their respective ledges 694, 696. Accordingly, the second spring arms 628 then project beyond the second surface 658 of the insulative housing 652 to the maximum extent possible with correct use of the contact 600 in the housing 652.

The first step in utilizing the biasing plate 720 to ensure optimum contact-to-trace interaction between the connector 650 and substrate 666 is to mount the housing 652 to the substrate 666. Referring to FIGS. 38 and 39, in order to facilitate such mounting, the insulative housing 652 may include a mounting member 724 for securing the housing 652 to a substrate 666 along the housing's second surface 658. In the embodiment depicted in FIG. 39, the means 724 of securing the housing to the substrate is press fit socket hold downs 726. The housing 652 includes a plurality of socket hold downs 728 that protrude normal from the second surface 658 proximate the outer edge of the surface 658, as shown in FIG. 39. The substrate 666 is provided with corresponding sockets 730 configured to receive the socket hold downs 728 and retain them therein via a friction fit. Suitable press fit socket hold down arrangements 726, including socket hold downs 728 and receiving sockets 730, are, for example, those described in U.S. Pat. No. 5,485,351, which is herein incorporated by reference. Once the housing 652 is positioned over the substrate 666 such that the socket hold downs 728 and sockets 730 align, as shown in FIG. 38, the insulative housing 652 is pressed down upon the substrate 666 so that the sockets 730 receive the hold downs 728. Referring to FIG. 39, the hold downs 728 are retained by the sockets 730 by a friction fit and the housing 652 is thereby secured to the substrate 666, as shown in FIG. 39. Other systems for mounting the housing 652 to the substrate 666 may be used, such as screws, as shown in FIG. 1.

The biasing plate 720 may be a rigid plate with at least one substantially planar surface 722, as shown in FIG. 39. The biasing plate 720 may be sized to cover substantially all of the area of the first surface 656 of the housing 652 that is inside the border elements 734 of the surface 656. Accordingly, the biasing plate 720 will cover all the of contacts 600 inserted into the apertures 654 of the insulative housing 652 when placed over the first surface 656. The biasing plate 720 of the embodiment depicted in FIGS. 38 and 39 may be square in shape in order to match up with the area of the first surface 656 of the housing 652 inside the border elements 734, which is also square.

Referring to FIG. 38, once the insulative housing 652 is fastened to the substrate 666, the biasing plate 720 is placed over the first surface 656 of the housing 652 such that the substantially planar surface 722 of the biasing plate 720 will face the first surface 656. Because the biasing plate 720 is sized to be slightly smaller than the area of the first surface 656 inside the border elements 734, the biasing plate 720 will be located directly above all of the contacts 600 of the connector 650. More specifically, the planar surface 722 of the biasing plate 720 will be in contact, or be directly above, the first land surfaces 622 of the contacts 600, which remain in a substantially undeflected state.

Once the biasing plate 720 is properly aligned over the first surface 656 of the housing 652, the biasing plate 720 is forced down upon the first surface 656 of the housing 652, as shown in FIG. 39. The force 742 applied to the biasing plate 720 should be substantially normal to both the biasing plate 720 and the first surface 656. The biasing plate 720 can be forced down until the planar surface 722 is flush with the first surface 656 of the housing 652, i.e. until all the first land surfaces 622 of the contacts 600 are deflected into the apertures 654, as shown in FIG. 39. As the biasing plate 720 is forced down and the contacts 600 deflect, the contacts 600 are forced down into the vertical slots 690, 692 until the retention wings 682, 688 are flush with the ledges 694, 696 of their respective vertical slots 690, 692. When the contacts 600 are so situated in the vertical slots 690, 692, the second land surfaces 640 of the contacts 600 will project beyond the second surface 658 of the housing 652 to the maximum extent permitted while the contacts 600 are retained within the vertical slots 690, 692. Such positioning may better enable the contacts 600 to compensate for the non-planar nature of the substrate 666 and may ensure that essentially all the second land surfaces 640 of the second spring arms 628 will contact traces 668 of the substrate 666, although the amount of deflection in each contact 600 may vary.

In one embodiment, the biasing plate 720 is an independent plate that can be applied to and removed from the first surface 656 of housing 652, as shown in FIGS. 38 and 39. The housing 652 can be provided with a retaining spring 744 hingedly attached to the insulative housing 652 as shown in FIGS. 38 and 39. The retaining spring 744 consists of a spring 746 pivotally attached to the first surface 656 of the housing 652 at hinge a 748. A suitable retaining spring 744 for this purpose is, for example, the retaining spring described in U.S. Pat. No. 5,485,351, which is herein incorporated by reference. The retaining spring 744 may be secured shut over the insulative housing 652, thereby retaining the biasing plate 720 between the spring 746 and the housing 652. Once secured shut over the housing 652, the camber and spring quality of the spring 746 causes it to press down on the biasing plate 720 with the predetermined force necessary to bias the contacts 600 into the lowest position in the vertical slots 690, 692. In another embodiment, a tool could be used in place of the retaining spring 744 to press down the biasing plate 720. In another embodiment, the biasing plate 720 can be part of a press plate assembly that works to apply and then press the biasing plate 720 against the housing 652 at a specified force. The press plate can include a plurality of biasing plates 720 that can be pressed down upon a plurality of insulative housings 652 during the assembly of multiple electrical connector and substrate assemblies. It will be appreciated that many other methods of applying the press plate 720 will suffice to achieve the desired result.

The next step in the method of using a biasing plate 720 to connect the insulative housing 652 to the substrate 666 is to solder the second land surfaces 640 of the contacts 600 to the traces 668 of the substrate 666 against which they are pressed. In one method of assembly, solder paste is applied to the traces 668 of the substrate 666 before it is mated to the connector 650, as shown in FIG. 38. The advantage in applying the solder 754 to the traces 668 before assembly is that access to the traces 668 and contacts 600, and particularly the areas where they meet, is significantly restricted once the housing 652 and substrate 666 are secured together. Accordingly, the solder 754 will be located between the second land surfaces 640 and their respective traces 668 when they are forced together, as shown in FIG. 39. After the connector 650 and substrate 666 are secured together and the biasing plate 720 is being uniformly pressed against the first surface 656 with a generally constant force, the entire assembly is heated to a predetermined temperature at which the solder 754 will melt, thereby forming a liquid layer of solder 754 between the land surfaces 640 and the traces 668. The assembly is then cooled to a predetermined temperature at which the solder 754 solidifies, thereby soldering the second land surface 640 to its respective trace 668.

Referring to FIG. 40, the final step in using the biasing plate 720, to compensate for the non-planar nature of the substrate 666, is to remove the biasing plate 720. The resulting assembly is a connector 650 mounted to a substrate 666 wherein the contacts 600 are soldered to a trace 668 of the substrate 666 at the second land surfaces 640 of the contact 600.

Figure 41:
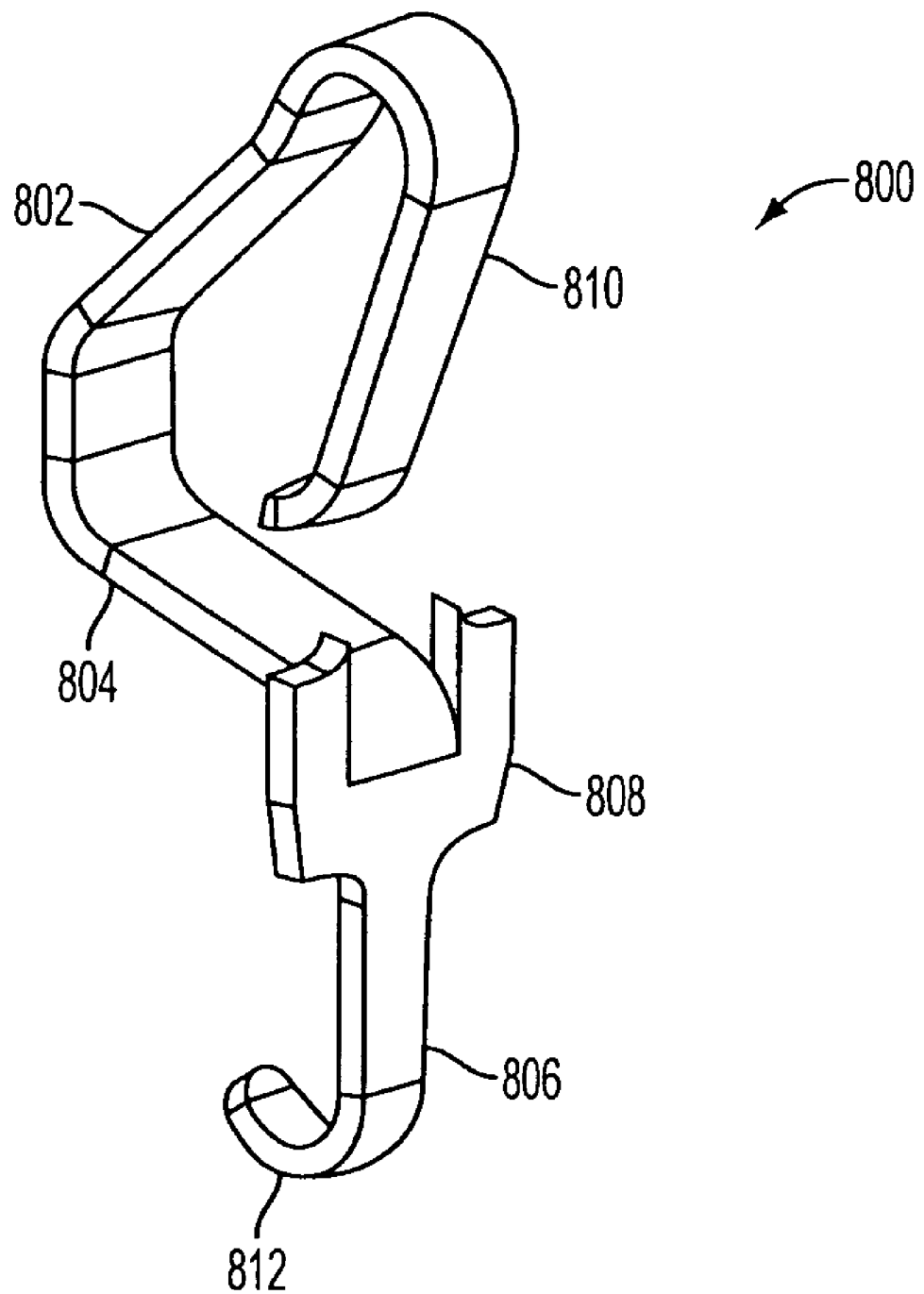
FIG. 41 is a perspective view of another embodiment with a second spring arm that is substantially planar with the center portion.

In another embodiment, illustrated in FIG. 41, the contact 800 can be provided with a second spring arm 806 that is substantially planar with the center portion 808. The center portion 808, the first spring arm 802, and the bellows leg 810 of the contact 800 may be similar to those of the embodiment of FIG. 32 and, consequently, operate in the same manner. However, the second spring arm 806 of this embodiment may extend vertically downward from the center portion 808 within the plane defined by the center portion 808. The second spring arm 806 may terminate in a second land surface 812, which curves slightly upwards toward the second portion 804 of the first spring arm 802, as shown in FIG. 41.

Referring to FIG. 41, the second spring arm 806 may not include a collapsible zone and, therefore, will be less prone to deflection when the second land surface 812 makes contact with a substrate, as the insulative housing 800 is mated to the substrate. However, the second spring arm 806 will accommodate deflection by nature of its ductile composition, particularly within the second land surface 812, which will curve further up towards the first spring arm 802 as it is forced against a substrate. Because the second spring arm 806 is not disposed at an angle between the center portion 800 and the substrate, but instead travels a direct vertical path therebetween, the contact 800 provides a shortened path through which electric current must travel through the contact 800.

Figure 42:
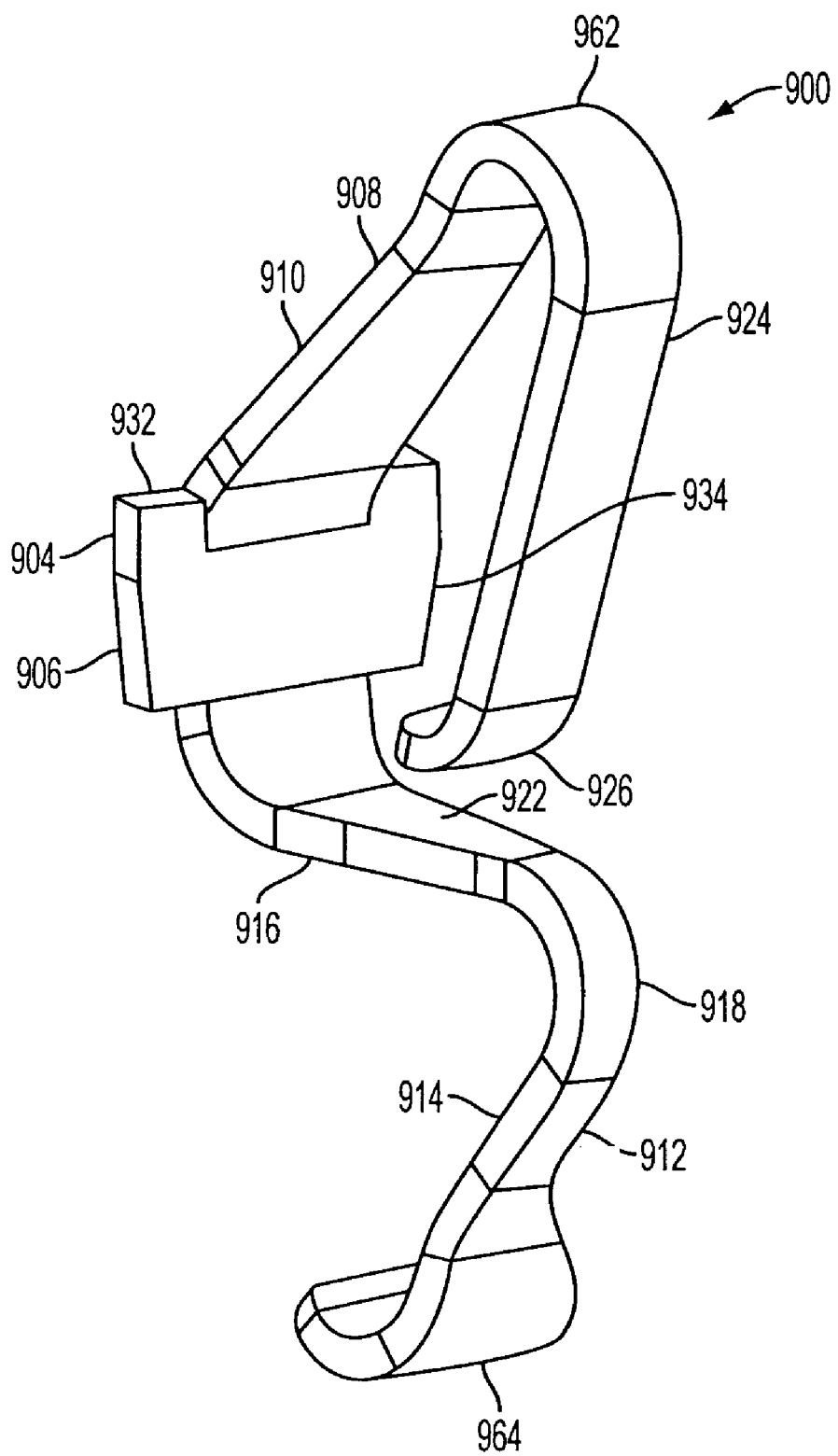
FIG. 42 is a perspective view of another embodiment with the center portion located in the front of the contact.

In another embodiment, as shown in FIG. 42, the contact 900 has been configured such that the center portion 906 is located in the rear 904 of the contact 900. Accordingly, the first spring arm 908 may be composed of a first portion 910 that is attached to the center portion 906 in a cantilevered fashion and extends upwards at an angle therefrom. The second spring arm 912 may include a first portion 914 and a second portion 916 joined by a collapsible bend 918 at an angle of less than 90 degrees in an undeflected state, as shown in FIG. 42. The second portion 916 of the second spring arm 912 may be attached in a cantilevered fashion to the center portion 906 such that the second portion 916 extends slightly downwards therefrom.

Figure 43:
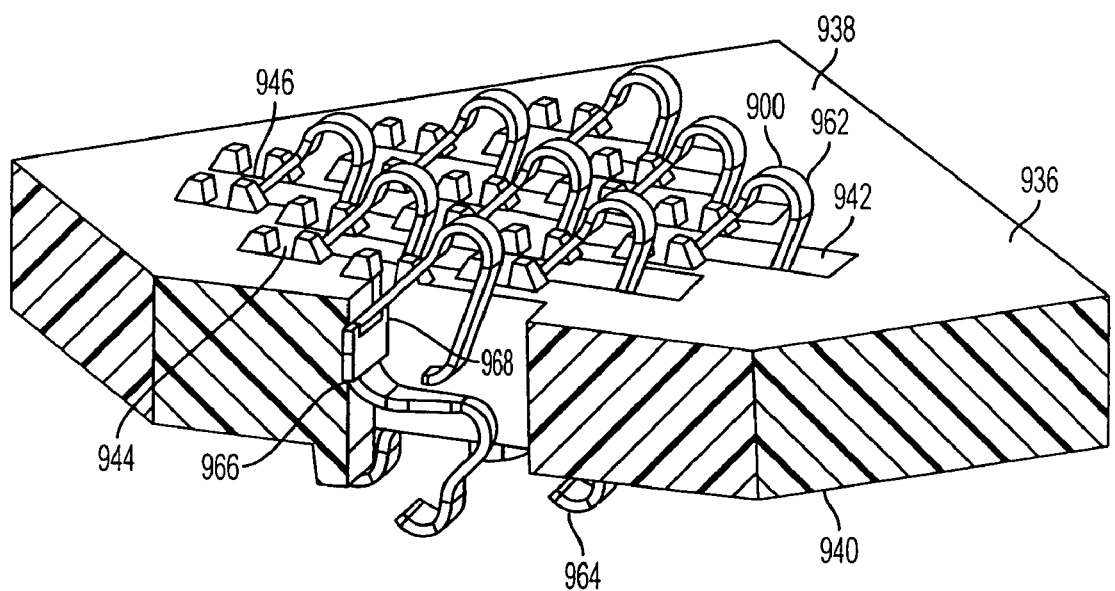
FIG. 43 is a cross sectional view of an insulative housing with the contact from FIG. 42 disposed within in the electrical housing.

Referring to FIG. 43, when the contact 900 is inserted into the aperture 942 of the insulative housing 936, the first land surface 962 and the second land surface 964 will extend beyond the respective first and second surfaces 938, 940 of the housing. The contact 900 may also include retention members 932, 934 that can be configured as retention wings 932, 934, as shown in FIG. 42. Referring to FIG. 43, the vertical slots 944, 946 of the housing 936 can receive the retention wings 932, 934 of the contact 900 as the contact 900 is inserted into the aperture 942 through the opening defined by the first surface 938. The vertical slots 944, 946 function to vertically position the contact 900 within the aperture 942, and the ledges 966, 968 of the vertical slots 944, 946 define how deep the contact 900 may be inserted into the housing 936. Because the size of the slots 944, 946 may be larger than the both the length of the retention wings 932, 934 and the thickness of the sheet metal forming the retention wings 932, 930, the contact 900 is floatingly retained within the aperture 942.

Referring to FIG. 42, the contact 900 may include a first contact surface 926 and a second contact surface 922. The first contact surface 926 defines the end of the bellows leg 924 and is a curved surface disposed below the center portion 906 of the contact 900, towards which it curves slightly upward. The second portion 916 of the second spring arm 912 embodies the second contact surface 922. The second contact surface 922 may be located approximately below the first contact surface 926 so that the two contact surfaces 926, 922 appear, as illustrated in FIGS. 40 and 41, as opposing surfaces. In the embodiment illustrated in FIGS. 42 and 43, the first and second contact surfaces 922, 926 are separated by a gap 970. An advantage of providing the gap is that the first and second contact surfaces 926, 922 can be easily plated during production of the contact 900.

Figure 44:
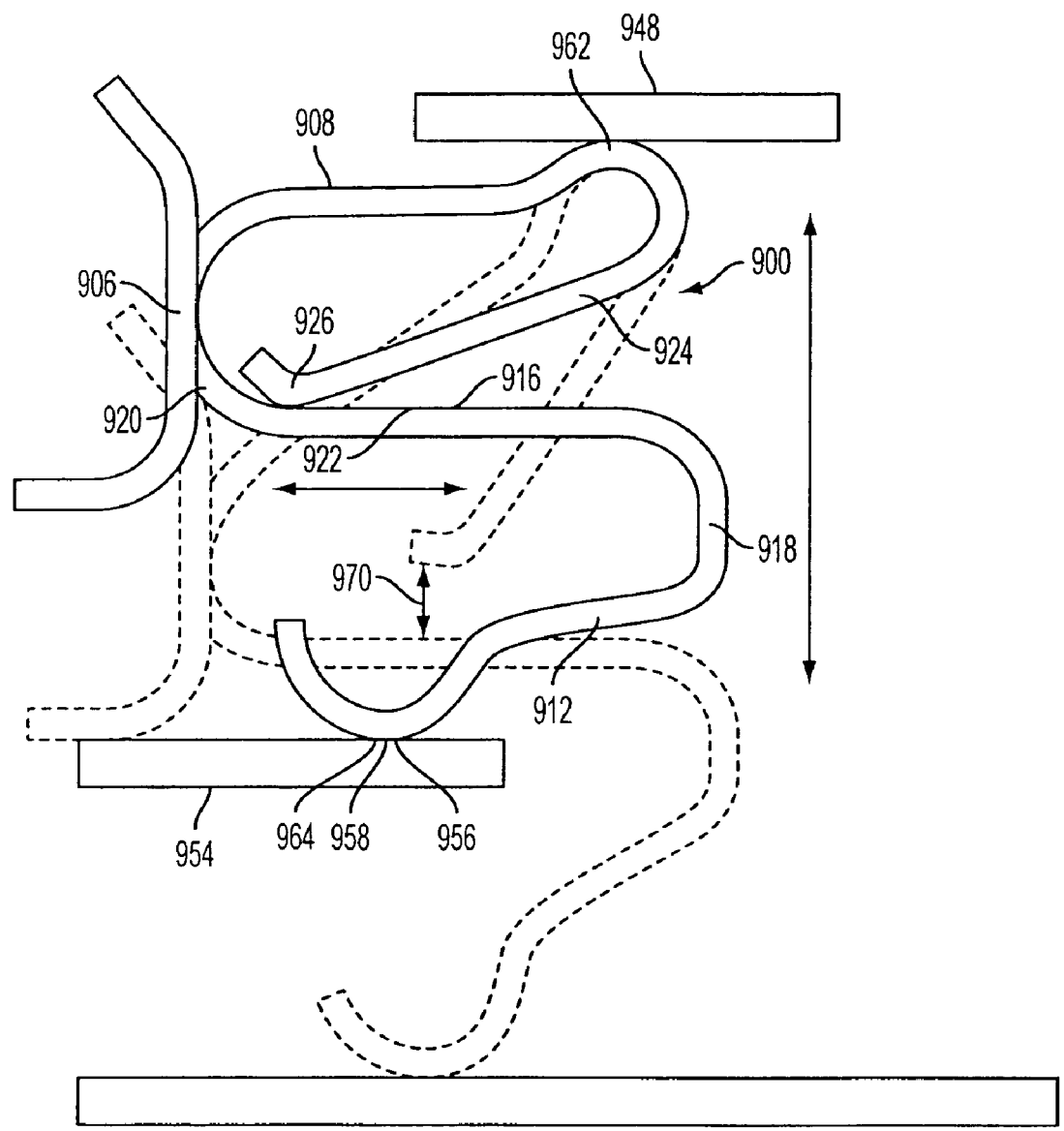
FIG. 44 is a side elevation view illustrating the forces exerted during deflection of the embodiment of FIG. 42.

Referring to FIG. 44, when the first and second spring arms 908, 912 are deflected towards each other by the integrated circuit package 948 and the substrate 954, the first contact surface 926 may be pressed against the second contact surface 922 thereby eliminating the gap 970. This results in shortening the path electric current must travel through the contact 900. Since contact between the bellows leg 924 and spring arm 912 occurs tangentially along the apex of the curved first contact surface 926 and the second contact surface 922, abrasion and the likelihood of damaging or fusing together of the first and second contact surfaces 926, 922 is reduced. When the forces causing the spring arms 908, 912 to deflect are removed, the resiliency of the contact material can cause the contact surfaces 926, 922 to separate re-creating the gap 970 illustrated in FIG. 40. Furthermore, where the widths of the bellows leg 924 and the second spring arm 912 are similar to or the same as the center portion 906, the contact surfaces 926, 922 will have sufficient width for contact to occur.

Referring to FIG. 44, to allow the first and second spring arms 908, 912 to be further deflected toward each other after the initial contact between the first and second contact surfaces 926, 922, the second spring arm 912 and the first contact surface 926 can be configured to allow the first contact surface 926 to slide along the second portion 916 of the second spring arm 912. More specifically, the resilient nature of the contact material allows the bellows leg 924 to bend towards the first spring arm 908 at the first land surface 962. Therefore, after the initial contact, the first contact surface 926 can slide along the second portion 916 of the spring arm 912 as the first contact surface 926 is directed towards the center portion 906. An advantage of enabling sliding motion of the first contact surface 926 along the second portion 916 is that it provides for a greater range of deflection between the spring arms 908, 912. Another advantage of enabling sliding motion of the first contact surface 926 with respect to the second contact surface 922 is that the contact surfaces 926, 922 can be wiped clean of any built-up debris that could hinder electrical communication across the contact surfaces 926, 922. When the forces causing deflection of the spring arms 908, 912 are removed, the first contact surface 926 can slide back along the second portion 916 thereby causing the contact 900 to recover its initial un-deflected shape.

Referring to FIG. 44, the majority of strain experienced in the second spring arm 912 as it is deflected occurs within the collapsible bend 918. The other area where significant deflection occurs in the second spring arm 912 is the point where the second portion 916 meets the center portion 906 in a cantilevered connection 920. The fact that the majority of strain occurs in these regions reduces the amount of stress and strain on the solder joints 958 between the second land surfaces 964 and the traces 956 of the substrate 954, thereby increasing the connector's resistance to fatigue failure.

Figure 46:
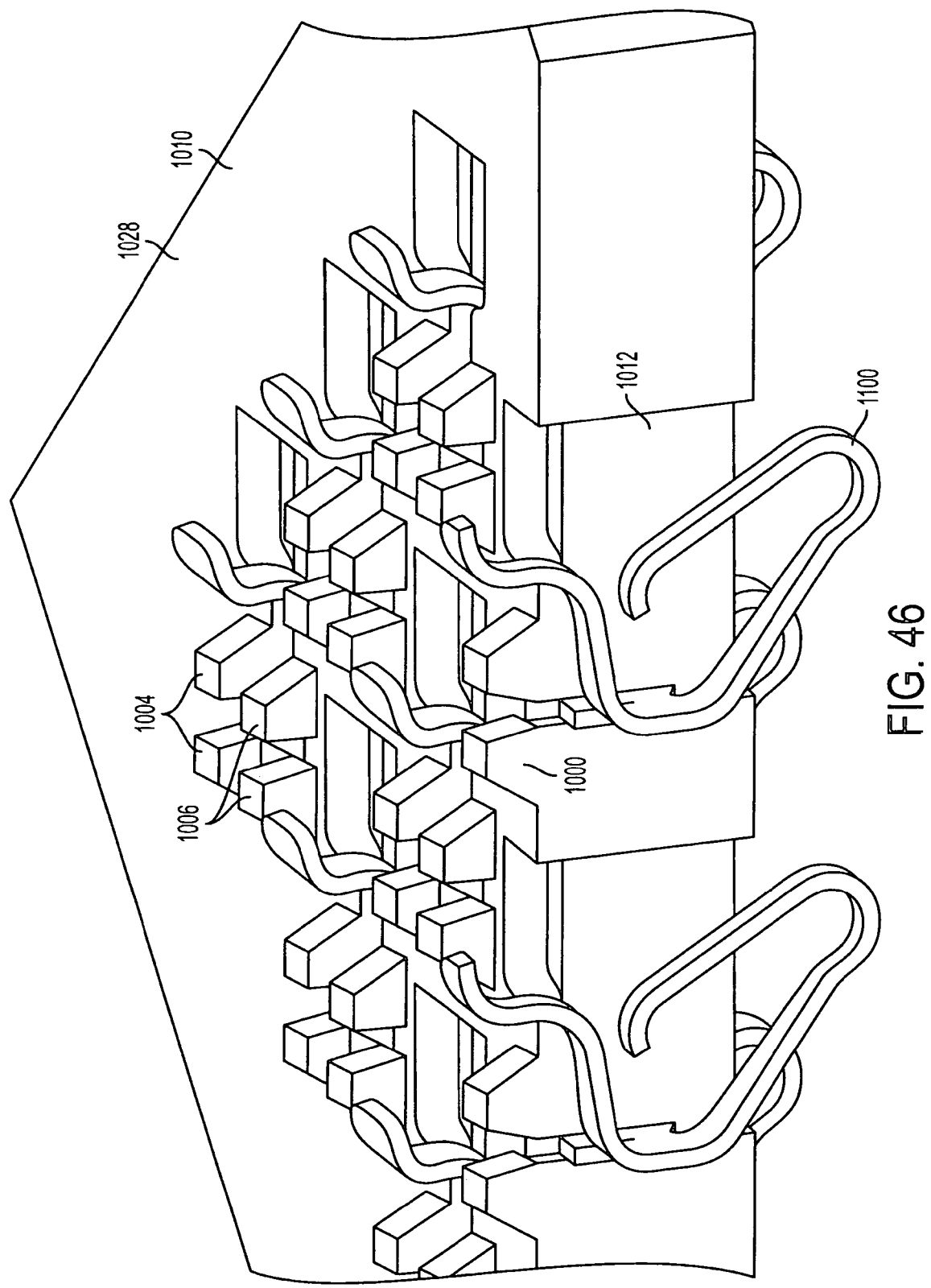
FIG. 46 is a perspective cross sectional view of an insulative housing with retention stakes and contacts inserted into the apertures.
Figure 47:
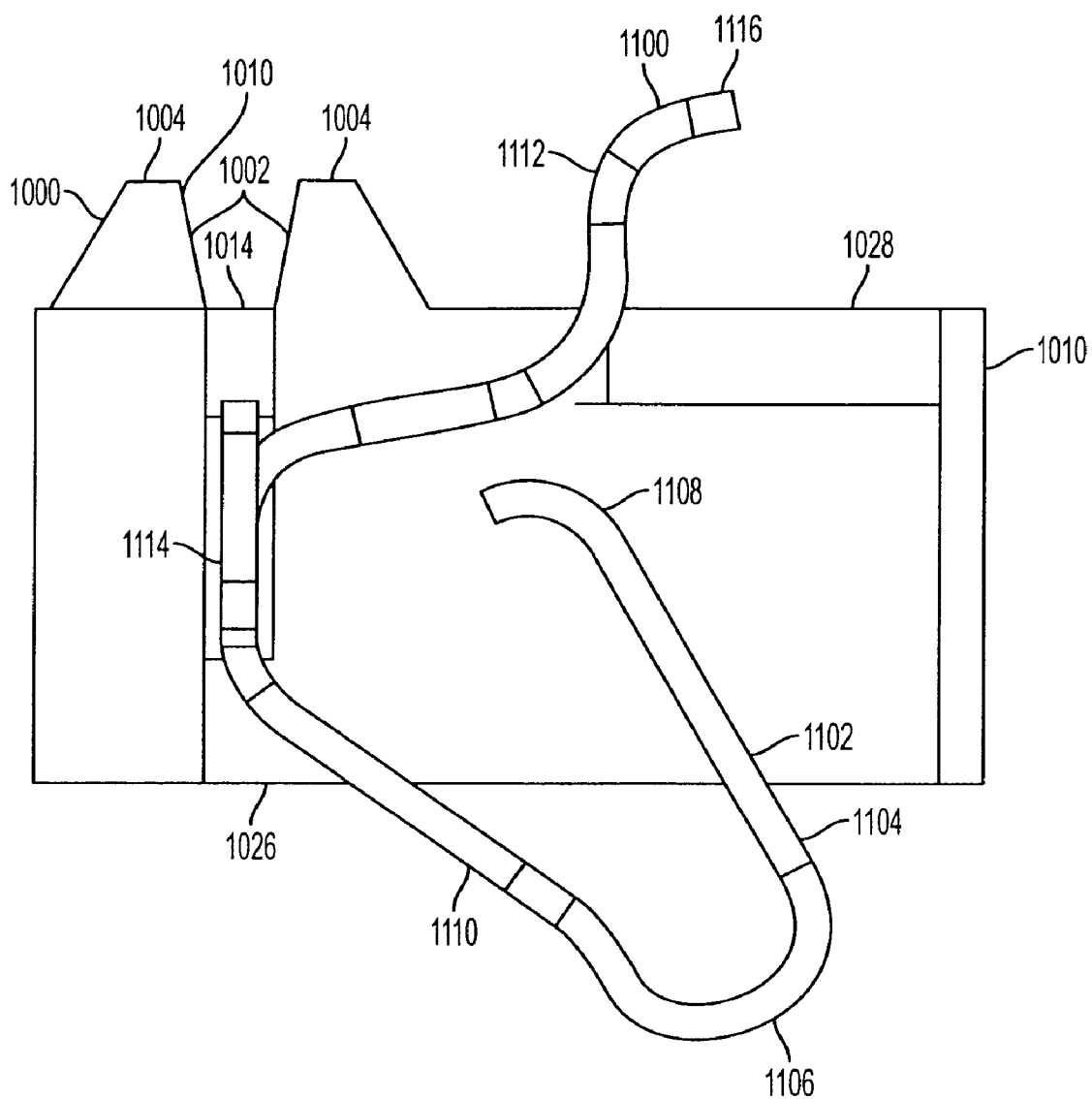
FIG. 47 is a side view showing a single aperture and contact from FIG. 46.

Referring to FIGS. 46 and 47, another embodiment of the present invention is illustrated wherein the contact 1100 may be configured similarly to the embodiment of the contact 100, as shown in FIG. 4. The contact 1100 differs from the contact 100 in that the bellows leg 1102 of the contact 1100 may include only a first portion 1104 that extends from the first land surface 1106 to terminate in a first contact surface 1108, as shown in FIG. 47. Additionally, the contact 1100 may demonstrate increased angles between the first spring arm 1110 and the center portion 1114 and between the second spring arm 1112 and the center portion 1114. Such a configuration results in the first and second land surfaces 1106, 1116 extending beyond the first and second surfaces 1026, 1028, respectively, of the housing 1010 to an exaggerated degree, as shown in FIG. 47. Accordingly, the contact 1100 embodies all the above described advantages that are engendered from such a configuration.

Figure 45:
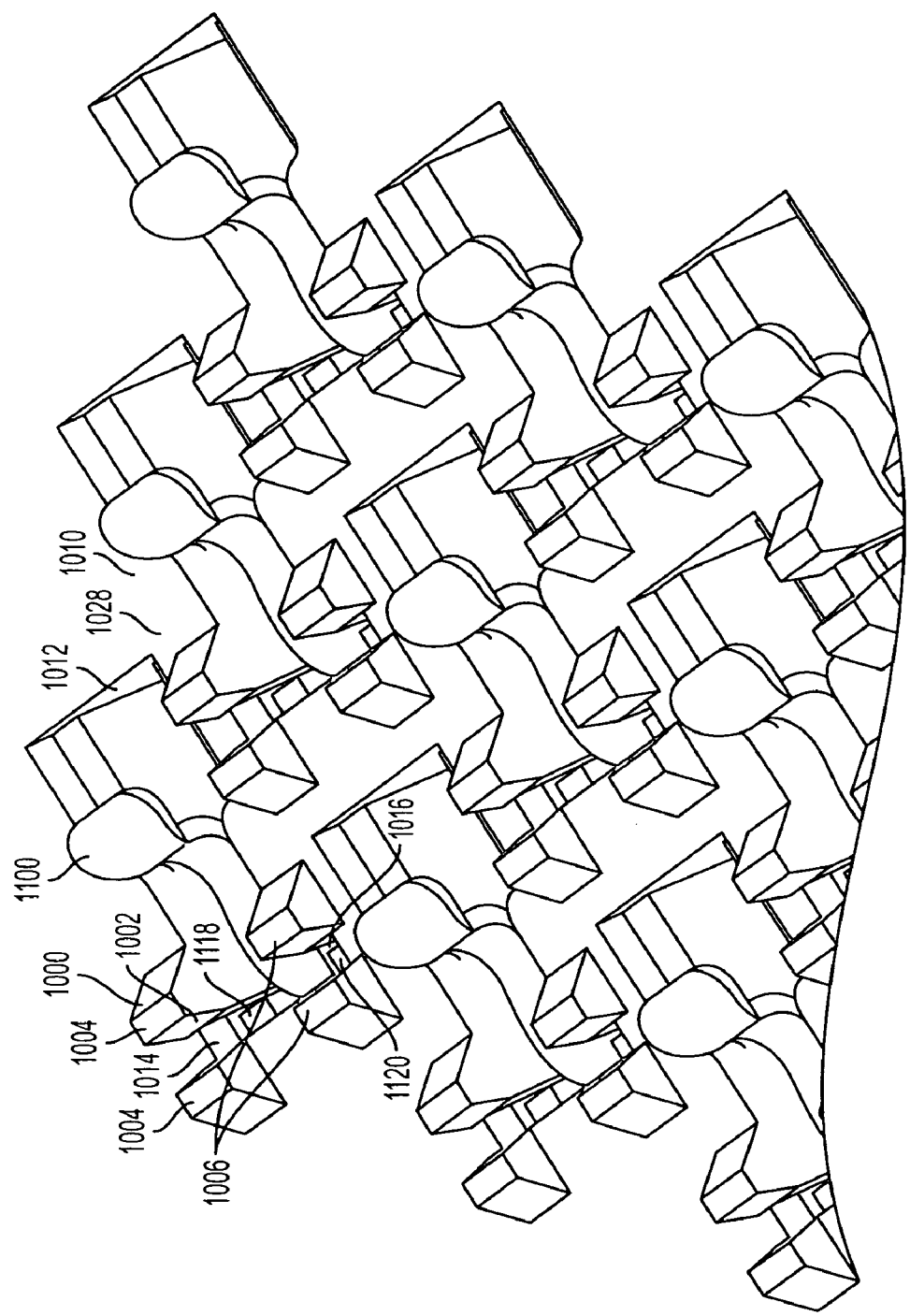
FIG. 45 is a detailed view similar to FIG. 3 except the second surface of the housing is provided with retention stakes.
Figure 50:
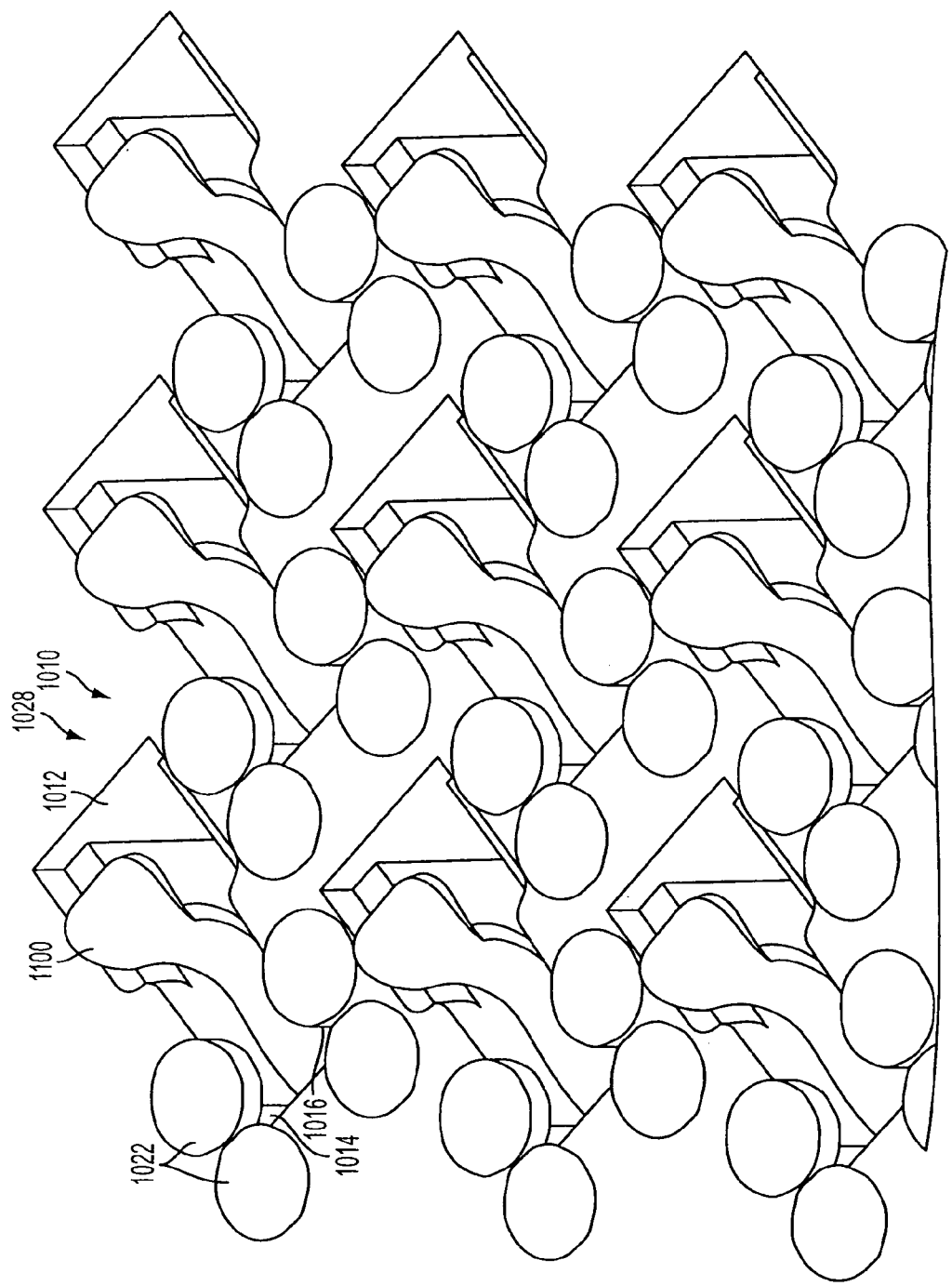
FIG. 50 is a perspective view of the connector with the retention stakes compressed.
Figure 51:
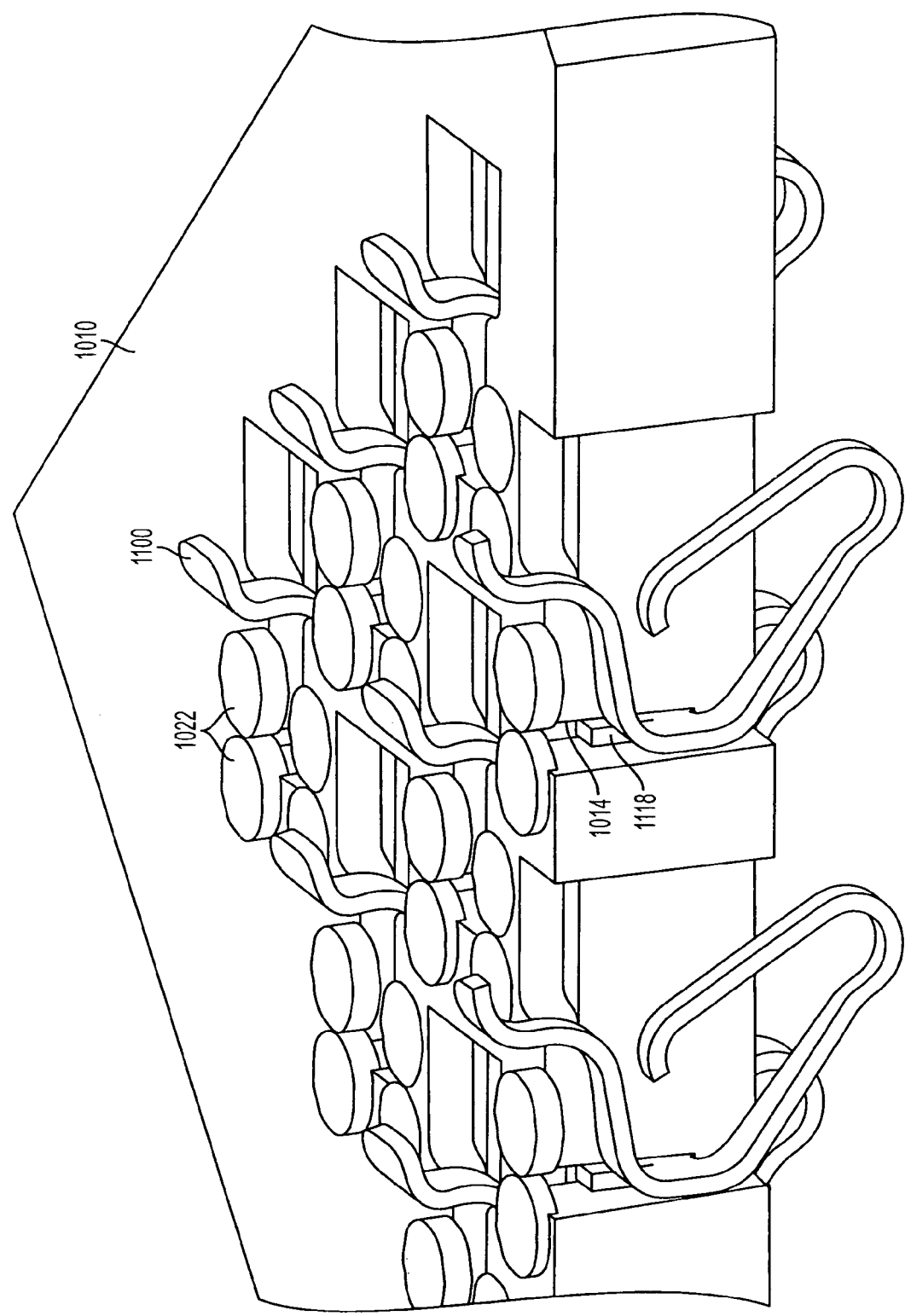
FIG. 51 is a perspective view of the connector with the retention stakes compressed.
Figure 52:
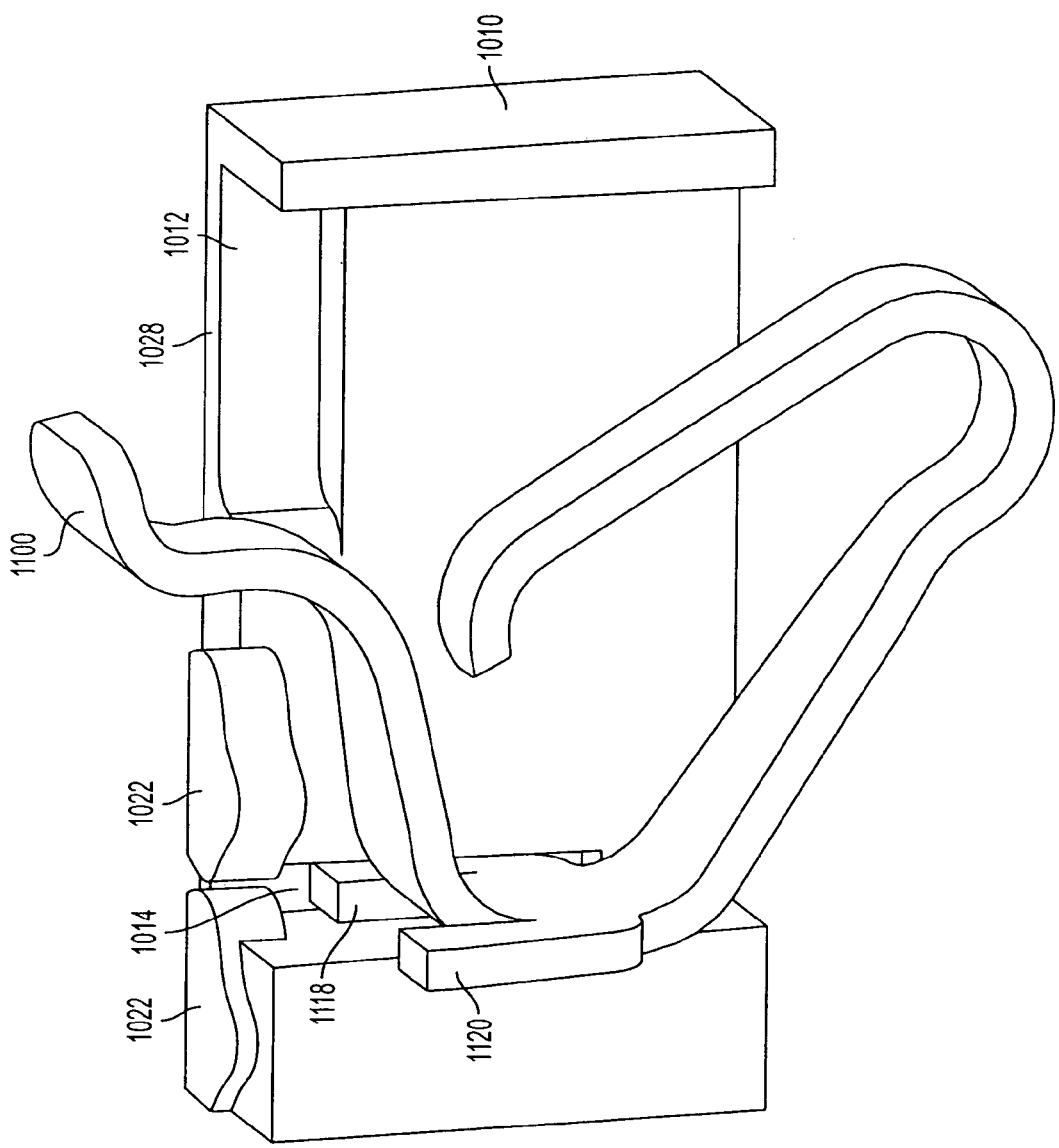
FIG. 52 is a perspective view of the connector with the retention stakes compressed.

In another embodiment, shown in FIGS. 45 and 50, a deformable retention stake 1000 may be used to prevent the contact 1100 from backing out of the aperture 1012 after insertion. In the embodiment shown in FIG. 45, the contact 1100 is inserted into the aperture 1012 via the opening defined by the second surface 1028. To ensure the contact 1100 does not back out of this opening, the second surface 1028 of the insulative housing 1010 is provided a deformable retention stake or bump 1000, as shown in FIG. 46. The retention stakes 1000 may be nodules of material that protrude from the second surface 1028 of the housing 1010, as shown in FIG. 45. The stakes 1000 may be composed of a malleable material and can be composed of the same material that constitutes the remainder of the insulative housing 1100. The stakes 1000 may also be composed of a material that is malleable upon localized heating. In the embodiment depicted in FIG. 45, the retention stakes 1000 are trapezoidal in shape, but it will be understood that the stakes 1000 can assume a variety of shapes, including irregular ones.

Figure 48:
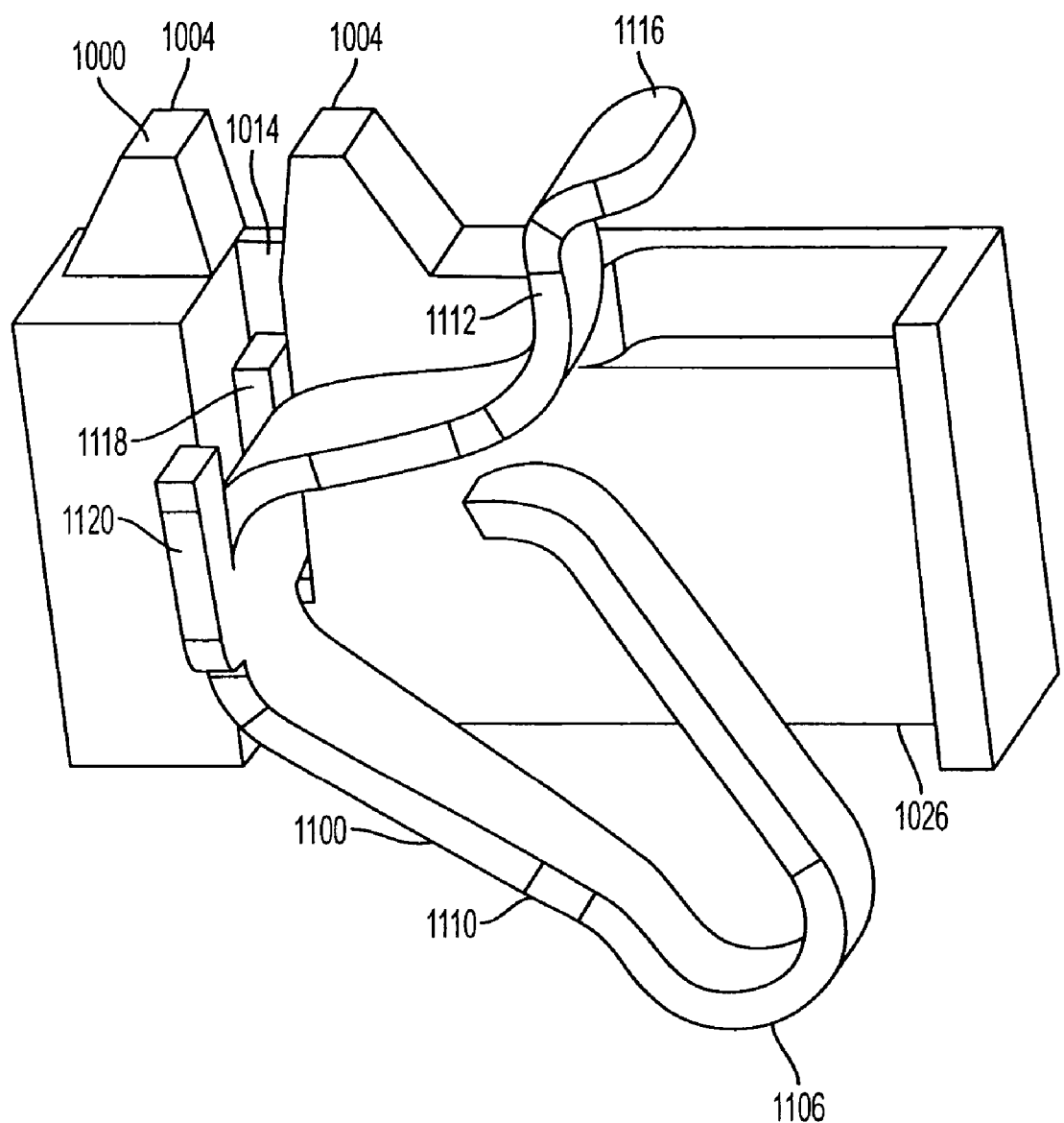
FIG. 48 is a perspective view of the contact and aperture of FIG. 47.

Referring to FIGS. 45 and 46, each aperture 1012 may have associated with it two pairs 1004, 1006 of retention stakes 1000, each pair 1004, 1006 located on either side of the aperture 1012. In turn, each pair 1004, 1006 of retention stakes 1000 may straddle a respective vertical slot 1014, 1016, as shown in FIGS. 47 and 48. The retention stakes 1000 may be configured so as to not interfere with the contact 1100 or its retention members 1118, 1120 as the contact 1100 is inserted into the aperture 1012. As shown in FIGS. 47 and 48, the retention stakes 1000 may help guide the retention members 1118, 1120 into the vertical slots 1014, 1016 because their side walls 1002 slope up and away form the edges of the vertical slots 1014, 1016.

Figure 49:
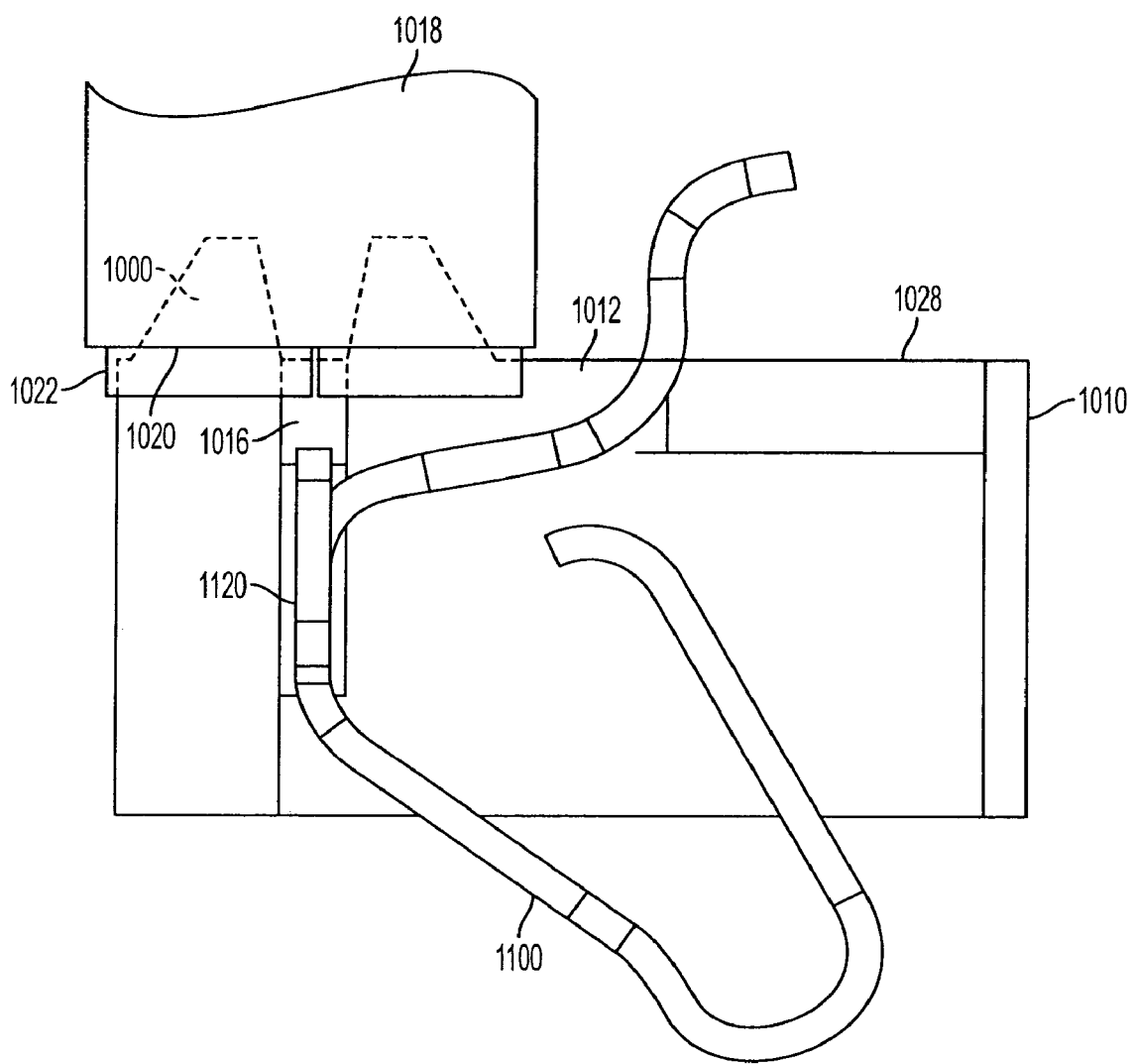
FIG. 49 is a side view showing the retention stakes being compressed by a tool.

Referring to FIG. 49, after the contacts 1100 are inserted into the apertures 1012 of the insulative housing 1010, a tool 1018 may be used to deform the retention stakes 1000. The tool 1018 may be heated to a predetermined temperature in order to facilitate compression of the stakes 1000. In another embodiment, the compression of the stakes 1000 may be accomplished without preheating the tool 1018. The tool 1018 may have a substantially planar surface 1020 so that, as the retention stakes 1000 compress towards the surface 1028 of the housing 1010, the stakes 1000 will expand out to cover a larger area than does the base of an uncompressed stake 1000, as shown in FIG. 49. As shown in FIGS. 49 and 50, the expanded footprint of the deformed retention stakes 1022 will cover the vertical slots 1014, 1016 after the tool 1018 is removed. The compressed stakes 1022 therefore prevent the contacts 1100 from backing out of the apertures 1012 and leave the contact 1100 floatingly retained by nature of the entrapment of the retention members 1118, 1120 within the vertical slots 1014, 1016. In one embodiment, a heated plate may serve as the tool, so that all or a group of stakes 1000 may be compressed in a single application of the plate.

Figure 53:
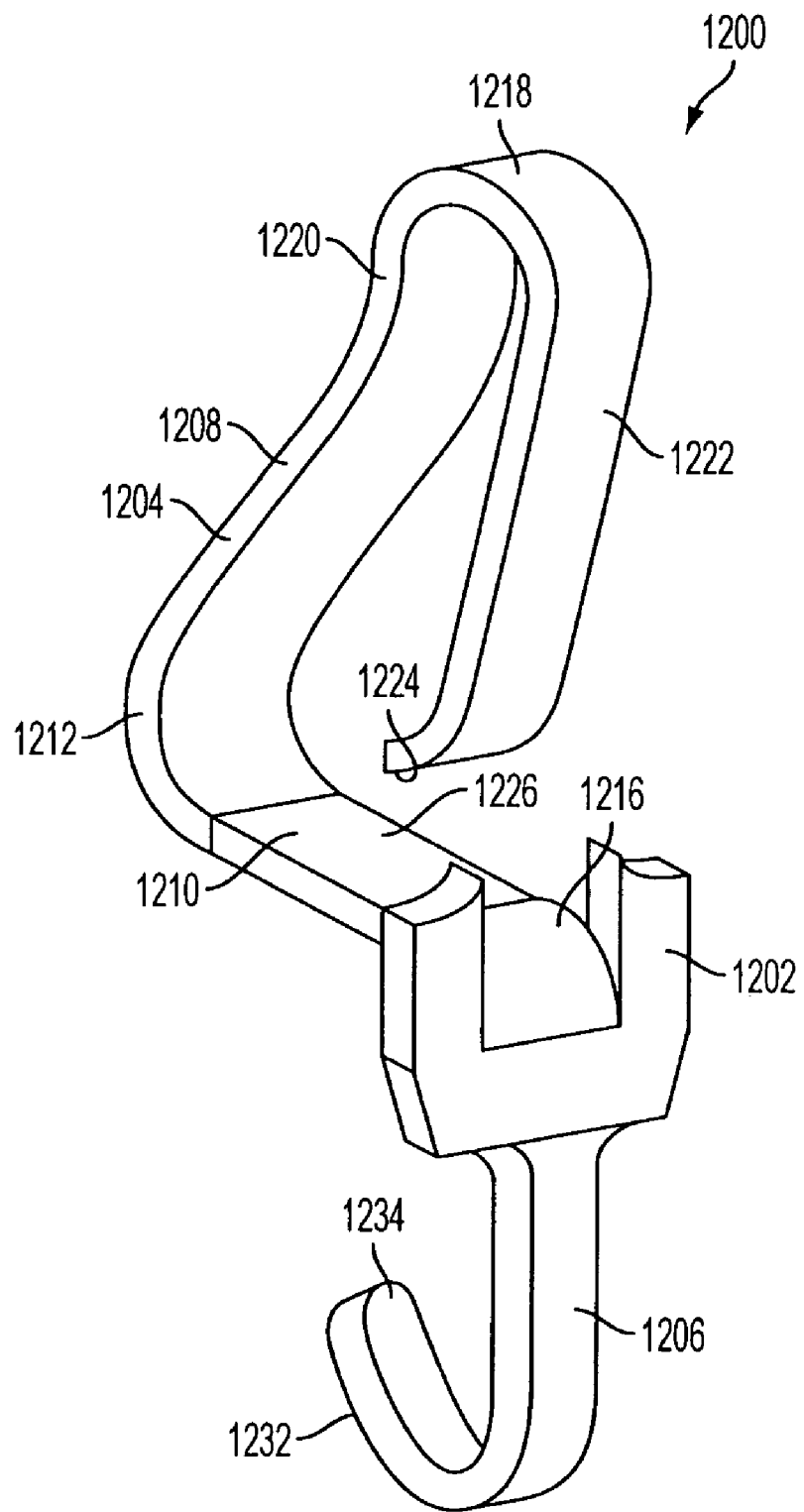
FIG. 53 is a perspective view of another embodiment of the present invention.
Figure 54:
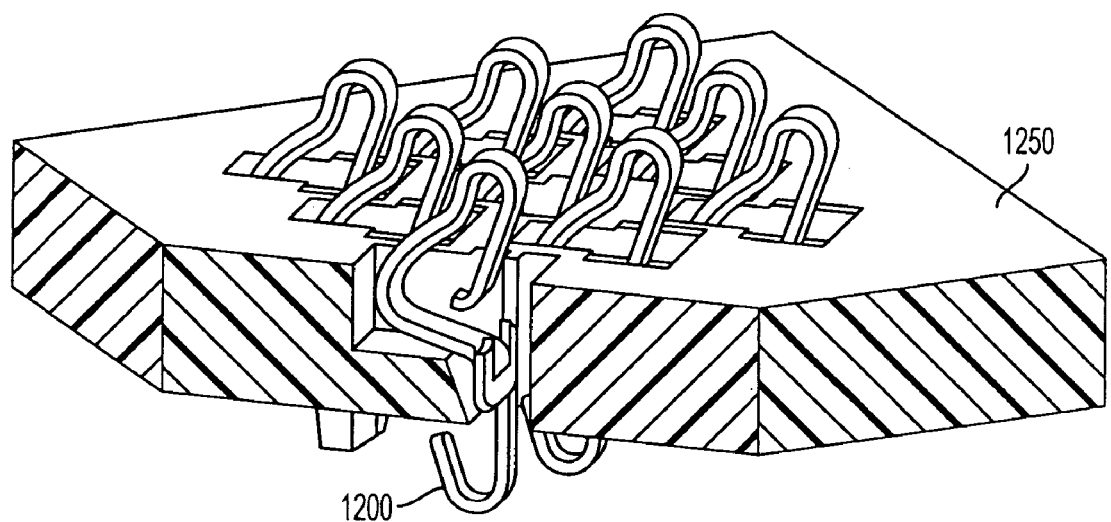
FIG. 54 is a cross sectional view of an insulative housing with the contact from FIG. 53 disposed within the insulative housing

In yet another embodiment, illustrated in FIG. 53, the contact 1200 may be configured similarly to the contact 800 of FIG. 41. The contact 1200 may have generally rounded features. The contact 1200 has a center portion 1202, a first spring arm 1204, and a second spring arm 1206 similar to contact 800. The contact 1200 therefore may function similarly to contact 800. The first spring arm includes a first portion 1208 connected to a second portion 1210 via a collapsible bend 1212. The second portion 1210 may be connected to the center portion 1202 via a cantilevered connection 1216. The first portion 1208 may transition to a first land surface 1218 via a curve 1220 that generally opposes the curvature of the collapsible bend 1212. Extending generally downward from the first land surface 1218 is a bellows leg 1222, which terminates in a first contact surface 1224. The first contact surface 1224 may curve generally towards the collapsible bend 1212. The second portion 1210 may include the second contact surface 1226. Referring to FIG. 54, the contact 1200 may be disposed within an insulative housing 1250.

Figure 55:
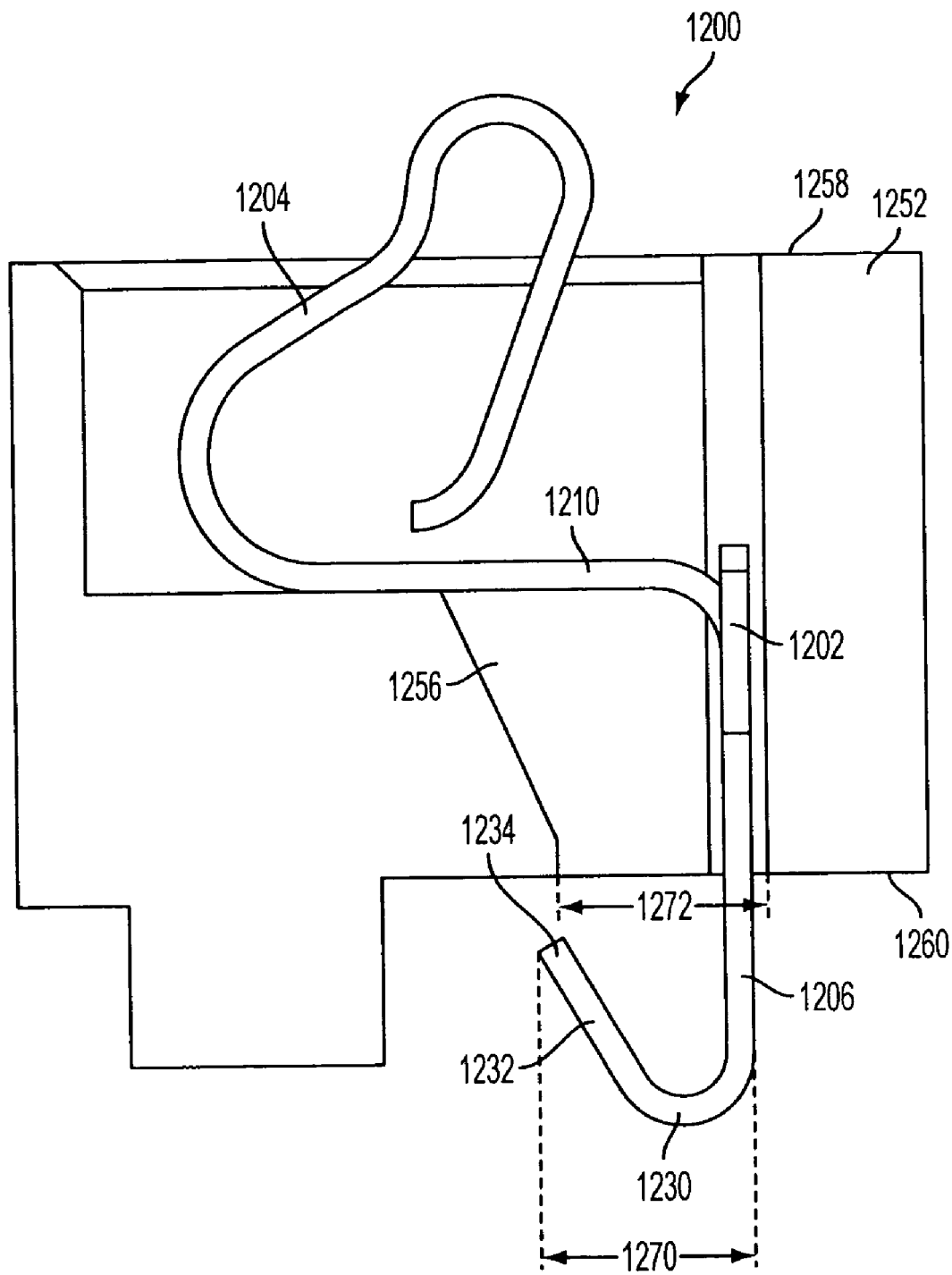
FIG. 55 is a cross sectional view of the contact of FIG. 53 disposed within a housing.

Referring to FIG. 55, the second spring arm 1206 may generally comprise a J-hook. The second spring 1206 may be substantially planar with the center portion 1202 and extend vertically down therefrom. The second spring arm 1206 terminates in a second land surface 1230, which may be substantially U-shaped, at its lowest point. Extending up from the second land surface 1230 towards the first spring arm 1204 is an appendage 1232. The appendage 1232 may extend back up towards the first spring arm 1204 about one-third the vertical displacement between the first spring arm 1204 and the second land surface 1230. Referring to FIG. 53, the appendage 1232 may taper to a rounded tip 1234. Referring to FIG. 55, the second spring arm 1206 and the center portion 1202 may be generally perpendicular to the second portion 1210 of the first spring arm 1204.

Figure 56:
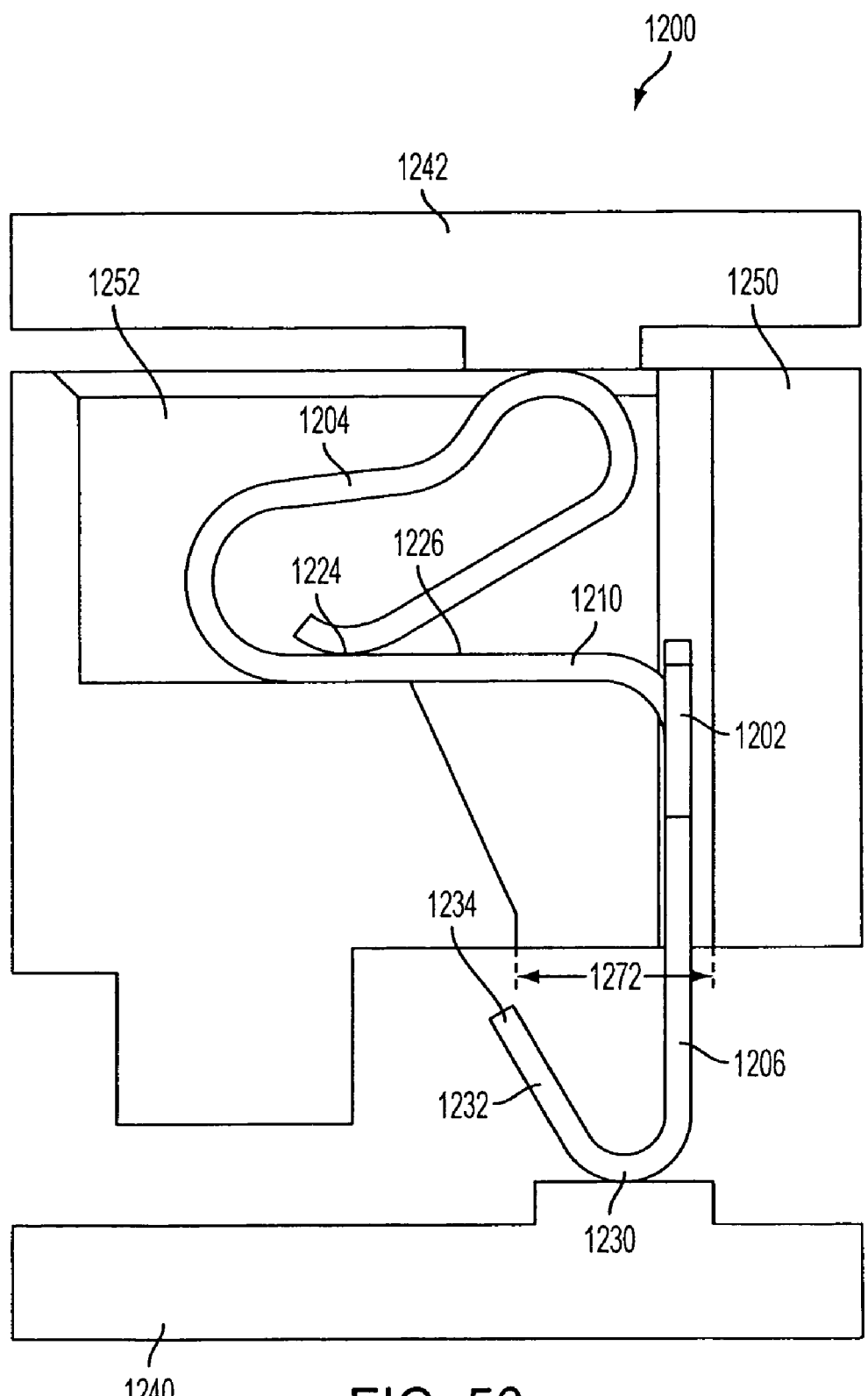
FIG. 56 is a cross sectional view of the contact of FIG. 53 disposed within a housing wherein the contact is deflected.

Referring to FIG. 56, the contact 1200 may be deflected between a substrate 1240 and a printed circuit board 1242 when inserted into a housing 1250 via an aperture 1252. The contact 1200 may deflect similarly to the contact 800 of FIG. 40, with the first contact surface 1224 touching and sliding along the second contact surface 1226. Therefore, the deflection will not be discussed in detail. As with the contact 800, the second spring arm 1206 of the contact 1200 may experience moderate deflection due to its vertical disposition and lack of a collapsible zone.

Figure 57:
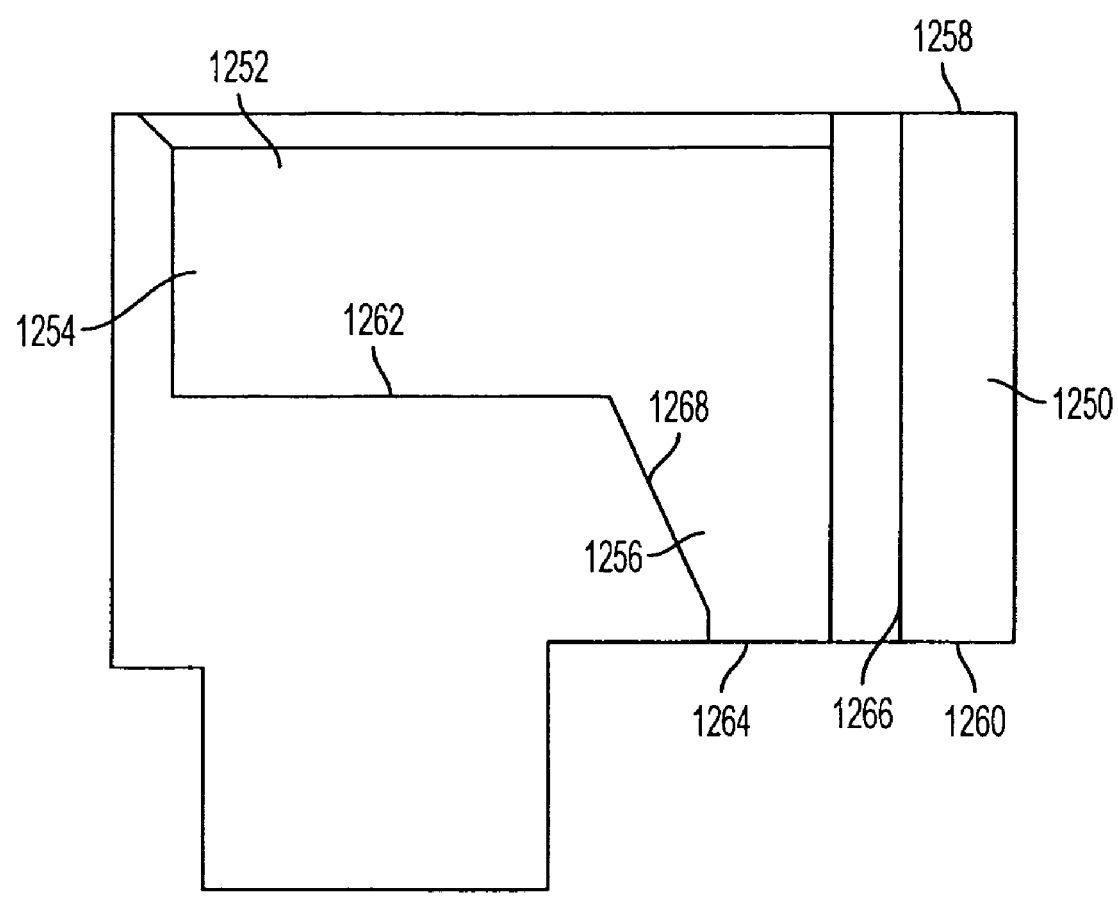
FIG. 57 is a cross sectional view of the housing of FIG. 54.

Referring to FIG. 57, the contact may be inserted into the aperture 1252 of the housing 1250, wherein the aperture 1252 includes a chamber 1254 and a tapered channel 1256. The chamber 1254 may extend in from the first surface 1258 towards the second surface 1260. The chamber 1254 may have a substantially flat bottom 1262 that is substantially parallel to the first and second surfaces 1258, 1260. The tapered channel 1256 may extend from the bottom 1262 of the chamber 1254 to an opening 1264 at the second surface 1260. The channel 1256 may include a substantially vertical front wall 1266 and an inclined back wall 1268. The channel 1256 may narrow between the bottom 1262 of the chamber 1254 and the opening 1264 according to the incline of the back wall 1268.

Referring to FIG. 55, the contact 1200 may be retained within the housing 1250 by the appendage 1232 at the end of the second spring arm 1206. The distance 1270 between the tip 1234 of the appendage 1232 and the second spring arm 1206 is wider than the distance 1272 of the opening 1264 at the second surface 1260. Accordingly, the contact 1200 may not be removed from the aperture 1252 via the first surface 1258, as the appendage 1232 would interfere with the second surface 1260, or via the second surface, as the first spring arm 1204 would not fit through the channel 1256. Therefore, once the contact 1200 is inserted into the housing 1250, the contact 1200 may be difficult to extract.

Figure 58:
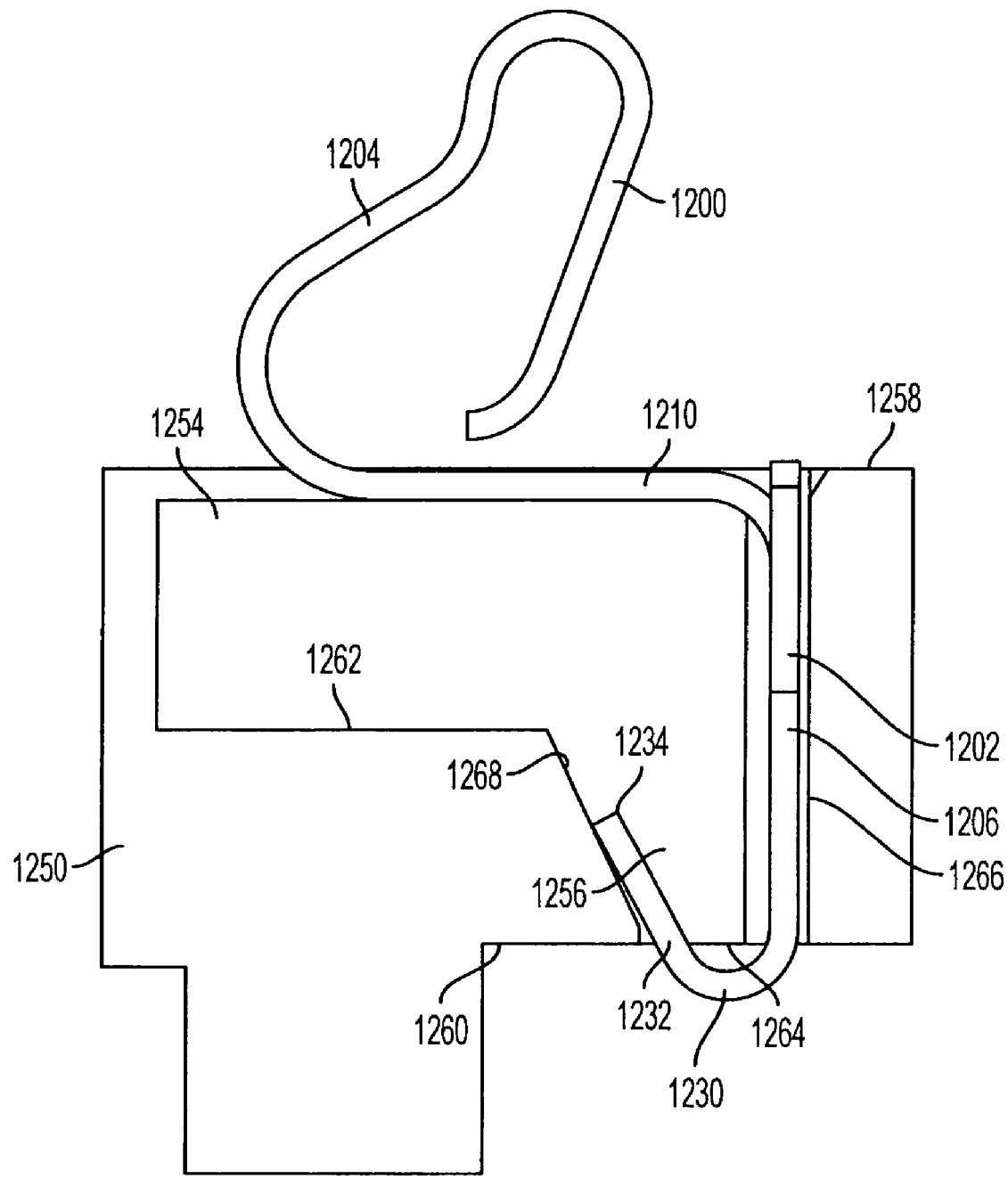
FIG. 58 is a cross sectional view of the contact of FIG. 53 entering a housing.

Referring to FIG. 58, the contact 1200 may be initially inserted into the housing 1250 via the aperture 1252 at the first surface 1258. As the contact 1200 enters the aperture 1252, the second spring arm 1206 may enter the channel 1256 until the appendage 1232 contacts the back wall 1268 at the same time the second spring arm 1206 contacts the front wall 1266. At this point, the second portion 1210 of the first spring arm 1204 may have entered the chamber 1254.

Figure 59:
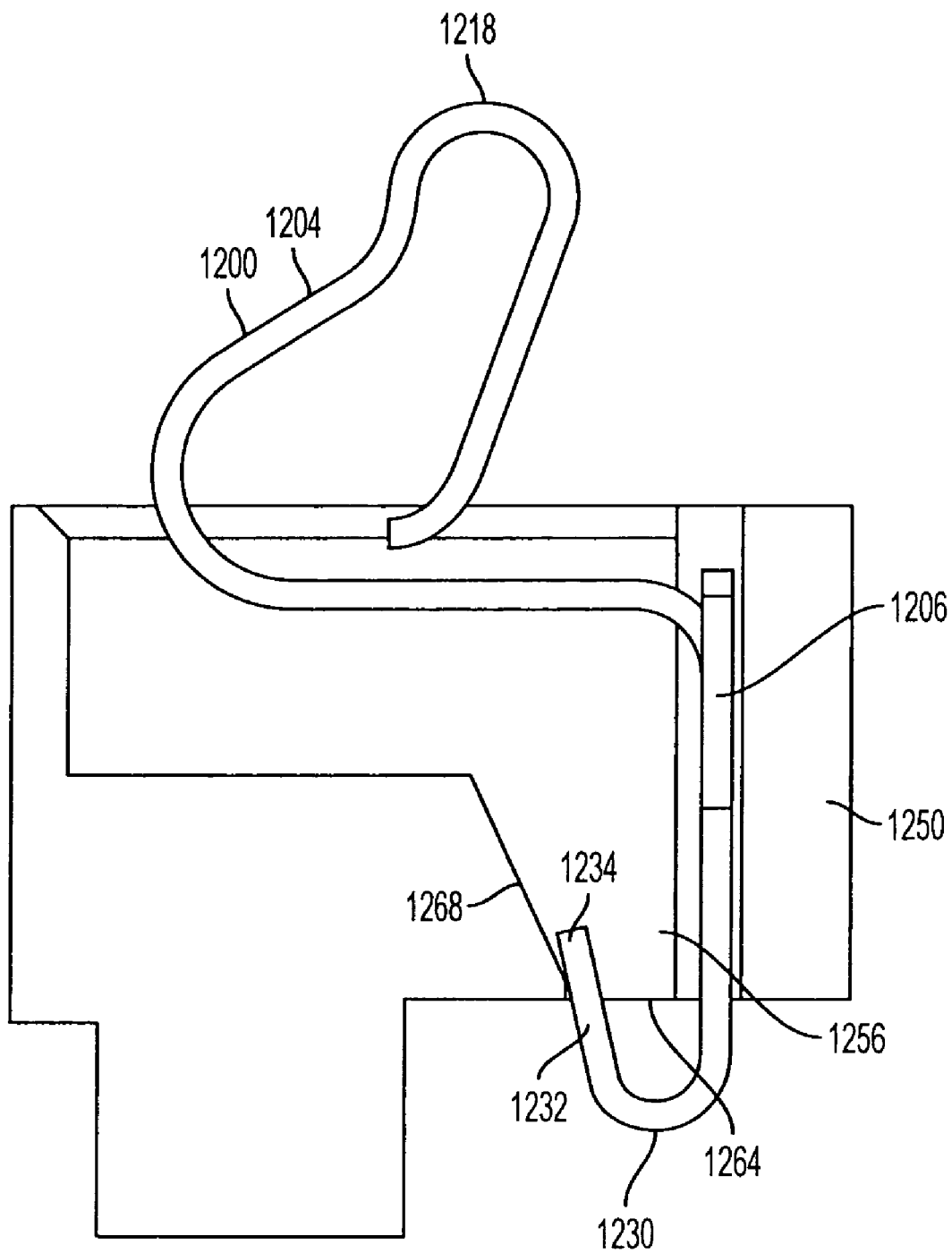
FIG. 59 is a cross sectional view of the contact of FIG. 53 entering a housing.

Referring to FIG. 59, as pressure is applied downward on the contact 1200, the first spring 1204 may start to defect. More importantly, the second spring arm 1206 may be forced further down into the channel 1256. As the spring arm 1206 is forced down, the back wall 1268 of the channel 1256 may direct the appendage 1232 to deflect towards the second spring arm 1206. The majority of the deflection may occur at the curved second land surface 1230. The second spring arm 1206 will continue down into the channel 1256, and the appendage 1232 will continue to deflect towards the spring arm 1206, until the tip 1234 passes through the opening 1264.

Figure 60:
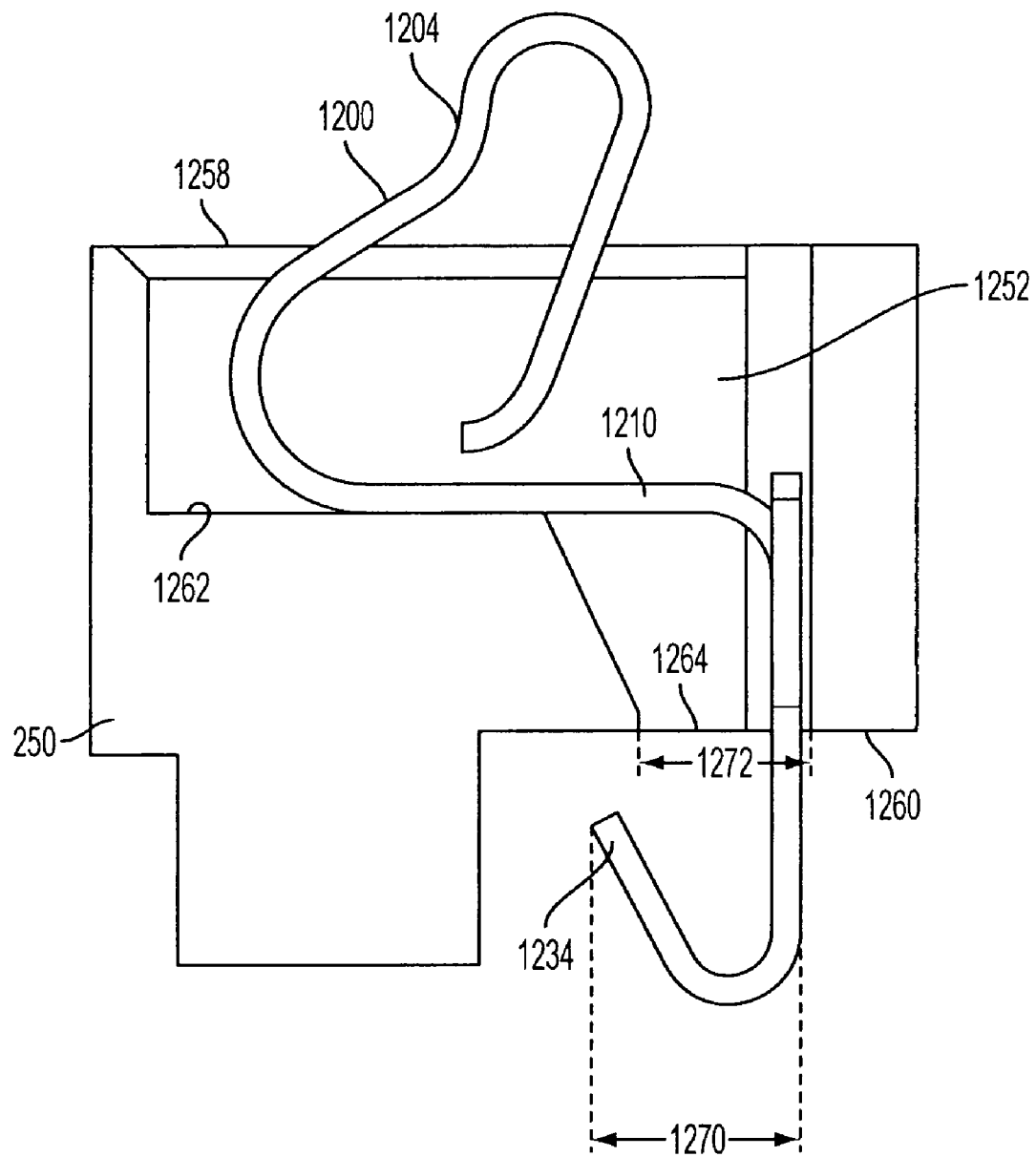
FIG. 60 is a cross sectional view of the contact of FIG. 53 inserted into a housing.

Referring to FIG. 60, once the tip 1234 has passed through the opening 1264, the second spring arm 1206 and appendage 1232 may return to an undeflected state. The distance 1270 between the tip 1234 of the appendage 1232 and the second spring arm 1206 again may be wider than the distance 1272 of the opening 1264. Accordingly, the appendage 1232 will prevent the contact 1200 from being extracted out of aperture 1252 by being pulled through the opening 1264 towards the first surface 1258. After the appendage 1232 has passed through the opening 1264, the first spring arm 1204 may extend past the first surface 1258 and the second spring arm 1206 may extend past the second surface 1260. The second portion 1210 of the first spring arm 1204 may rest flush with the bottom 1262 of the chamber 1254, thereby preventing the contact 1200 from traveling further down in the housing 1250.

Accordingly, the present invention provides an electrical contact that can be retained within an aperture disposed through an insulative housing. The contact includes two cantilevered spring arms that diverge from a center portion located in the aperture to contact pads or traces placed against either surface of the insulative housing. One spring arm includes a bellows leg that extends proximately to the second spring arm. When the pads and traces are pressed against the housing, the cantilevered spring arms are deflected towards each other and the bellows leg contacts the second spring arm resulting in a shortened electrical path through the contact. In another aspect of the invention, the contact can include retention members that, in an embodiment, floatingly retain the contact within the aperture or, in another embodiment, join the contact to the insulative housing.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments would become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law.

Moreover, any combination of the above-described elements in all possible variations thereof is encompassed by the invention unless otherwise indicated herein or otherwise clearly contradicted by context.

What is claimed is:

1. An electrical contact comprising:
    a center portion defining an upper end and a lower end, the center portion includes a retention member;
    a first spring arm extending from the upper end, the first spring arm includes a first land surface and a second contact surface;
    a second spring arm extending from the lower end; the second spring arm includes a second land surface;
    a bellows leg extending generally downward from the first land surface; the bellows leg includes a first contact surface proximate to the second contact surface;
    whereby deflection of the first spring arm presses the first and second contact surfaces together, continued deflection of the first spring arm causes the first contact surface to slide along the first spring arm.

2. The contact of claim 1, wherein a gap separates the first contact surface from the second contact surface.

3. The contact of claim 1, wherein the first spring arm includes a first portion and a second portion, the second portion extending from the upper end of the center portion.

4. The contact of claim 3, wherein the first portion and the second portion are joined by a collapsible bend.

5. The contact of claim 4, wherein the majority of strain experienced by the first spring arm during deflection is concentrated in the collapsible bend.

6. The contact of claim 3, wherein the second contact surface is located on the second portion of the first spring arm.

7. The contact of claim 1, wherein the second spring arm is joined to the center portion by a collapsible zone, the collapsible zone comprising a neck that is narrower than the remainder of the second spring arm.

8. The contact of claim 7, wherein the majority of strain experienced by the second spring arm during deflection is concentrated in the collapsible zone.

9. The contact of claim 1, wherein the second spring arm is substantially straight and terminates in the second land surface, the second land surface curving towards the first spring arm.

10. The contact of claim 1, wherein the second spring arm and the second land surface comprise a J-hook.

11. The contact of claim 2, wherein the first spring arm is configured such that after it is deflected and the contact surfaces touch, that gap is eliminated and the contact surfaces will remain in contact.

12. An electrical contact comprising:
    a center portion defining an upper end and a lower end, the center portion includes a retention member;
    a first spring arm extending from the upper end, the first spring arm includes a first land surface and a second contact surface;
    a second spring arm extending from the lower end; the second spring arm includes a second land surface;
    a bellows leg extending generally downward from the first land surface; the bellows leg includes a first contact surface proximate to the second contact surface;
    whereby deflection of the first spring arm presses the first and second contact surfaces together;
    an appendage extends from the second land surface of the second spring arm, the appendage extending generally up towards the spring arm;
    a tip of the appendage and the second spring arm are further apart than a width of an opening in a housing into which the contact may be inserted, wherein the contact is retained within the housing because the appendage prevents the second spring arm from being pulled into the housing through the opening in the surface.

13. The contact of claim 12, wherein the portion of the second spring arm between the center portion and the second land surface is substantially planar with the center portion.

14. The contact of claim 12, wherein the second spring arm, the second land surface and the appendage comprise a J-hook.

15. The contact of claim 12, wherein the first spring arm includes a first portion and a second portion joined to the center portion, wherein the portion of the second spring arm between the center portion and the second land surface is substantially perpendicular to the second portion of the first spring arm.

16. An electrical contact comprising:
    a center portion defining an upper end and a lower end, the center portion includes a retention member;
    a first spring arm extending from the upper end, the first spring arm includes a first land surface and a second contact surface;
    a second spring arm extending from the lower end; the second spring arm includes a second land surface;
    a bellows leg extending generally downward from the first land surface; the bellows leg includes a first contact surface proximate to the second contact surface;
    whereby deflection of the first spring arm presses the first and second contact surfaces together, the first spring arm includes a first portion and a second portion, the second portion extending from the upper end of the center portion.

17. The contact of claim 16, wherein the second contact surface is located on the second portion of the first spring arm.

18. The contact of claim 16, wherein the first portion and the second portion are joined by a collapsible bend.

19. The contact of claim 18, wherein the majority of strain experienced by the first spring arm during deflection is concentrated in the collapsible bend.

20. The contact of claim 16, wherein the second spring arm is substantially straight and terminates in the second land surface, the second land surface curving towards the first spring arm.

21. The contact of claim 16, wherein the second spring arm and the second land surface comprise a J-hook.

22. An electrical contact comprising:
    a center portion defining an upper end and a lower end, the center portion includes a retention member;
    a first spring arm extending from the upper end, the first spring arm includes a first land surface and a second contact surface;
    a second spring arm extending from the lower end; the second spring arm includes a second land surface;
    a bellows leg extending generally downward from the first land surface; the bellows leg includes a first contact surface proximate to the second contact surface;
    whereby deflection of the first spring arm presses the first and second contact surfaces together;
    the second spring arm is joined to the center portion by a collapsible zone, the collapsible zone comprising a neck that is narrower than the remainder of the second spring arm.

23. The contact of claim 22, wherein the majority of strain experienced by the second spring arm during deflection is concentrated in the collapsible zone.

24. The contact of claim 22, wherein the first spring arm includes a first portion and a second portion, the second portion extending from the upper end of the center portion.

25. The contact of claim 24, wherein the second contact surface is located on the second portion of the first spring arm.

26. The contact of claim 22, wherein the second land surface curving towards the first spring arm.

27. The contact of claim 22, wherein the second spring arm and the second land surface comprise a J-hook.

28. An electrical contact comprising:
   a center portion defining an upper end and a lower end, the center portion includes a retention member;
   a first spring arm extending from the upper end, the first spring arm includes a first land surface and a second contact surface;
   a second spring arm extending from the lower end; the second spring arm includes a second land surface;
   a bellows leg extending generally downward from the first land surface; the bellows leg includes a first contact surface proximate to the second contact surface;
   whereby deflection of the first spring arm presses the first and second contact surfaces together;
   a gap separates the first contact surface from the second contact surface.

29. The contact of claim 28, wherein the first spring arm includes a first portion and a second portion, the second portion extending from the upper end of the center portion.

30. The contact of claim 29, wherein the first portion and the second portion are joined by a collapsible bend.

31. The contact of claim 30, wherein the majority of strain experienced by the first spring arm during deflection is concentrated in the collapsible bend.

32. The contact of claim 29, wherein the second contact surface is located on the second portion of the first spring arm.

33. The contact of claim 28, wherein the second spring arm is joined to the center portion by a collapsible zone, the collapsible zone comprising a neck that is narrower than the remainder of the second spring arm.

34. The contact of claim 33, wherein the majority of strain experienced by the second spring arm during deflection is concentrated in the collapsible zone.

35. The contact of claim 28, wherein the second spring arm is substantially straight and terminates in the second land surface, the second land surface curving towards the first spring arm.

36. The contact of claim 28, wherein the second spring arm and the second land surface comprise a J-hook.

37. The contact of claim 28 wherein the first spring arm is configured such that after it is deflected and the contact surfaces touch, the gap is eliminated and the contact surface will remain in contact.

38. An electrical contact comprising:
   a center portion defining an upper end and a lower end, the center portion includes a retention member;
   a first spring arm extending from the upper end, the first spring arm includes a first land surface and a second contact surface;
   a second spring arm extending from the lower end; the second spring arm includes a second land surface;
   a bellows leg extending generally downward from the first land surface; the bellows leg includes a first contact surface proximate to the second contact surface;
   deflection of the first spring arm presses the first and second contact surfaces together;
   whereby an appendage extends from the second land surface of the second spring arm, the appendage extending generally up towards the first spring arm;
   the first spring arm includes a first portion and a second portion joined to the center portion, wherein the portion of the second spring arm between the center portion and the second land surface is substantially perpendicular to the second portion of the first spring arm.

39. The contact of claim 38, wherein the portion of the second spring arm between the center portion and the second land surface is substantially planar with the center portion.

40. The contact of claim 38, wherein the second spring arm, the second land surface and the appendage comprise a J-hook.

* * * * *

UNITED STATES PATENT AND TRADEMARK OFFICE
CERTIFICATE OF CORRECTION

PATENT NO.      : 7,625,216 B2                                               Page 1 of 1
APPLICATION NO. : 11/518040
DATED           : December 1, 2009
INVENTOR(S)     : Mendenhall et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 140 days.

Signed and Sealed this

Twenty-sixth Day of October, 2010

David J. Kappos
*Director of the United States Patent and Trademark Office*

UNITED STATES PATENT AND TRADEMARK OFFICE
CERTIFICATE OF CORRECTION

PATENT NO.        : 7,625,216 B2                                         Page 1 of 1
APPLICATION NO.   : 11/518040
DATED             : December 1, 2009
INVENTOR(S)       : Mendenhall et al.

It is certified that error appears in the above-identified patent and that said Letters Patent is hereby corrected as shown below:

On title page, Item (63) in the Related U.S. Application Data, lines 4 and 5, delete "application No. 11/518,040, filed on Sep. 8, 2006,"

On title page, Item (63) In the Related U.S. Application Data, line 9, delete "application No. 11/518,040, filed on Sep. 8, 2006,"

Signed and Sealed this
Twenty-eighth Day of June, 2011

David J. Kappos
*Director of the United States Patent and Trademark Office*